(12) United States Patent
Huang

(10) Patent No.: US 12,283,527 B2
(45) Date of Patent: Apr. 22, 2025

(54) METHODS OF FORMING SEMICONDUCTOR DEVICE STRUCTURES

(71) Applicant: TAIWAN SEMICONDUCTOR MANUFACTURING COMPANY, LTD., Hsinchu (TW)

(72) Inventor: Yu-Lien Huang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 392 days.

(21) Appl. No.: 17/832,576

(22) Filed: Jun. 4, 2022

(65) Prior Publication Data

US 2023/0260850 A1    Aug. 17, 2023

Related U.S. Application Data

(60) Provisional application No. 63/310,742, filed on Feb. 16, 2022.

(51) Int. Cl.
*H01L 21/8238* (2006.01)
*H01L 27/092* (2006.01)
*H01L 29/417* (2006.01)

(52) U.S. Cl.
CPC ........... *H01L 21/823871* (2013.01); *H01L 21/823814* (2013.01); *H01L 21/823821* (2013.01); *H01L 27/0924* (2013.01); *H01L 29/41791* (2013.01)

(58) Field of Classification Search
CPC ..... H01L 21/823871; H01L 21/823814; H01L 21/823821; H01L 27/0924; H01L 29/41791; H01L 21/823418; H01L 21/823475; H01L 21/823481; H01L 21/823431; H01L 29/66795; H01L 29/0649; H01L 29/0684; H01L 29/785
See application file for complete search history.

(56) References Cited

U.S. PATENT DOCUMENTS

| | | |
|---|---|---|
| 8,088,685 B2 | 1/2012 | Lin et al. |
| 11,127,629 B2 | 9/2021 | Lin |
| 2018/0130707 A1 | 5/2018 | Clendenning et al. |
| 2019/0318932 A1 | 10/2019 | Yu et al. |
| 2021/0167071 A1* | 6/2021 | Wang ............... H01L 23/53295 |
| 2021/0217861 A1 | 7/2021 | Song et al. |
| 2021/0335673 A1 | 10/2021 | Huang et al. |

* cited by examiner

*Primary Examiner* — Karen Kusumakar
*Assistant Examiner* — Adam S Bowen
(74) *Attorney, Agent, or Firm* — NZ Carr Law Office

(57) ABSTRACT

Methods of forming a semiconductor device structure are described. In some embodiments, the method includes forming fins from a substrate, forming a gate stack over portions of the fins, forming an epitaxial source/drain region adjacent the gate stack, depositing a dielectric layer over the epitaxial source/drain region, forming an opening in the dielectric layer, and forming a gapfill in the opening in a bottom-up fashion. The gapfill includes Si or W. The method further includes forming a conductive feature over the epitaxial source/drain region and replacing the gapfill with a dielectric material.

20 Claims, 66 Drawing Sheets

METHODS OF FORMING SEMICONDUCTOR DEVICE STRUCTURES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
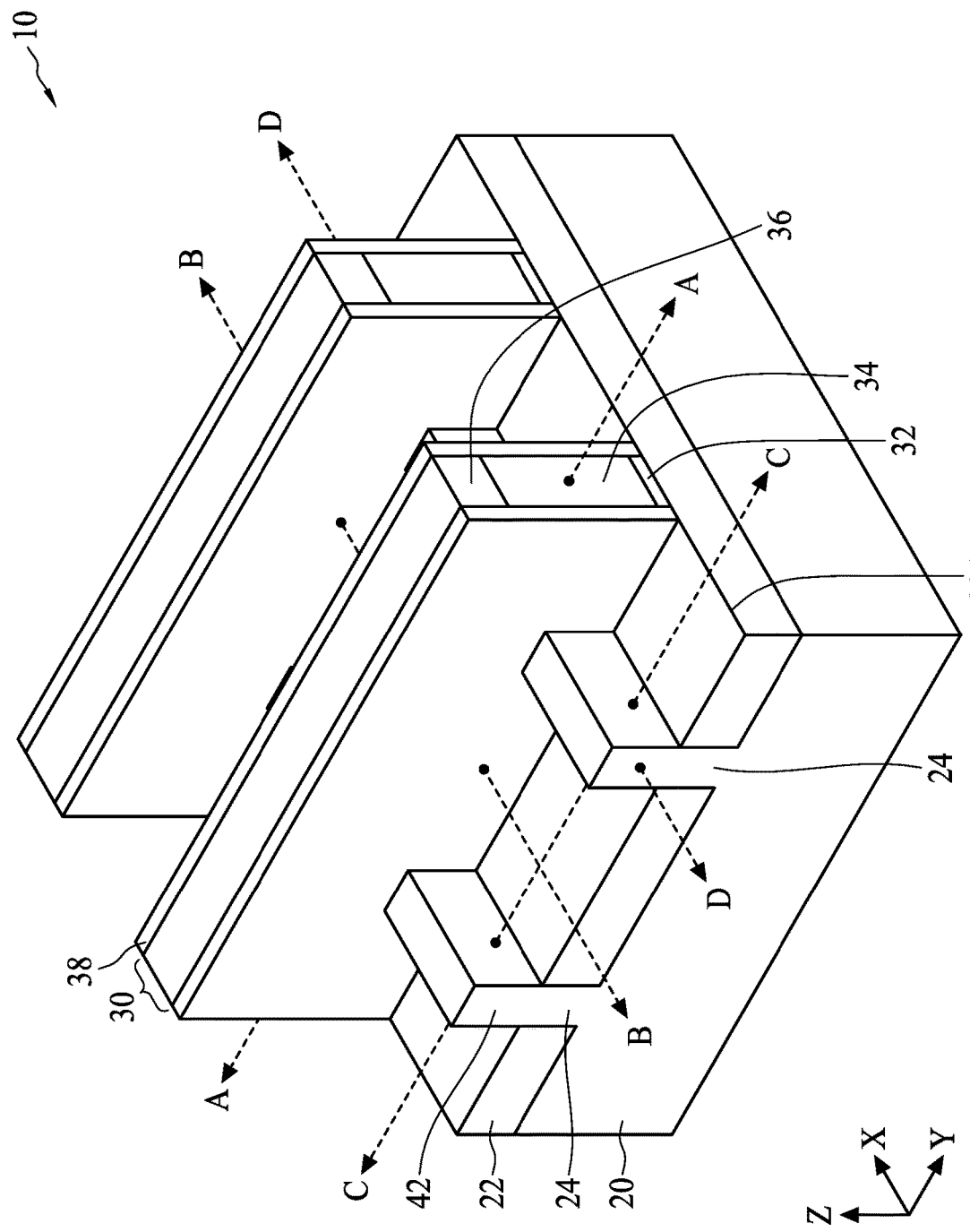
FIG. 1 illustrates an example of a semiconductor device structure in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a semiconductor device structure 10 in a three-dimensional view, in accordance with some embodiments. In some embodiments, the semiconductor device structure 10 includes a FinFET, as shown in FIG. 1. The semiconductor device structure 10 includes a fin 24 on a substrate 20 (e.g., a semiconductor substrate). Isolation regions 22 are disposed in the substrate 20, and the fin 24 protrudes above and from between neighboring isolation regions 22. Although the isolation regions 22 are described/illustrated as being separate from the substrate 20, as used herein the term "substrate" may be used to refer to just the semiconductor substrate or a semiconductor substrate inclusive of isolation regions. Additionally, the fin 24 may be a single continuous material, or the fin 24 and/or the substrate 20 may comprise a plurality of materials. In this context, the fin 24 refers to the portion extending between the neighboring isolation regions 22.

A gate dielectric layer 32 is along sidewalls and over a top surface of the fin 24, and a gate electrode 34 is over the gate dielectric layer 32. In this illustration, the gate electrode 34 and gate dielectric layer 32 may be dummies and may be replaced with a replacement gate in a subsequent process. A mask 36 is over the gate electrode 34. Epitaxial source/drain regions 42 are disposed on opposite sides of the fin 24 with respect to the gate dielectric layer 32 and gate electrode 34. The gate dielectric layer 32 and gate electrode 34, along with any interfacial layers (not shown) are taken together as the gate stack 30. A gate spacer 38 disposed on either side of the gate stack 30 and around the epitaxial source/drain regions 42. FIG. 1 further illustrates reference cross-sections that are used in later figures. Cross-section A-A is along a longitudinal axis of the gate electrode 34. Cross-section B-B is perpendicular to the cross-section A-A and is along a longitudinal axis of the fin 24. Cross-section C-C is parallel to the cross-section A-A and extends through epitaxial source/drain regions 42 of the FinFET. Cross section D-D is parallel to cross-section B-B and extends through the fin 24. Subsequent figures refer to these reference cross-sections for clarity.

Some embodiments discussed herein are discussed in the context of FinFETs formed using a gate-last process, and the gate stack 30 is a dummy gate stack. In other embodiments, a gate-first process may be used. Also, some embodiments contemplate aspects used in planar devices, such as planar FETs, or in nanostructure devices, such as gate-all-around (GAA) FETs, nanosheet FETs or nanowire FETs.

Figure 3:
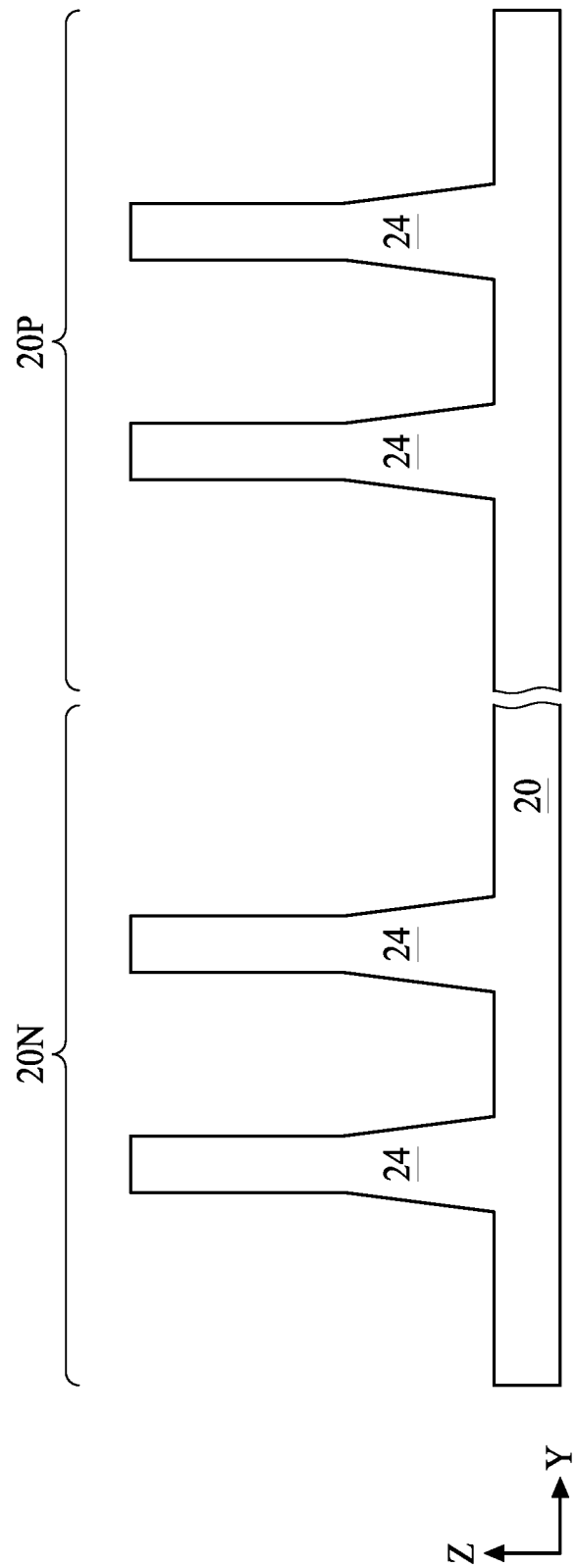
Figure 4:
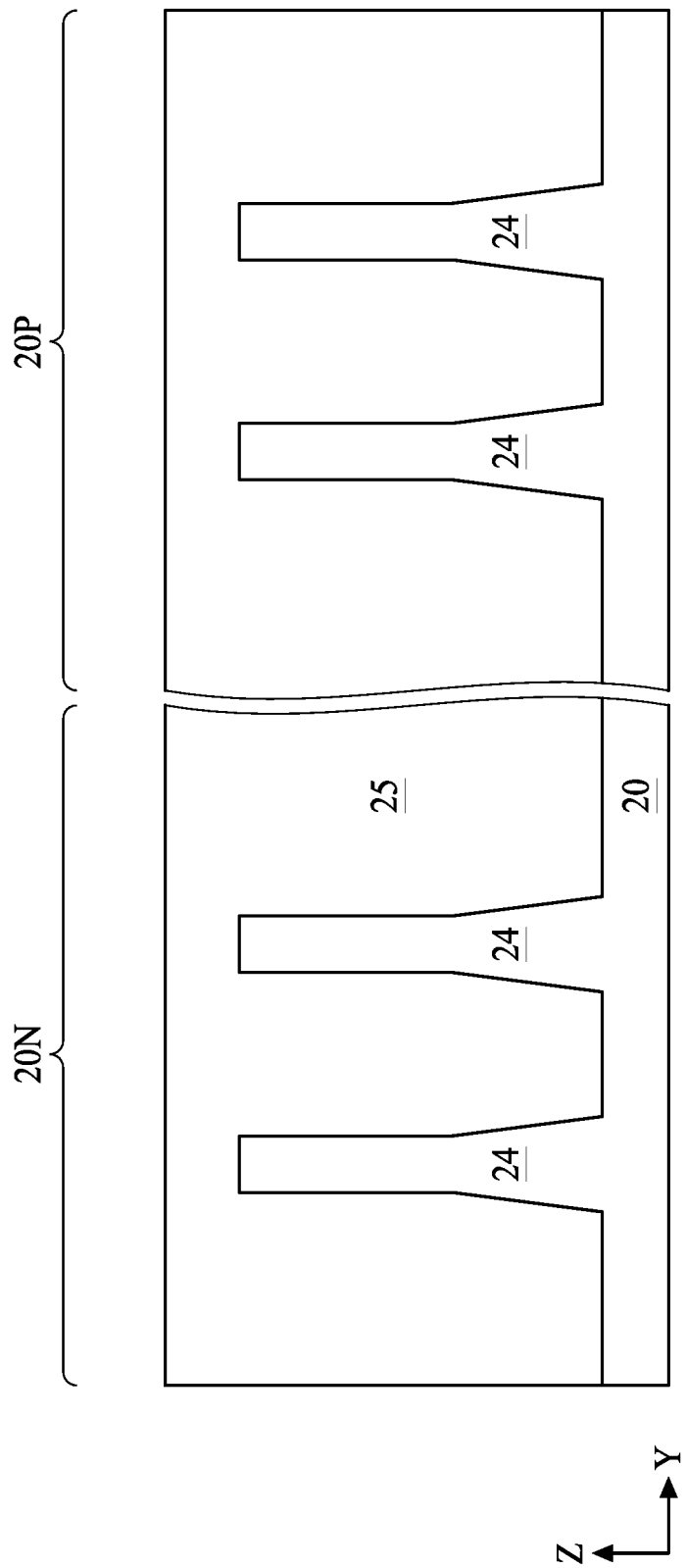
Figure 5:
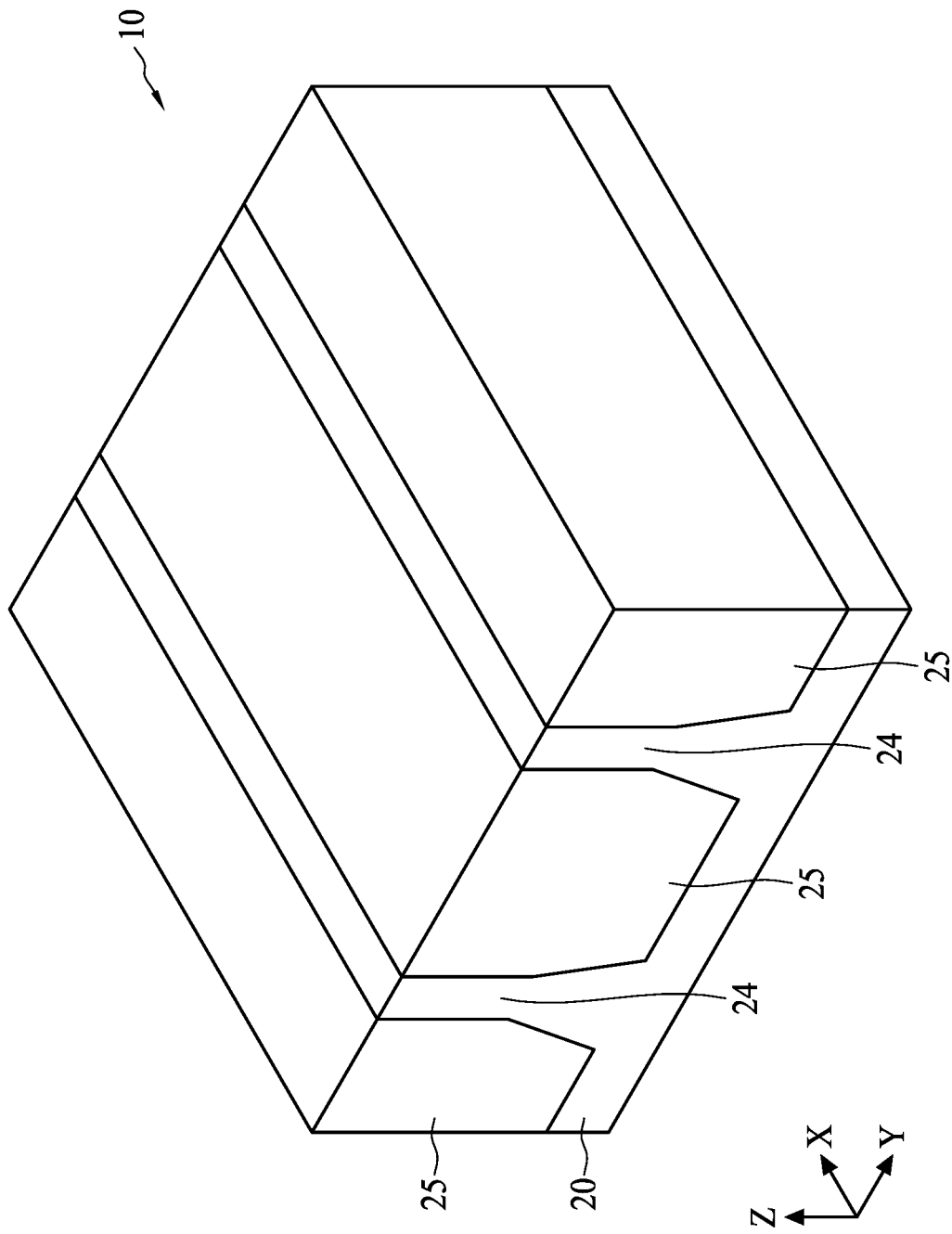
Figure 6:
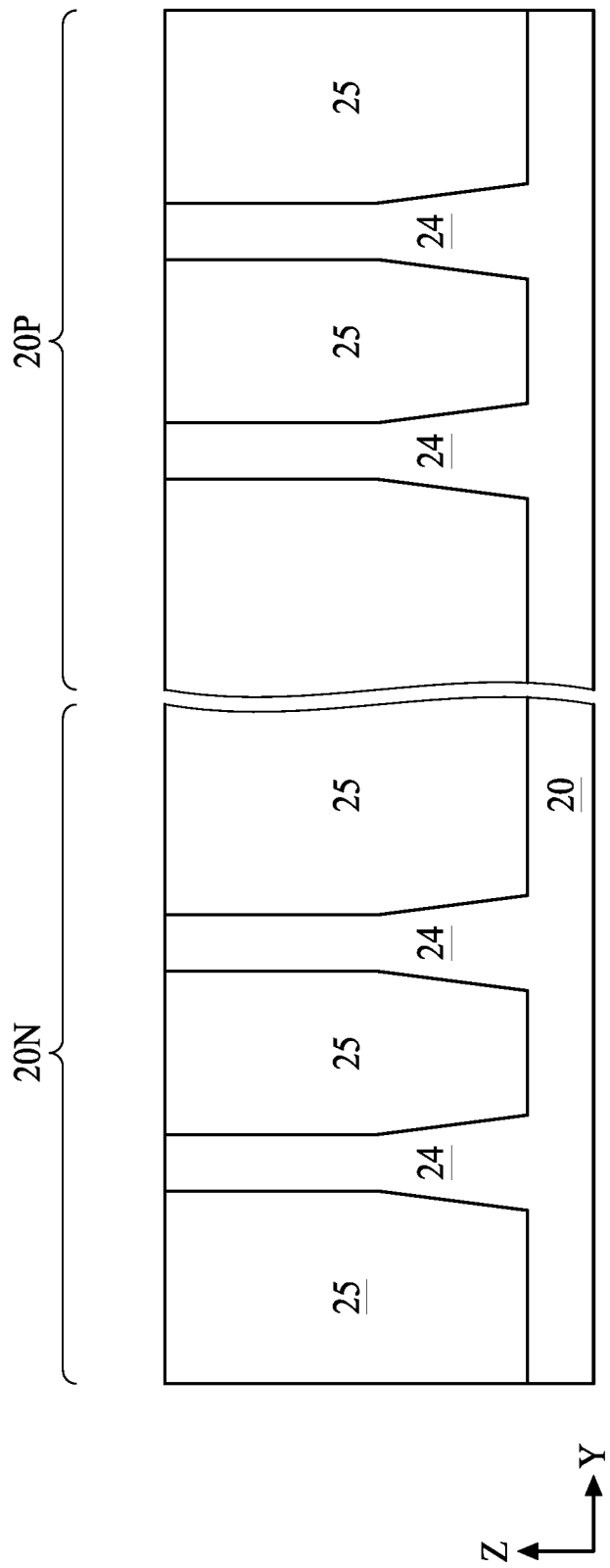
Figure 7:
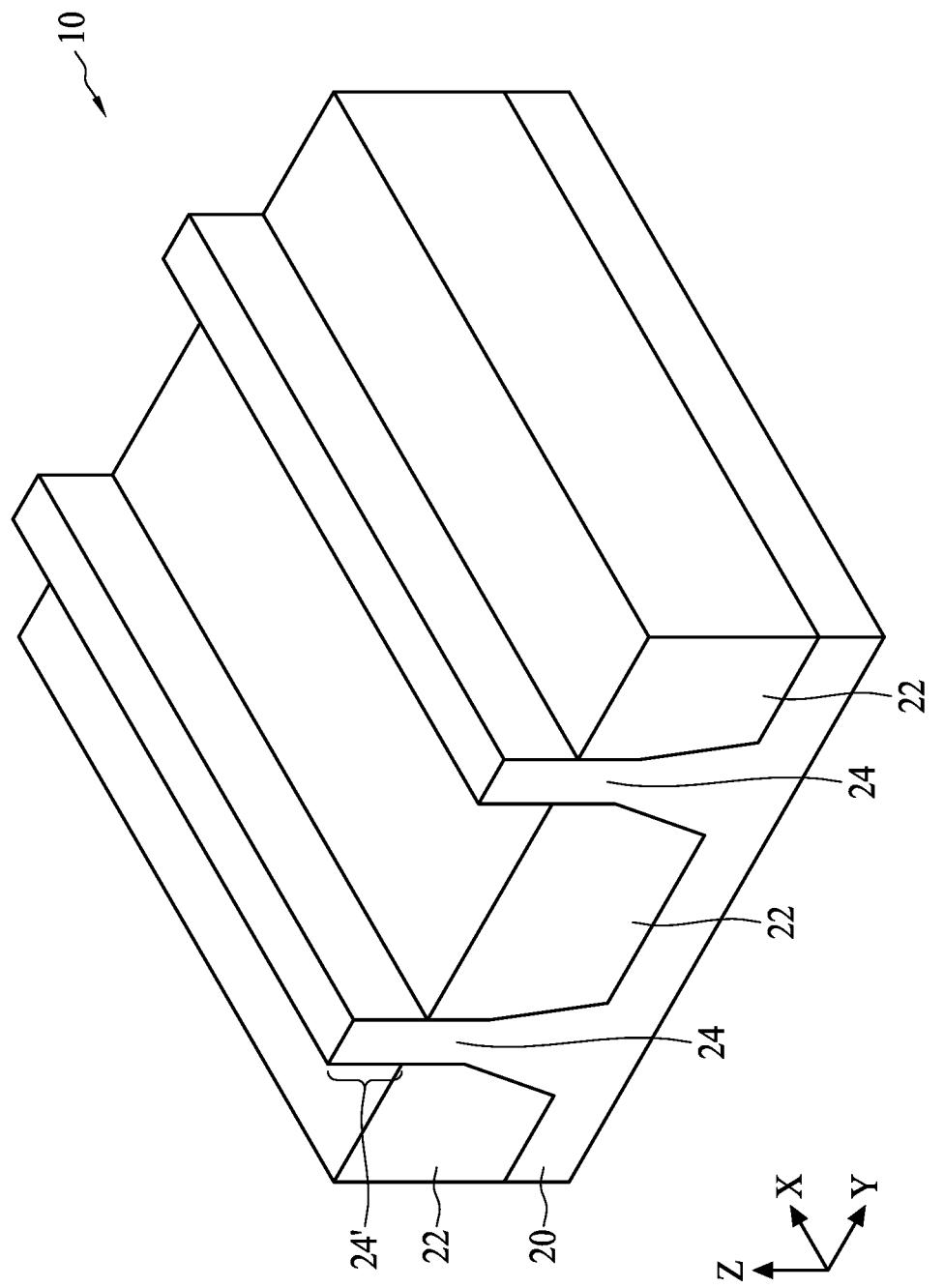

FIGS. 2 through 8 are various views of intermediate stages in the manufacturing of the semiconductor device structure 10, in accordance with some embodiments. With reference to FIG. 1 for the cross-section defined by the line A-A, FIGS. 2, 3, 4, 6, and 8 illustrate a cross-section along the cross-section A-A. FIGS. 5 and 7 are perspective views.

Figure 2:
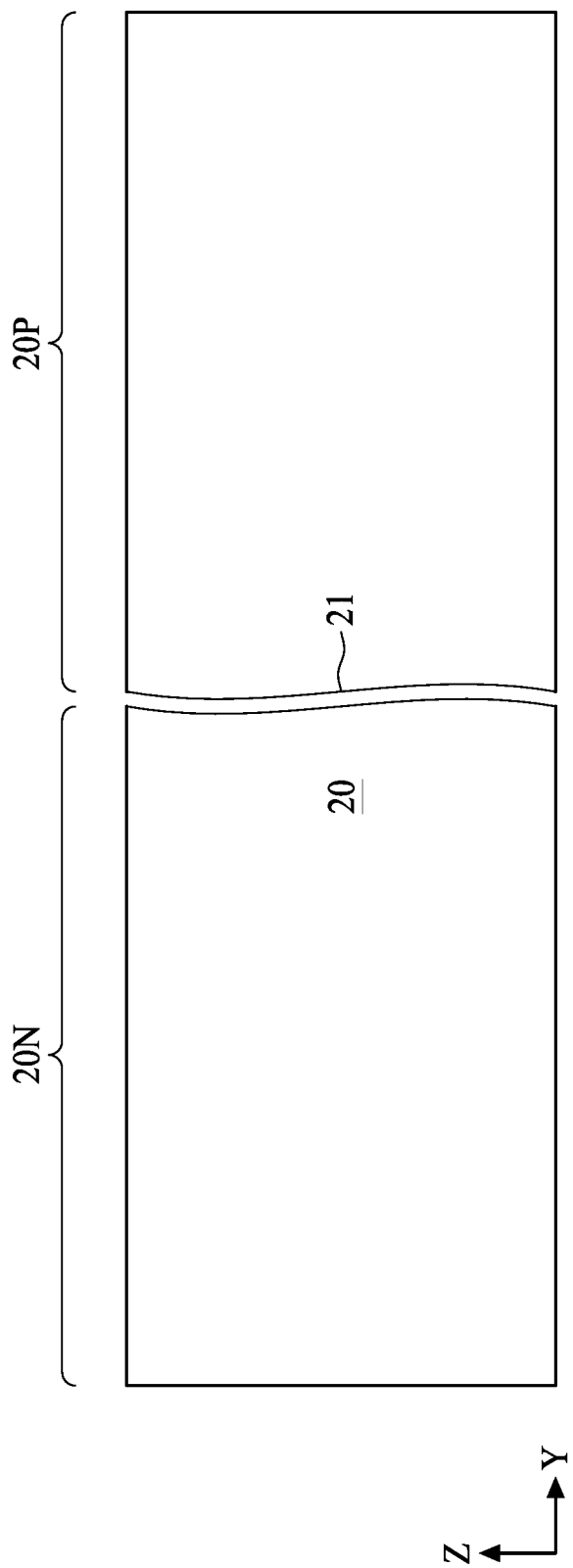
FIGS. 2 through 37 illustrate various views of intermediate stages in the manufacturing of the semiconductor device structure, in accordance with some embodiments.

In FIG. 2, a substrate 20 is provided. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 20 has a region 20N and a region 20P. The region 20N can be for forming n-type devices, such as NMOS transistors, e.g., n-type FinFETs. The region 20P can be for forming p-type devices, such as PMOS transistors, e.g., p-type FinFETs. The region 20N may be physically separated from the region 20P (as illustrated by divider 21), and any number of device features (e.g., other active devices, doped regions, isolation structures, etc.) may be disposed between the region 20N and the region 20P.

In FIG. 3, fins 24 are formed in the substrate 20. The fins 24 are semiconductor strips. In some embodiments, the fins 24 may be formed in the substrate 20 by etching trenches in the substrate 20. The etching may be any acceptable etch process, such as a reactive ion etch (RIE), neutral beam etch (NBE), the like, or a combination thereof. The etch may be anisotropic.

The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 24.

In FIG. 4, an insulation material 25 is formed over the substrate 20 and between neighboring fins 24. The insulation material 25 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 25 is silicon oxide formed by a FCVD process. An anneal process may be performed once the insulation material is formed. In an embodiment, the insulation material 25 is formed such that excess insulation material 25 covers the fins 24. Although the insulation material 25 is illustrated as a single layer, some embodiments may utilize multiple layers. For example, in some embodiments a liner (not shown) may first be formed along a surface of the substrate 20 and the fins 24. Thereafter, a fill material, such as those discussed above may be formed over the liner.

FIG. 5 illustrates a perspective view which may be applicable for either region 20N or region 20P. FIG. 6 illustrates a cross-sectional view of the structure shown in FIG. 5, with the cross-sectional view obtained from the plane containing line A-A as illustrated in FIG. 1. In FIGS. 5 and 6, a removal process is applied to the insulation material 25 to remove excess insulation material 25 over the fins 24. In some embodiments, a planarization process such as a chemical mechanical polish (CMP), an etch-back process, combinations thereof, or the like may be utilized. The planarization process exposes the fins 24 such that top surfaces of the fins 24 and the insulation material 25 are level after the planarization process is complete. In embodiments in which a mask remains on the fins 24, the planarization process may expose the mask or remove the mask such that top surfaces of the mask or the fins 24, respectively, and the insulation material 25 are level after the planarization process is complete.

Figure 8:
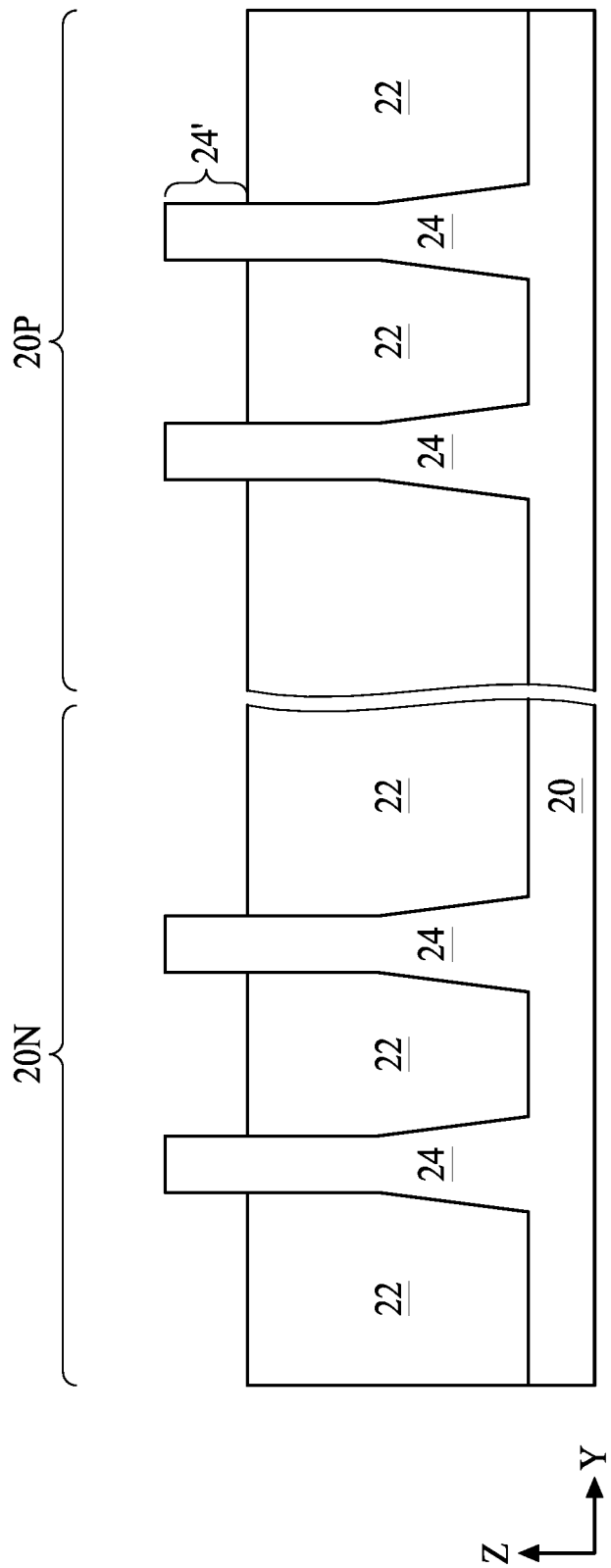

FIG. 7 illustrates a perspective view which may be applicable for either region 20N or region 20P. FIG. 8 illustrates a cross-sectional view of the structure shown in FIG. 7, with the cross-sectional view obtained from the plane containing line A-A as illustrated in FIG. 1. In FIGS. 7 and 8, the insulation material 25 is recessed to form Shallow Trench Isolation (STI) regions (isolation regions 22). The insulation material 25 is recessed such that upper portions (channel region 24') of fins 24 in the region 20N and in the region 20P protrude from between neighboring isolation regions 22. Further, the top surfaces of the isolation regions 22 may have a flat surface as illustrated, a convex surface, a concave surface (such as dishing), or a combination thereof. The top surfaces of the isolation regions 22 may be formed flat, convex, and/or concave by an appropriate etch. The isolation regions 22 may be recessed using an acceptable etching process, such as one that is selective to the material of the insulation material 25 (e.g., etches the material of the insulation material 25 at a faster rate than the material of the fins 24). For example, an oxide removal using, for example, dilute hydrofluoric (dHF) acid may be utilized.

The process described with respect to FIGS. 2 through 8 is just one example of how the fins 24 may be formed. Other processes may be performed to form the fins 24.

FIGS. 9 through 37 illustrate various additional intermediate stages in the manufacturing of semiconductor device structure 10, in accordance with some embodiments. FIGS. 9 through 37 illustrate features in either of the region 20N and the region 20P and each will not be separately illustrated. Differences (if any) in the structures of the region 20N and the region 20P are described in the text accompanying each figure. With reference to FIG. 1 for the cross-sections defined by the lines A-A, B-B, C-C, and D-D, FIGS. 10A, 12A, 15A, 17A, 19A, and 21A illustrate a cross-section along the line A-A. FIGS. 24A, 25A, 26A, 27A, 28A, 29A, 30A, 31A, 32A, and 33A illustrate a cross-section along the line B-B. FIGS. 13A, 13B, 24B, 25B, 26B, 27B, 28B, 29B, 30B, 31B, 32B, 33B, 36, and 37 illustrate a cross-section along the line C-C. FIGS. 10B, 12B, 15B, 17B, 19B, and 21B illustrate a cross-section along the line D-D.

Figure 9:
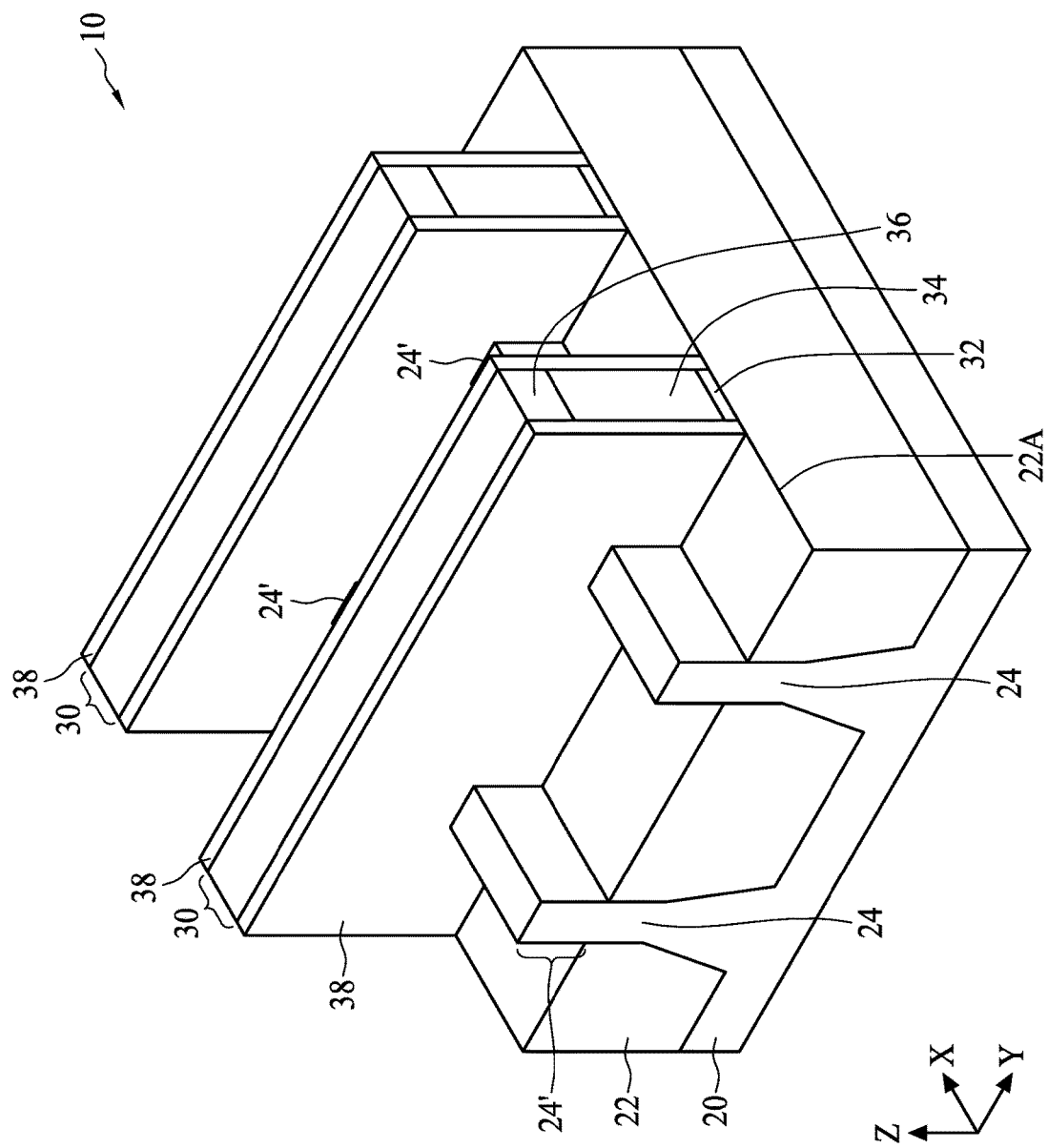
Figure 10B:
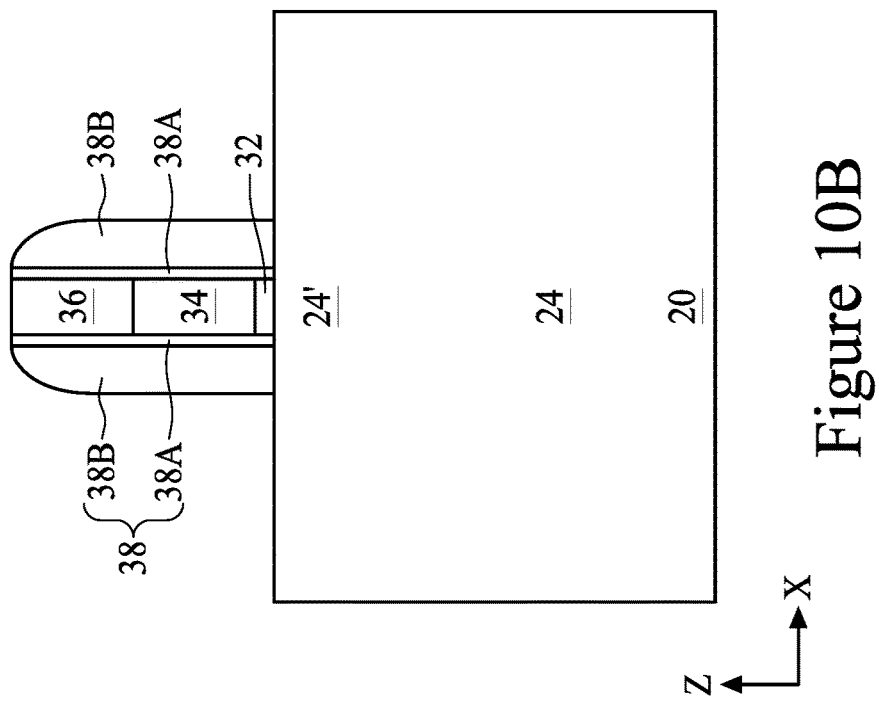
Figure 10A:
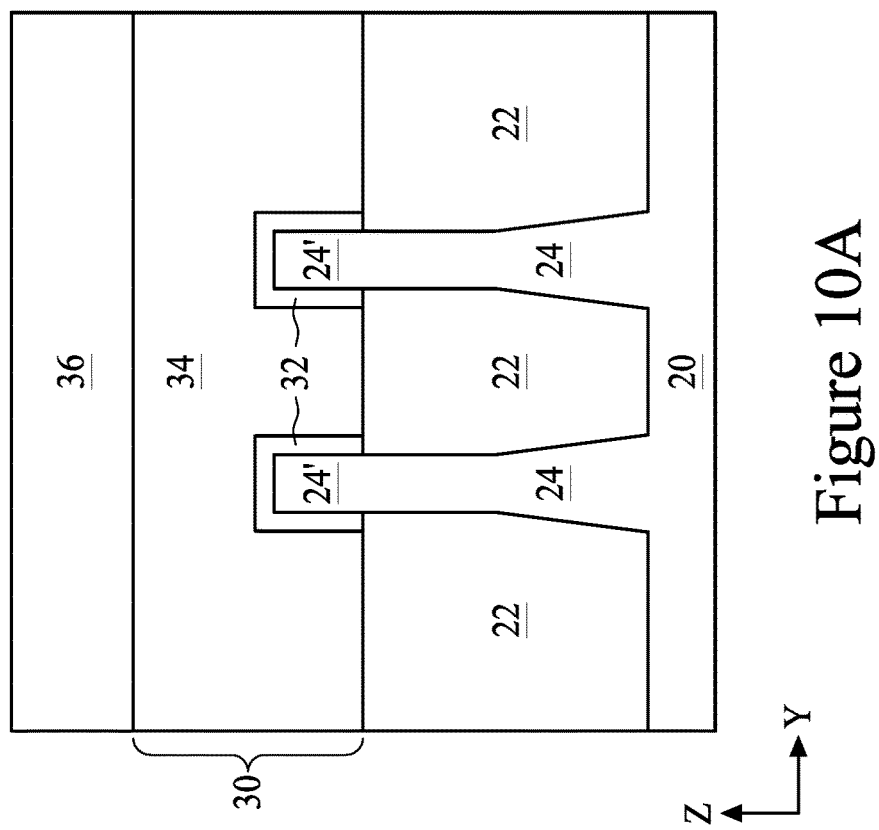

FIG. 10A illustrates a cross-sectional view of the structure shown in FIG. 9, with the cross-sectional view obtained from the plane containing line A-A as illustrated in FIG. 1. FIG. 10B illustrates a cross-sectional view of the structure shown in FIG. 9, with the cross-sectional view obtained from the plane containing line D-D as illustrated in FIG. 1. In FIGS. 9, 10A, and 10B, a dummy dielectric layer is formed on the fins 24. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The mask layer may be patterned using acceptable photolithography and etching techniques to form masks 36. The pattern of the masks 36 then may be transferred to the dummy gate layer to form dummy gate electrodes 34. In some embodiments, the pattern of the masks 36 may also be transferred to the dummy dielectric layer by an acceptable etching technique to form gate dielectric layer 32. Together the gate dielectric layer 32 and dummy gate electrodes 34 form dummy gate stacks 30. The dummy gate stacks 30 cover respective channel regions 24' of the fins 24. The dummy gate stacks 30 may have a lengthwise direction substantially perpendicular to the lengthwise direction of respective epitaxial fins 24.

The dummy gate electrodes 34 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate electrodes 34 formed from the dummy gate layer may be deposited by physical vapor deposition (PVD), CVD, sputter deposition, or other techniques known and used in the art for depositing the selected material. It is noted that the gate dielectric layer 32 is shown covering only the fins 24 for illustrative purposes only.

Also in FIGS. 9, 10A, and 10B, gate seal spacers 38A can be formed on exposed surfaces of the dummy gates stacks 30, the masks 36, and/or the fins 24 (the channel regions 24'). A thermal oxidation or a deposition followed by an anisotropic etch may form the gate seal spacers 38A. The gate seal spacers 38A may be formed of silicon oxide, silicon nitride, silicon oxynitride, or the like. After the formation of the gate seal spacers 38A, implants for lightly doped source/drain (LDD) regions (not explicitly illustrated) may be performed.

Also in FIGS. 9, 10A, and 10B, gate spacers 38B are formed on the gate seal spacers 38A along sidewalls of the dummy gates stacks 30 and the masks 36. The gate spacers 38B may be formed by conformally depositing an insulating material and subsequently anisotropically etching the insulating material. The insulating material of the gate spacers 38B may be silicon oxide, silicon nitride, silicon oxynitride, silicon carbonitride, a combination thereof, or the like.

The gate seal spacers 38A and gate spacers 38B may, for simplicity, together be referred to as gate spacers 38. It is noted that the above disclosure generally describes a process of forming spacers and LDD regions. Other processes and sequences may be used.

Figure 11:
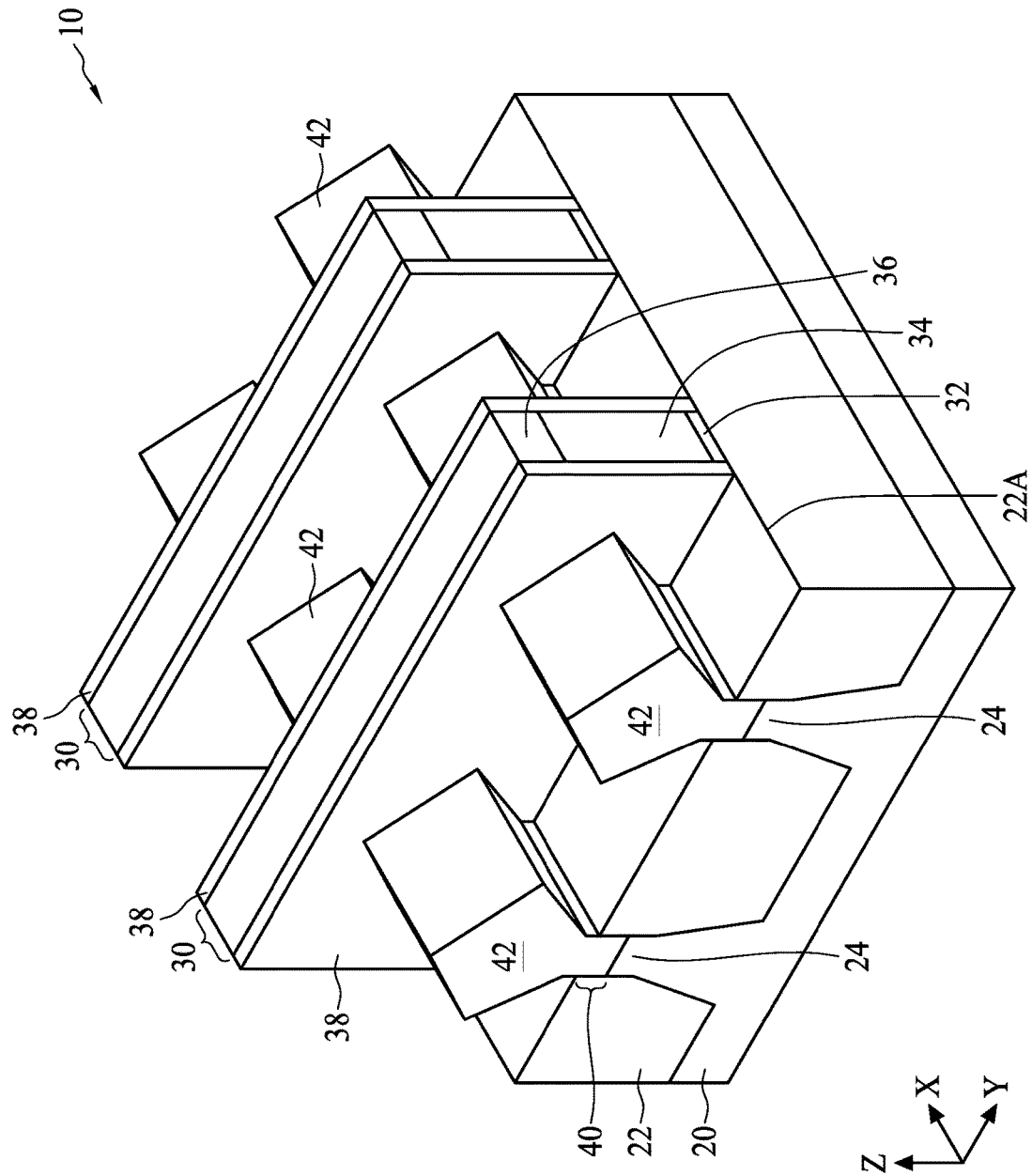
Figure 12B:
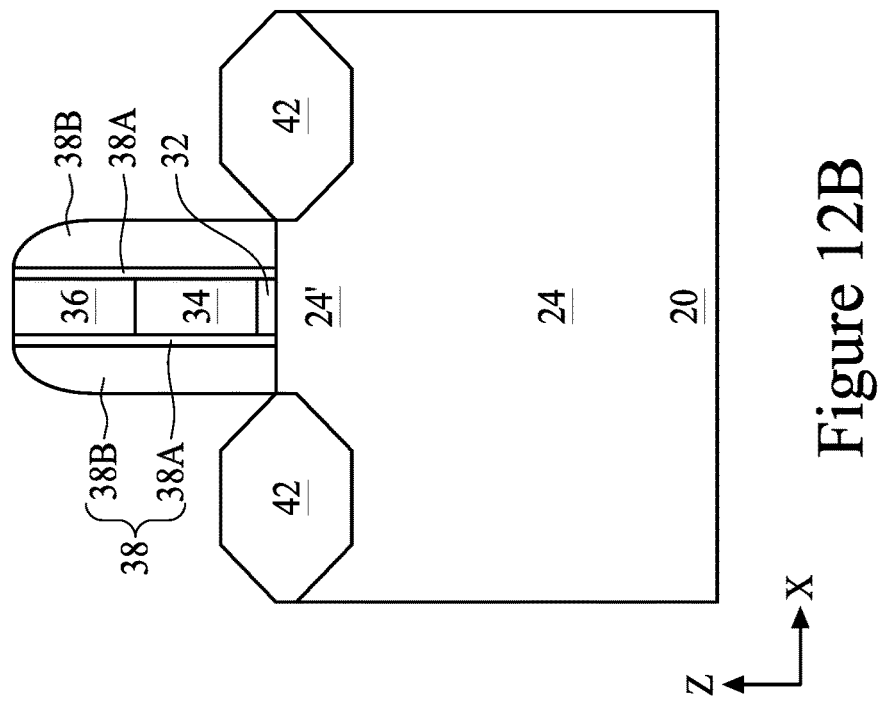
Figure 12A:
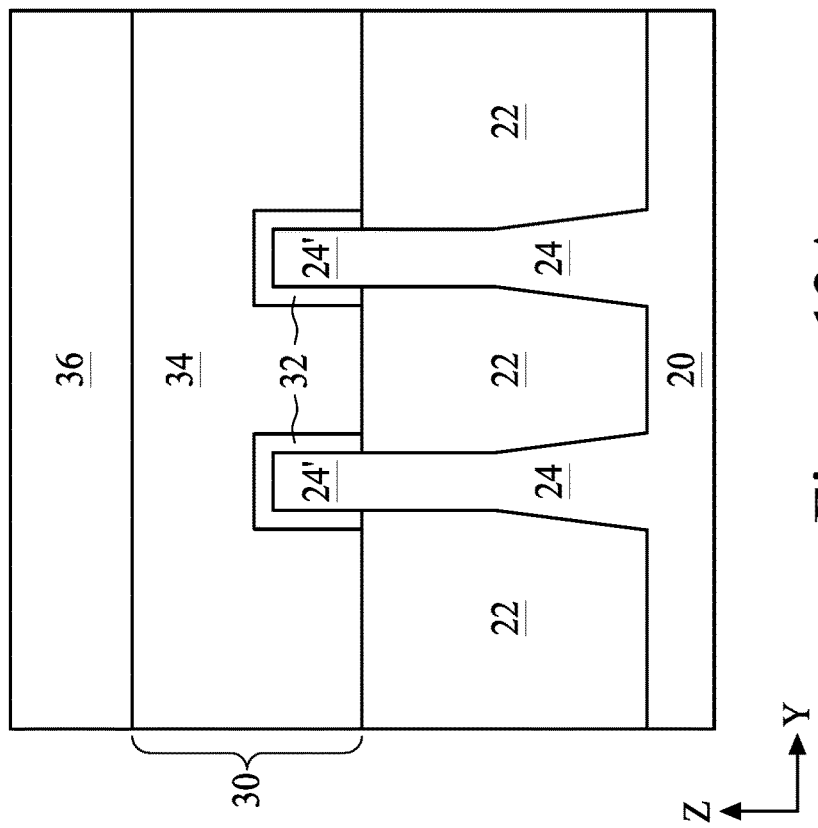
Figure 13A:
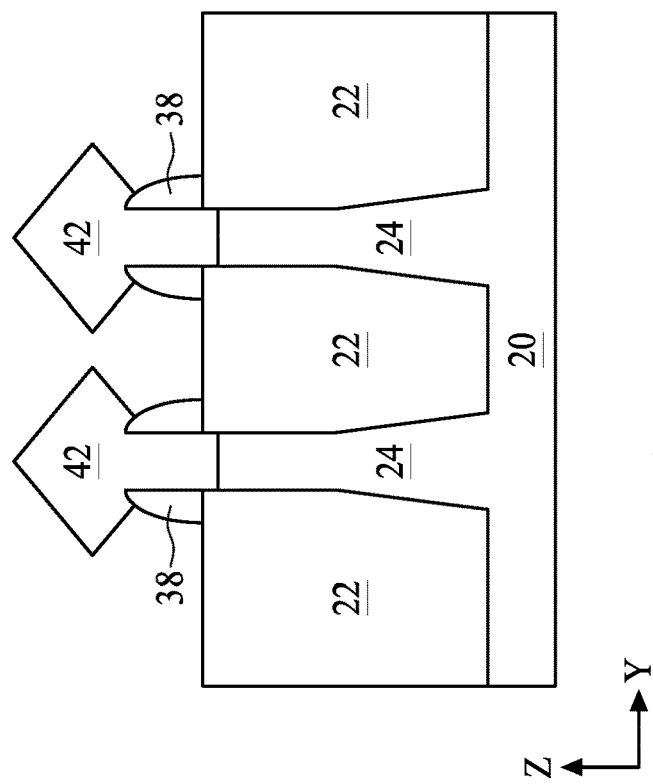
Figure 13B:
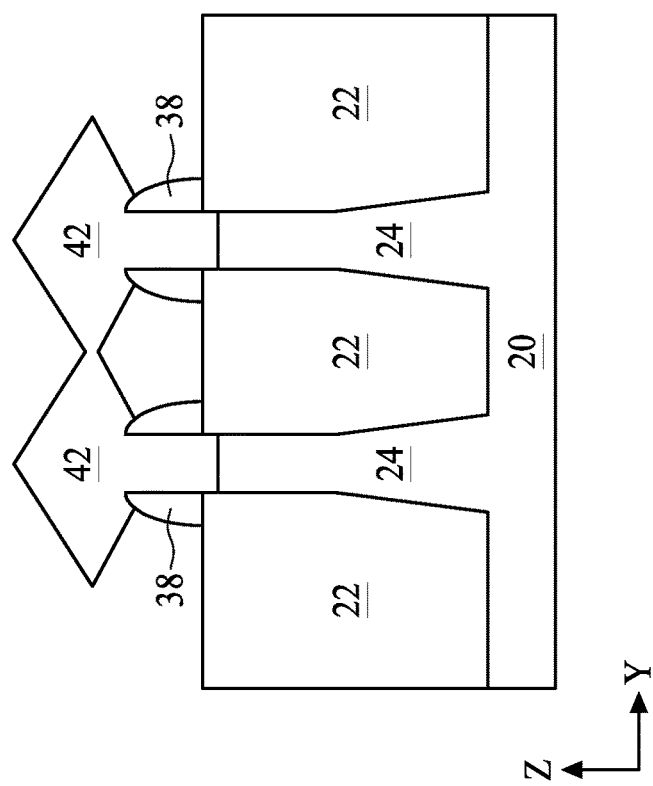

FIG. 12A illustrates a cross-sectional view of the structure shown in FIG. 11, with the cross-sectional view obtained from the plane containing line A-A as illustrated in FIG. 1. FIG. 12B illustrates a cross-sectional view of the structure shown in FIG. 11, with the cross-sectional view obtained from the plane containing line D-D as illustrated in FIG. 1. FIGS. 13A and 13B illustrate cross-sectional views of the structure shown in FIG. 11 obtained from the plane containing line C-C as illustrated in FIG. 1. In FIGS. 11, 12A, 12B, 13A, and 13B, epitaxial source/drain regions 42 are formed in the fins 24 to exert stress in the respective channel regions 24', thereby improving performance. The epitaxial source/drain regions 42 are formed in the fins 24 such that each dummy gate stack 30 is disposed between respective neighboring pairs of the epitaxial source/drain regions 42. In some embodiments the epitaxial source/drain regions 42 may extend into, and may also penetrate through, the fins 24. In some embodiments, the gate spacers 38 are used to separate the epitaxial source/drain regions 42 from the dummy gate stacks 30 by an appropriate lateral distance so that the epitaxial source/drain regions 42 do not short out subsequently formed gates of the resulting FinFETs.

The epitaxial source/drain regions 42 in the region 20N, e.g., the NMOS region, may be formed by masking the region 20P, e.g., the PMOS region, and source/drain regions of the fins 24 in the region 20N are etched to form recesses in the fins 24. Then, the epitaxial source/drain regions 42 in the region 20N are epitaxially grown in the recesses. The epitaxial source/drain regions 42 may include any acceptable material, such as appropriate for n-type FinFETs. For example, if the fin 24 is silicon, the epitaxial source/drain regions 42 in the region 20N may include materials exerting a tensile strain in the channel region 24', such as silicon, silicon carbide, phosphorous doped silicon carbide, silicon phosphide, or the like. The epitaxial source/drain regions 42 in the region 20N may have surfaces raised from respective surfaces of the fins 24 and may have facets.

The epitaxial source/drain regions 42 in the region 20P, e.g., the PMOS region, may be formed by masking the region 20N, e.g., the NMOS region, and source/drain regions of the fins 24 in the region 20P are etched to form recesses in the fins 24. Then, the epitaxial source/drain regions 42 in the region 20P are epitaxially grown in the recesses. The epitaxial source/drain regions 42 may include any acceptable material, such as appropriate for p-type FinFETs. For example, if the fin 24 is silicon, the epitaxial source/drain regions 42 in the region 20P may include materials exerting a compressive strain in the channel region 24', such as silicon-germanium, boron doped silicon-germanium, germanium, germanium tin, or the like. The epitaxial source/drain regions 42 in the region 20P may also have surfaces raised from respective surfaces of the fins 24 and may have facets.

The epitaxial source/drain regions 42 and/or the fins 24 may be implanted with dopants to form source/drain regions, similar to the process previously discussed for forming lightly-doped source/drain regions, followed by an anneal process. The epitaxial source/drain regions 42 may have an impurity concentration of between about $10^{19}$ cm$^{-3}$ and about $10^{21}$ cm$^{-3}$. The n-type and/or p-type impurities for epitaxial source/drain regions 42 may be any of the impurities previously discussed. In some embodiments, the epitaxial source/drain regions 42 may be in situ doped during growth.

As a result of the epitaxy processes used to form the epitaxial source/drain regions 42 in the region 20N and the region 20P, upper surfaces of the epitaxial source/drain regions have facets which expand laterally outward beyond sidewalls of the fins 24. In some embodiments, these facets cause adjacent epitaxial source/drain regions 42 of a same FinFET to merge as illustrated by FIG. 13A. In other embodiments, adjacent epitaxial source/drain regions 42 remain separated after the epitaxy process is completed as illustrated by FIG. 13B. In the embodiments illustrated in FIGS. 13A and 13B, gate spacers 38 are formed covering a portion of the sidewalls of the fins 24 (the channel region 24') that extend above the STI regions 22 thereby blocking the epitaxial growth. In some other embodiments, the spacer etch used to form the gate spacers 38 may be adjusted to remove the spacer material to allow the epitaxial source/drain regions 42 to extend to the surface of the isolation regions 22.

Figure 14:
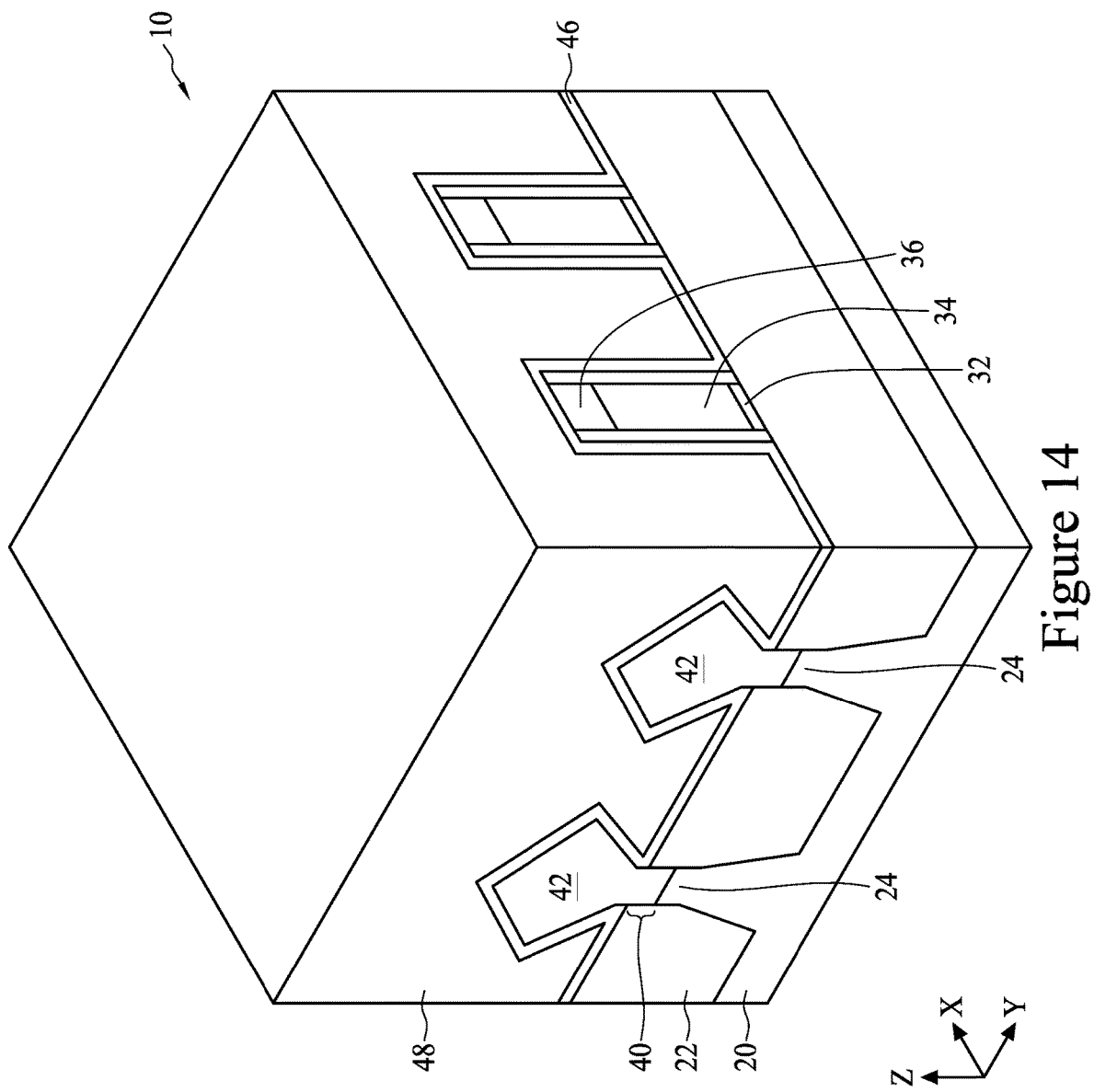
Figure 15B:
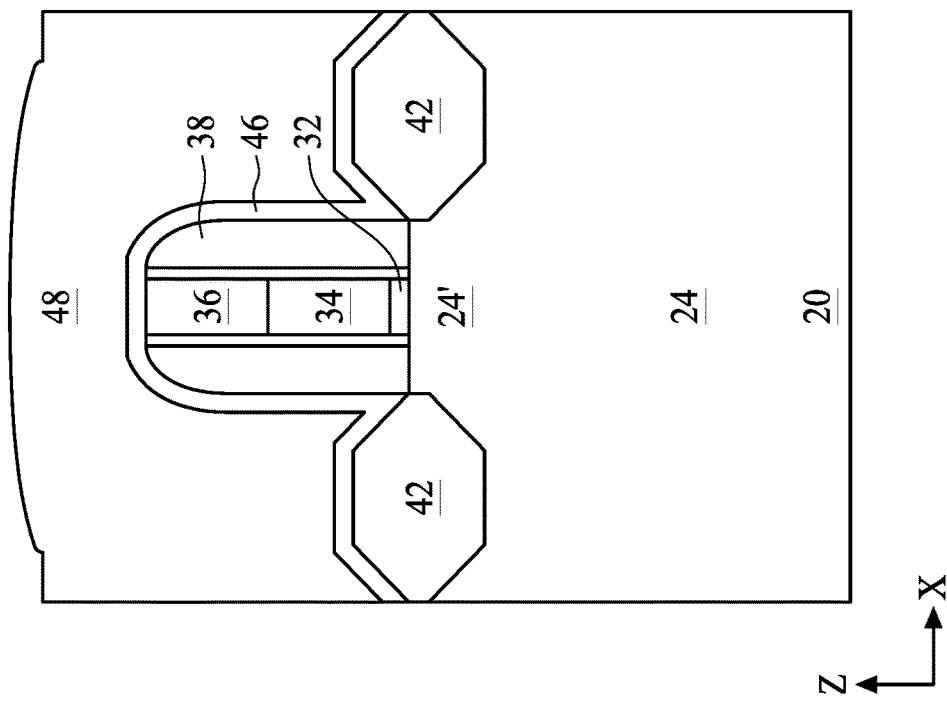
Figure 15A:
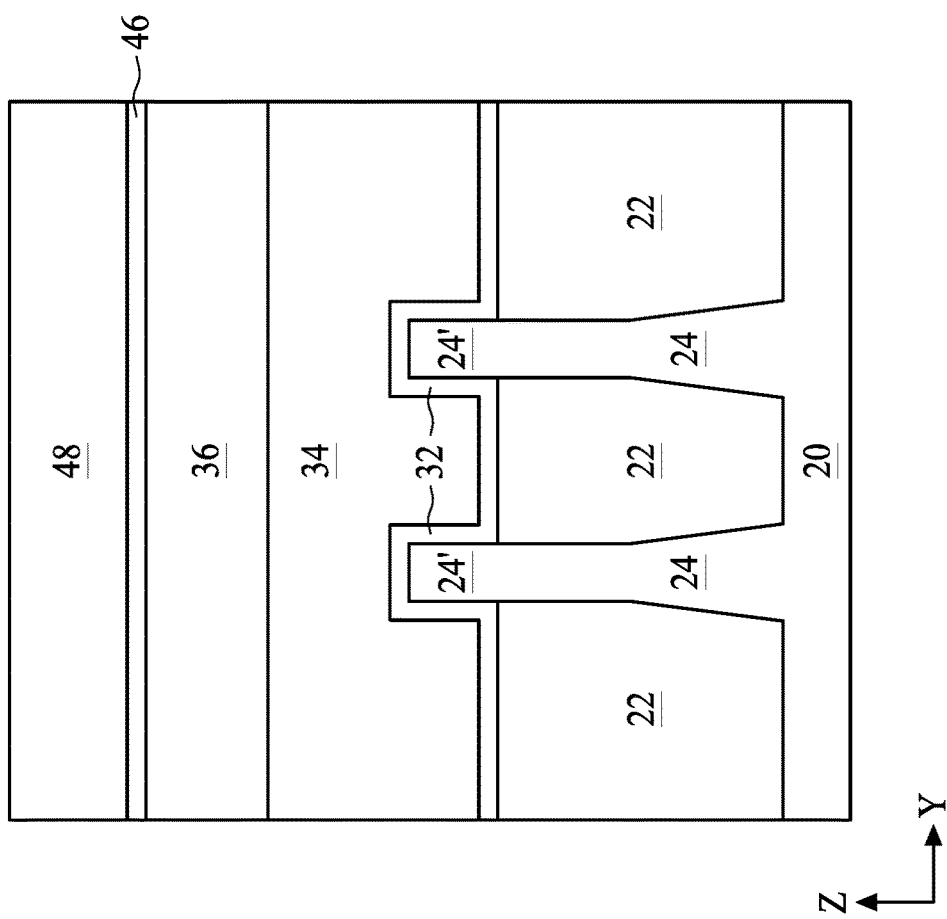

FIG. 15A illustrates a cross-sectional view of the structure shown in FIG. 14, with the cross-sectional view obtained from the plane containing line A-A as illustrated in FIG. 1. FIG. 15B illustrates a cross-sectional view of the structure shown in FIG. 14, with the cross-sectional view obtained from the plane containing line D-D as illustrated in FIG. 1. In FIGS. 14, 15A, and 15B, a dielectric layer 48 is deposited over the semiconductor device structure 10 illustrated in FIGS. 11, 12A, and 12B. The dielectric layer 48 may be a first interlayer dielectric (ILD). The dielectric layer 48 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the dielectric layer 48 and the epitaxial source/drain regions 42, the masks 36, and the gate spacers 38. The CESL 46 may include a dielectric material, such as, silicon nitride, silicon oxide, silicon oxynitride, or the like, having a different etch rate than the material of the dielectric layer 48.

Figure 16:
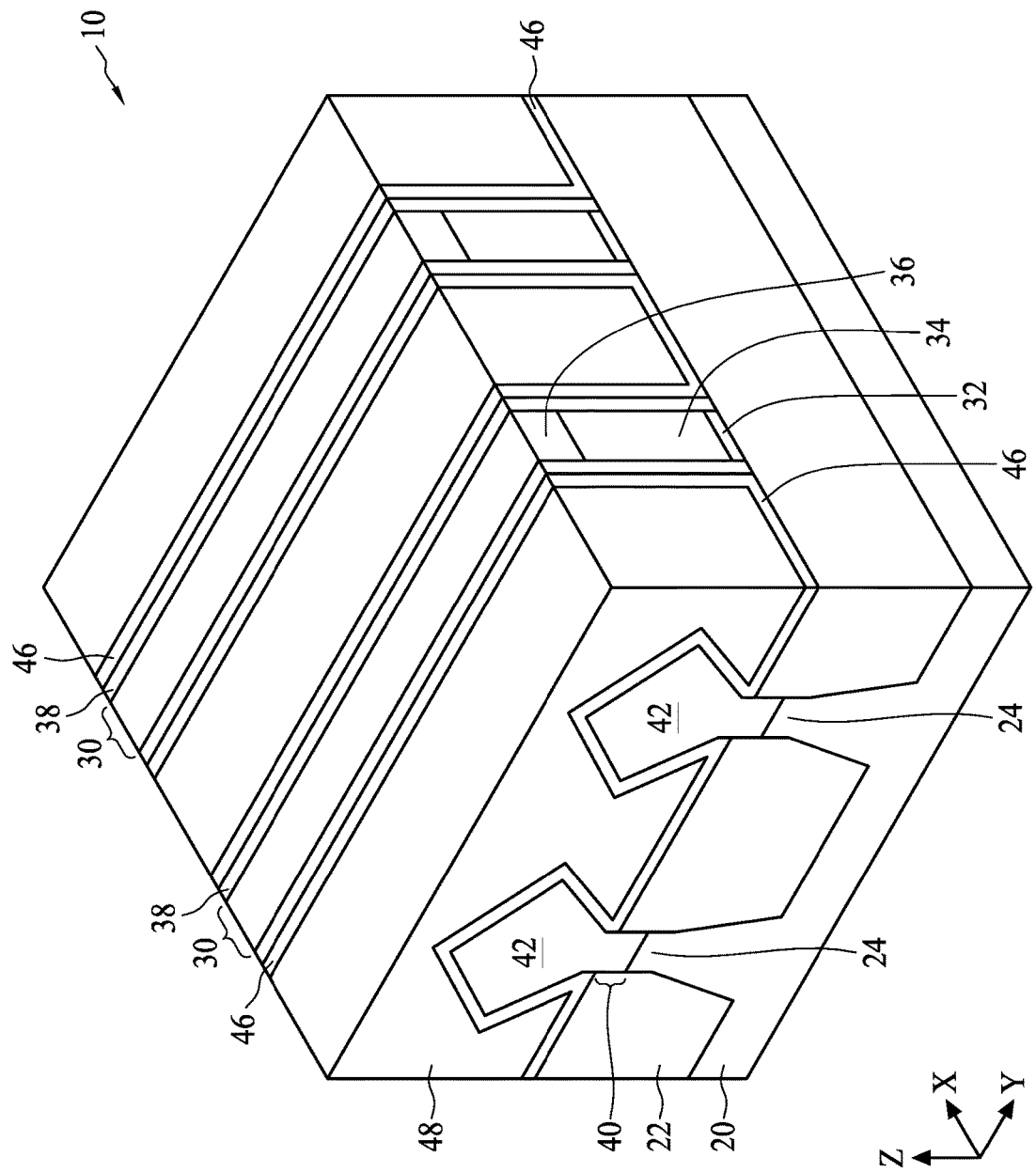
Figure 17B:
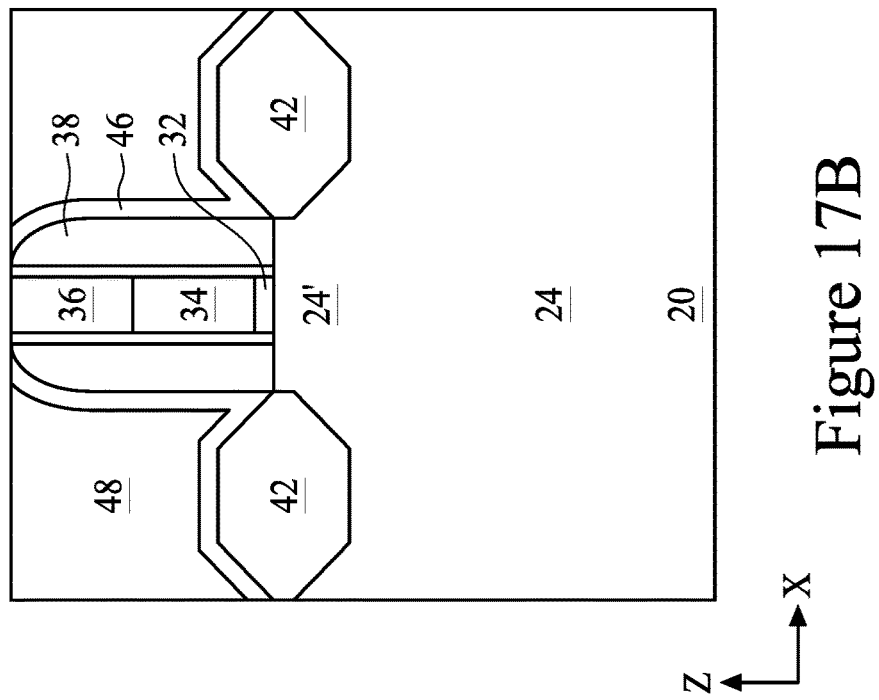
Figure 17A:
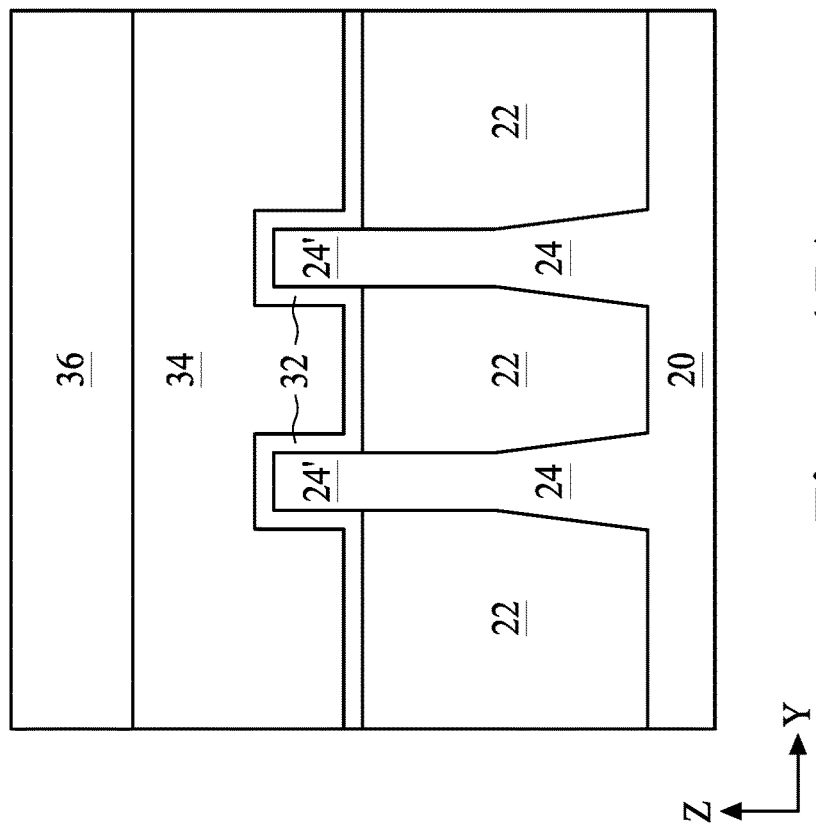

FIG. 17A illustrates a cross-sectional view of the structure shown in FIG. 16, with the cross-sectional view obtained from the plane containing line A-A as illustrated in FIG. 1. FIG. 17B illustrates a cross-sectional view of the structure shown in FIG. 16, with the cross-sectional view obtained from the plane containing line D-D as illustrated in FIG. 1. In FIGS. 16, 17A, and 17B, a planarization process, such as a CMP, may be performed to level the top surface of the dielectric layer 48 with the top surfaces of the dummy gate stacks 30 or the masks 36 (as shown, for example, in FIG. 17B). The planarization process may also remove the masks 36 (or a portion thereof) on the dummy gate stacks 30, and portions of the gate spacers 38 along sidewalls of the masks 36. After the planarization process, the masks 36 may remain, in which case top surfaces of the masks 36, top surfaces of the gate spacers 38, and the top surface of the dielectric layer 48 are leveled with each other. In some embodiments, top surfaces of the dummy gate stacks 30, the gate spacers 38, and the dielectric layer 48 are levelled as a result of the planarization process. In such embodiments, the top surfaces of the dummy gate electrodes 34 are exposed through the dielectric layer 48.

Figure 18:
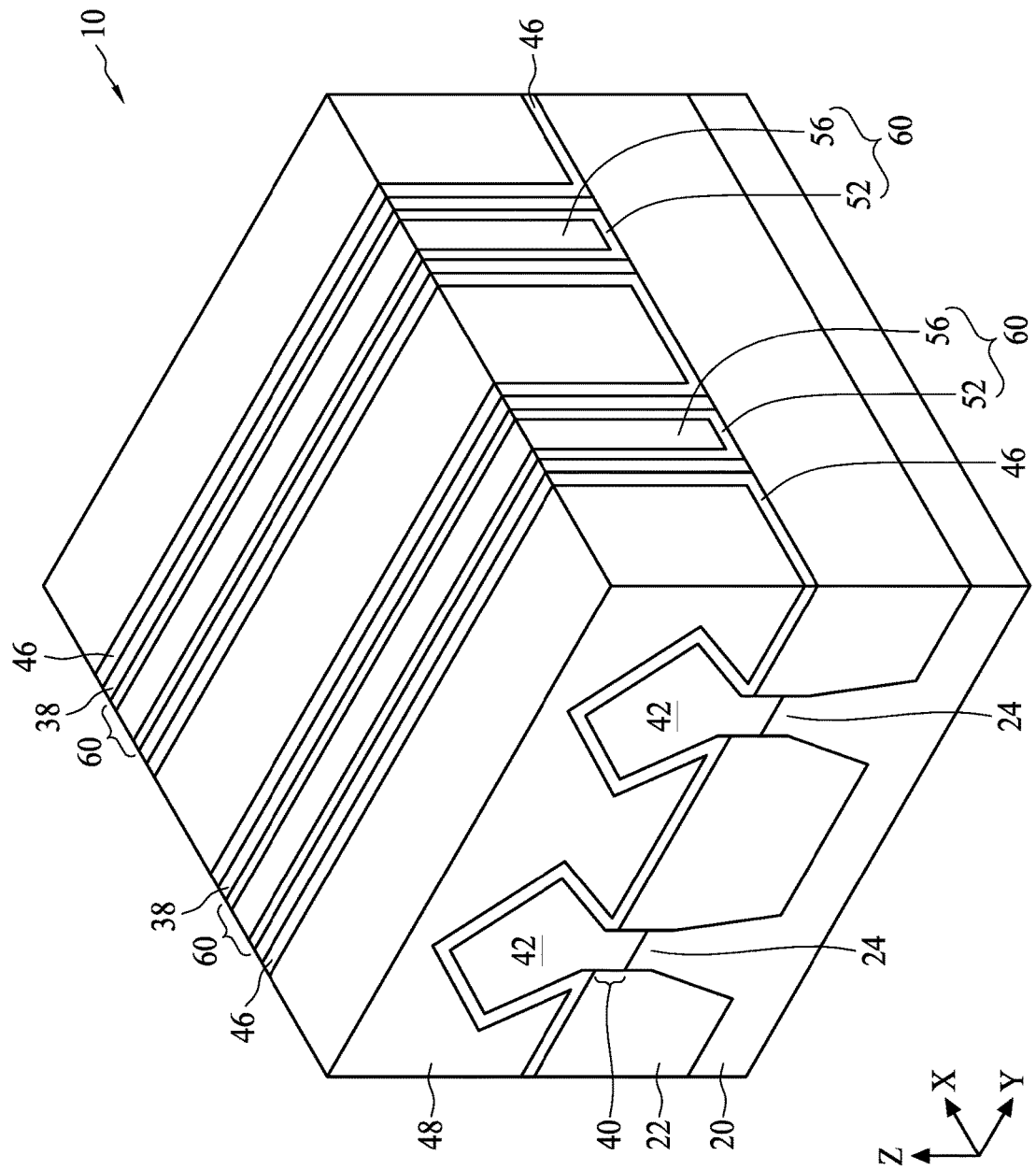
Figure 19B:
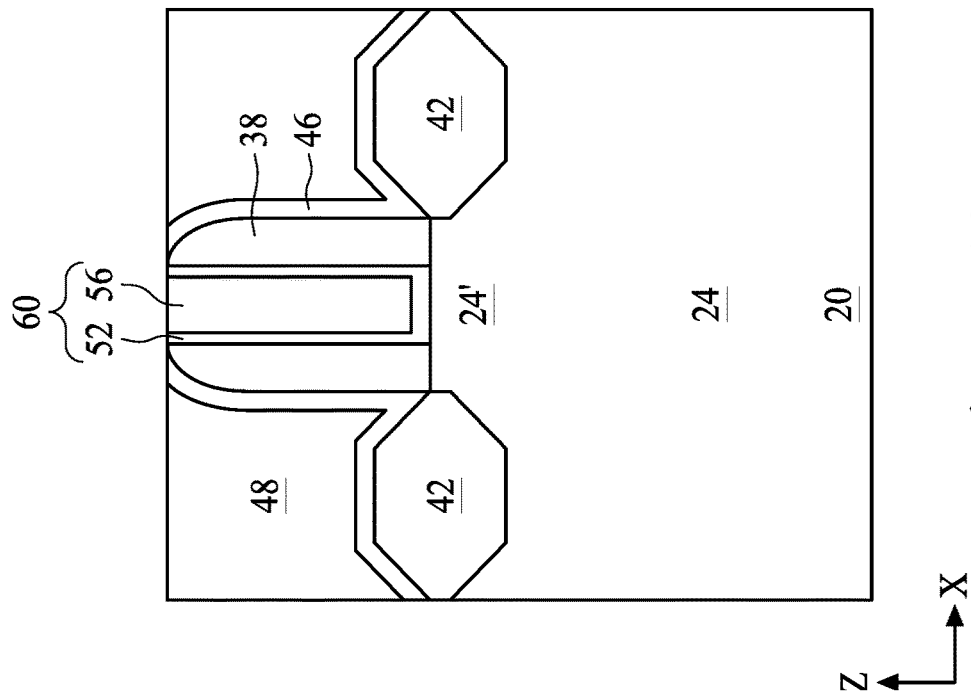
Figure 19A:
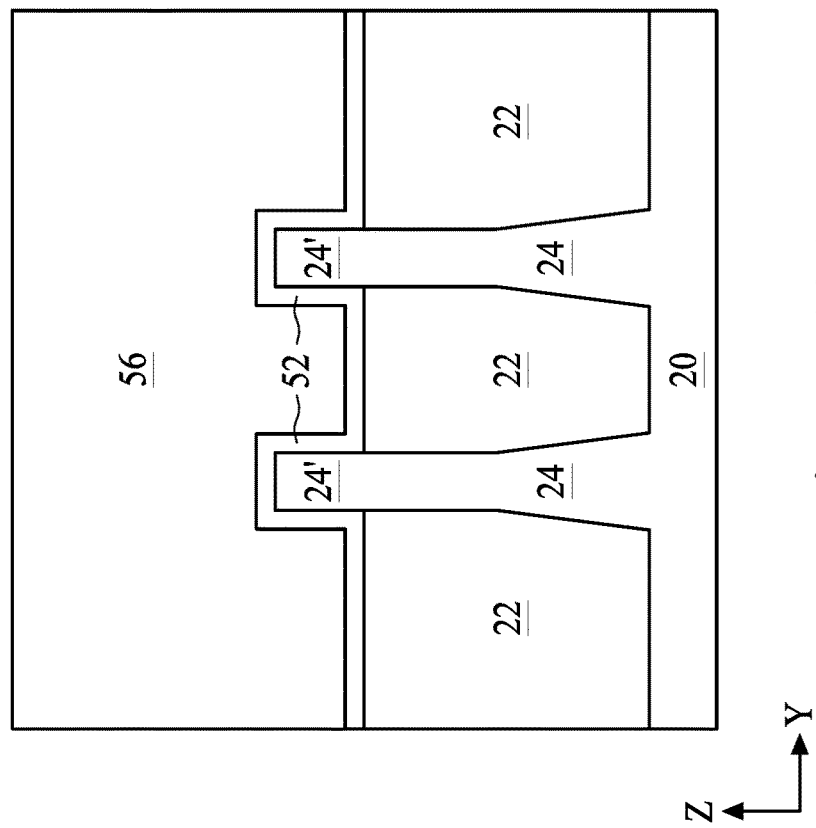

FIG. 19A illustrates a cross-sectional view of the structure shown in FIG. 18, with the cross-sectional view obtained from the plane containing line A-A as illustrated in FIG. 1. FIG. 19B illustrates a cross-sectional view of the structure shown in FIG. 18, with the cross-sectional view obtained from the plane containing line D-D as illustrated in FIG. 1. FIGS. 18, 19A, and 19B illustrate a gate replacement process. The dummy gate electrodes 34, the masks 36 if present, and optionally the gate dielectric layer 32, are removed by one or more etching processes and replaced with replacement gates. In some embodiments, the masks 36, if present, and dummy gate electrodes 34 are removed by an anisotropic dry etch process. During the removal, the gate dielectric layer 32 may be used as an etch stop layer when the dummy gate electrodes 34 are etched. The gate dielectric layer 32 may then be optionally removed after the removal of the dummy gate electrodes 34.

Next, gate dielectric layers 52 and gate electrodes 56 are formed. The gate dielectric layers 52 are deposited conformally in the recesses, such as on the top surfaces and the sidewalls of the fins 24 and on sidewalls of the gate spacers 38. The gate dielectric layers 52 may also be formed on the top surface of the dielectric layer 48. In accordance with some embodiments, the gate dielectric layers 52 includes silicon oxide, silicon nitride, or multilayers thereof. In some embodiments, the gate dielectric layers 52 may include a high-k dielectric material, and in these embodiments, the gate dielectric layers 52 may have a k value greater than about 7.0 and may include a metal oxide or a silicate of hafnium, aluminum, zirconium, lanthanum, manganese, barium, titanium, lead, and combinations thereof. The gate dielectric layers 52 may be formed by Molecular-Beam Deposition (MBD), atomic layer deposition (ALD), PECVD, and the like.

The gate electrodes 56 are deposited over the gate dielectric layers 52 and fill the remaining portions of the recesses. The gate electrodes 56 may include a metal-containing material such as titanium nitride, titanium oxide, tantalum nitride, tantalum carbide, cobalt, ruthenium, aluminum, tungsten, combinations thereof, or multi-layers thereof. For example, although the gate electrode 56 is illustrated in FIG. 19B as having a single layer, the gate electrode 56 may include any number of liner layers, any number of work function tuning layers, and a fill material, all together illustrated as gate electrode 56. The work function tuning layer may include an electrically conductive material, such as a metal nitride, for example TiN or TaN. The fill material may include an electrically conductive material, such as a metal. After the filling of the recesses, a planarization process, such as a CMP, may be performed to remove the excess portions of the gate dielectric layers 52 and excess portions of the gate electrodes 56 over the top surface of the dielectric layer 48. The remaining portions of the gate dielectric layers 52 and the gate electrodes 56 thus form replacement gates of the resulting FinFETs. The gate electrodes 56 and the gate dielectric layers 52 of the replacement gates may be collectively referred to as gate stack 60.

The formation of the gate dielectric layers 52 in the region 20N and the region 20P may occur simultaneously such that the gate dielectric layers 52 in each region are formed from the same materials, and the formation of the gate electrodes 56 may occur simultaneously such that the gate electrodes 56 in each region are formed from the same materials. In some embodiments, the gate dielectric layers 52 in each region may be formed by distinct processes, such that the gate dielectric layers 52 may be different materials, and/or the gate electrodes 56 in each region may be formed by distinct processes, such that the gate electrodes 56 may be different materials. Various masking steps may be used to mask and expose appropriate regions when using distinct processes.

Figure 20:
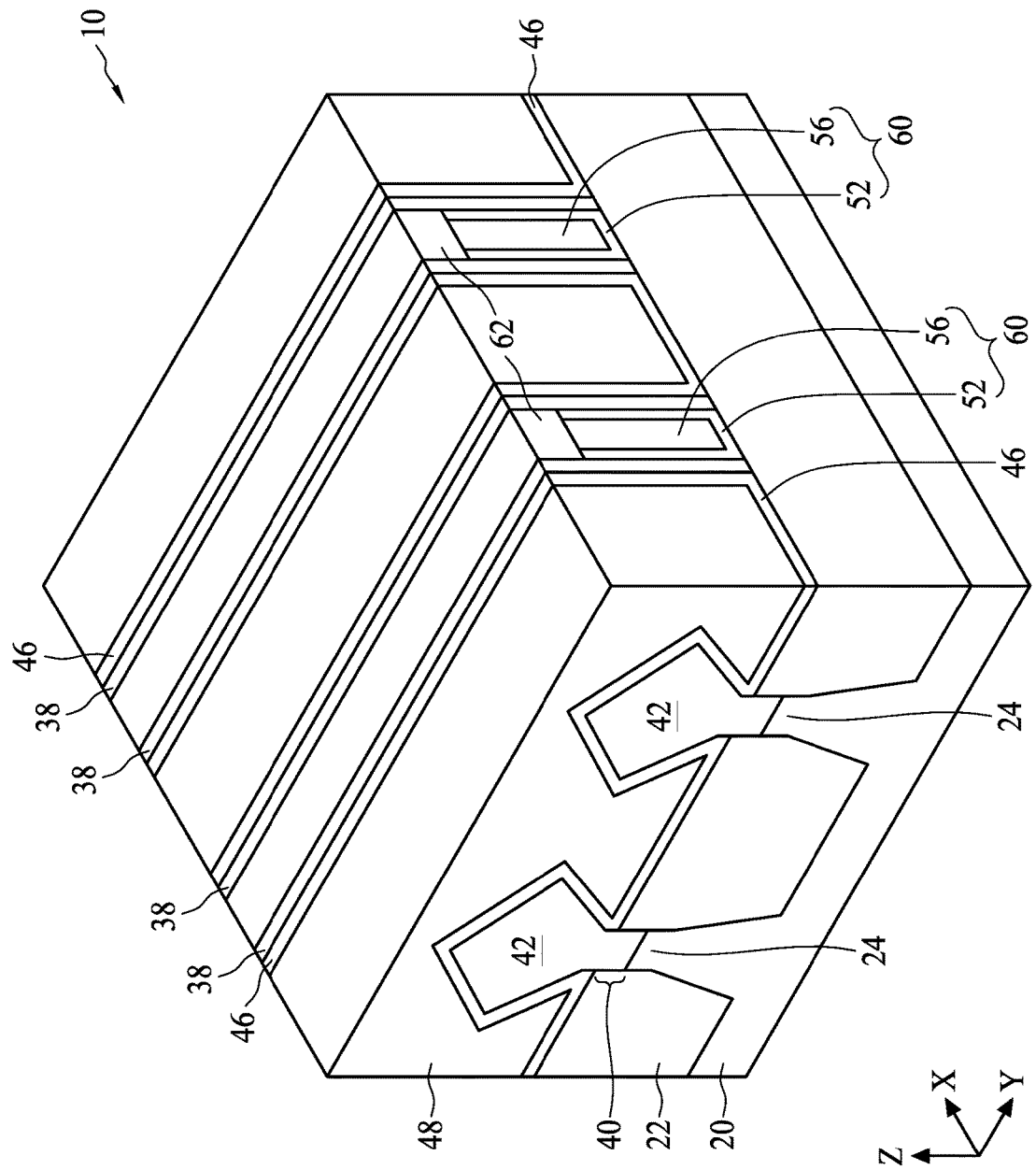
Figure 21B:
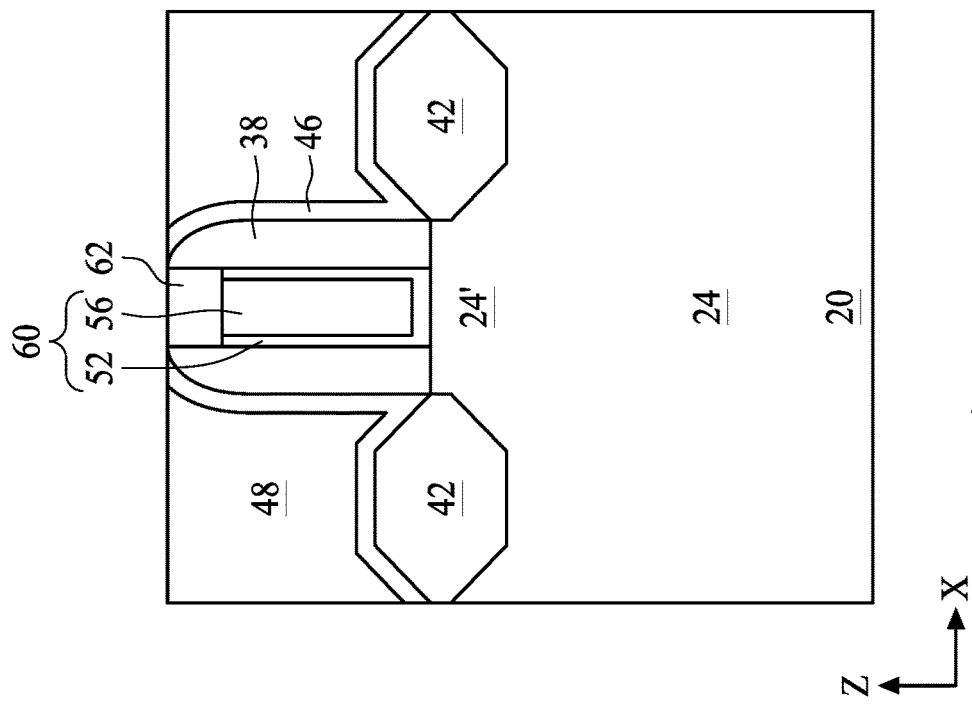
Figure 21A:
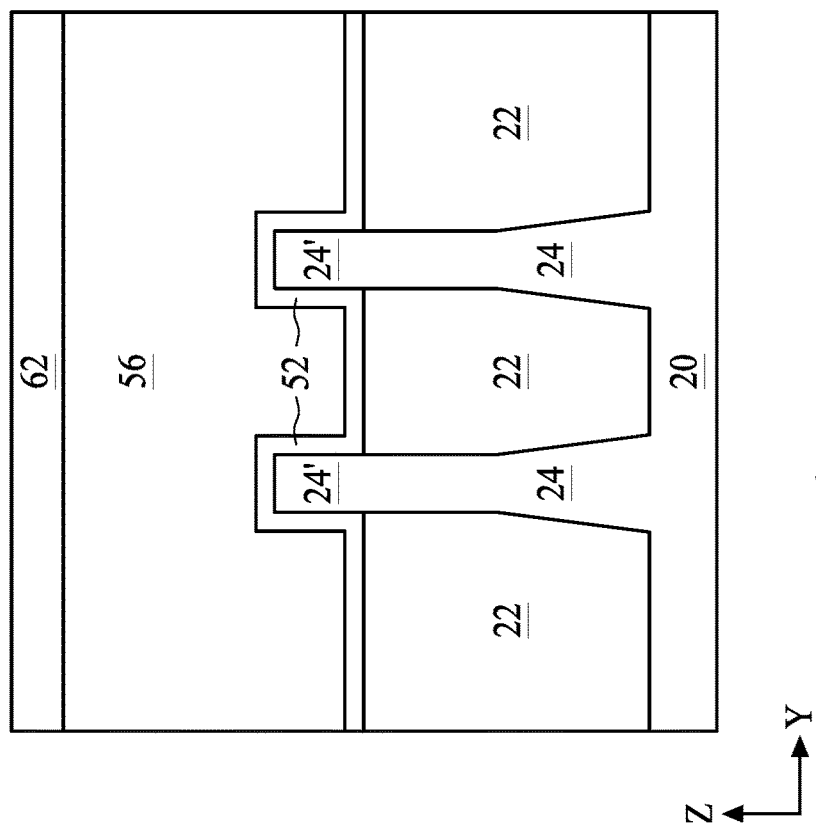

FIG. 21A illustrates a cross-sectional view of the structure shown in FIG. 20, with the cross-sectional view obtained from the plane containing line A-A as illustrated in FIG. 1. FIG. 21B illustrates a cross-sectional view of the structure shown in FIG. 20, with the cross-sectional view obtained from the plane containing line D-D as illustrated in FIG. 1. As shown in FIGS. 20, 21A, and 21B, hard masks 62 are formed. The material of hard masks 62 may be the same as or different from the materials of the CESL 46, the dielectric layer 48, and/or gate spacers 38. In some embodiments, the hard masks 62 are formed of silicon nitride, silicon oxynitride, silicon oxy-carbide, silicon oxy carbo-nitride, or the like. In some embodiments, the hard mask 62 includes silicon or tungsten. The formation of the hard masks 62 may include recessing the gate stacks 60 to form recesses, filling a dielectric material into the recesses, and performing a planarization to remove the excess portions of the dielectric material. The remaining portions of the dielectric material in the recesses are the hard masks 62.

Figure 22:
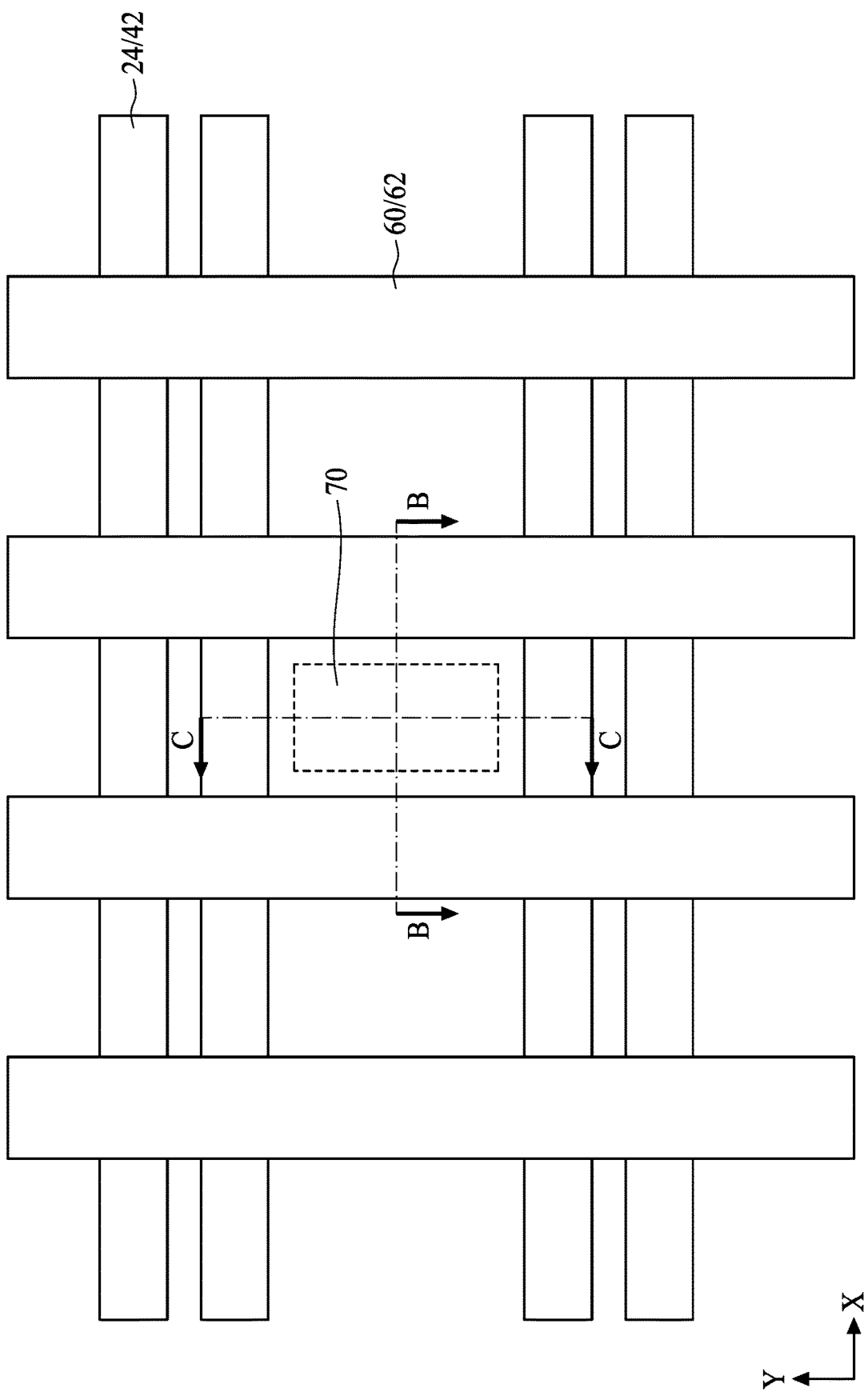

FIG. 22 illustrates a top view of an example portion of a layout of FinFETs, in accordance with some embodiments. In this view, the dielectric layer 48 is not shown so as to illustrate the gate stacks 60 with hard masks 62 and the fins 24 with the epitaxial source/drain regions 42 more clearly. The vertical lines correspond to the gate stacks 60 with the hard masks 62 formed thereon. The horizontal lines correspond to the fins 24 with the epitaxial source/drain regions 42 formed therein. The dashed areas correspond to openings 70 which are areas between adjacent gate stacks 60 and between adjacent fins 24. It is noted that in some embodiments, the openings 70 may be located above the region between adjacent gate stacks 60 and between adjacent fins 24. In other words, the opening 70 may not extend to between adjacent gate stacks 60 and between adjacent fins 24, in some embodiments. Multiple openings 70 may be formed between adjacent gate stacks 60 and between adjacent fins 24. The lines B-B and C-C correspond to the lines in FIG. 1, each one representing a cross-sectional view obtained from the plane containing each respective line.

FIGS. 22 to 37 illustrate a reverse cut contact process for forming conductive contacts for the epitaxial source/drain regions 42. The figure numbers of the subsequent processes may include the letter "A" or "B." Unless specified otherwise, the figures whose numbers having the letter "A" are obtained from the vertical plane same as the vertical plane containing line B-B in FIG. 1. The figures whose numbers having the letter "B" are obtained from the vertical plane same as the vertical plane containing line C-C in FIG. 1.

Figure 23:
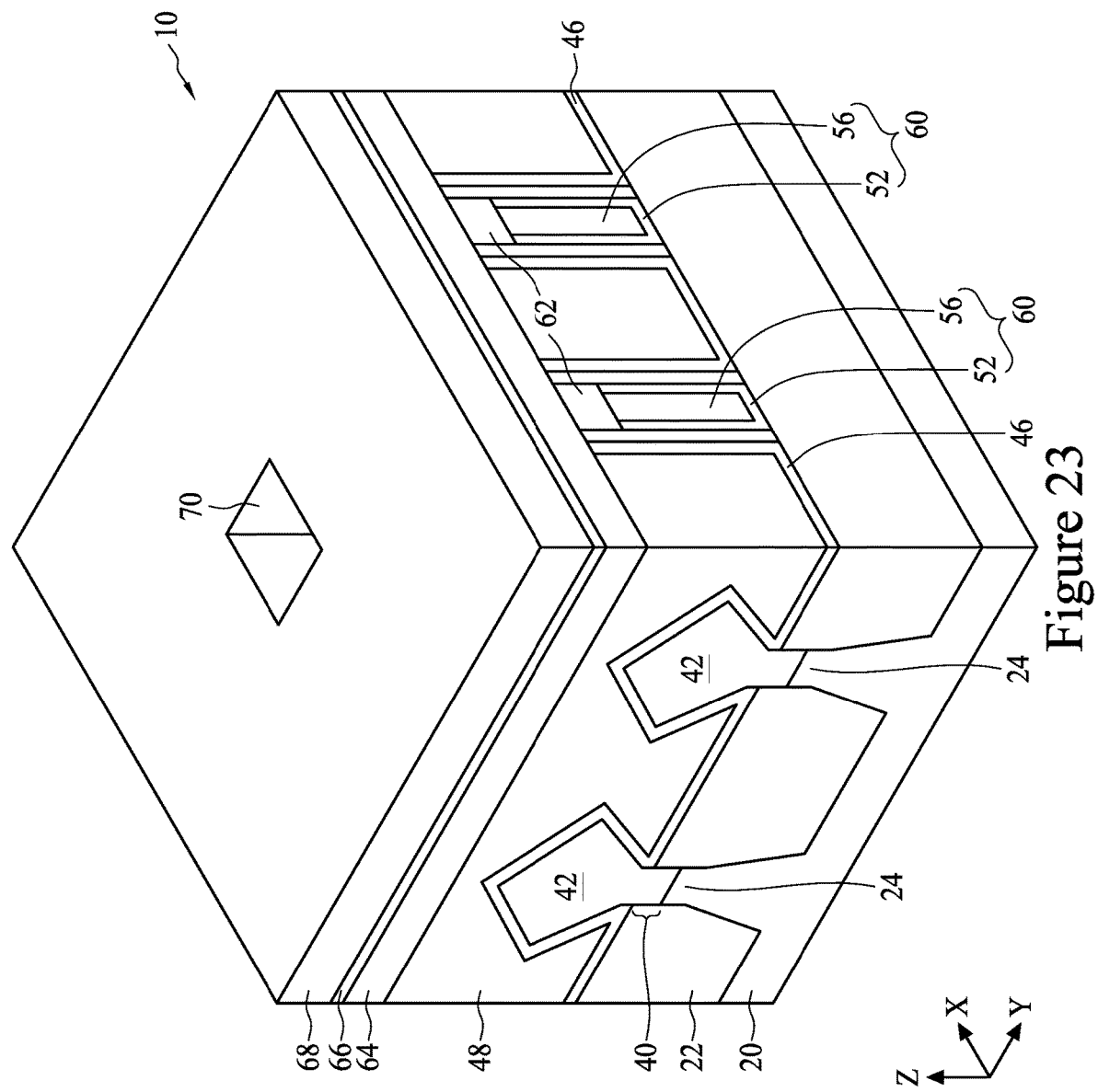
Figure 24A:
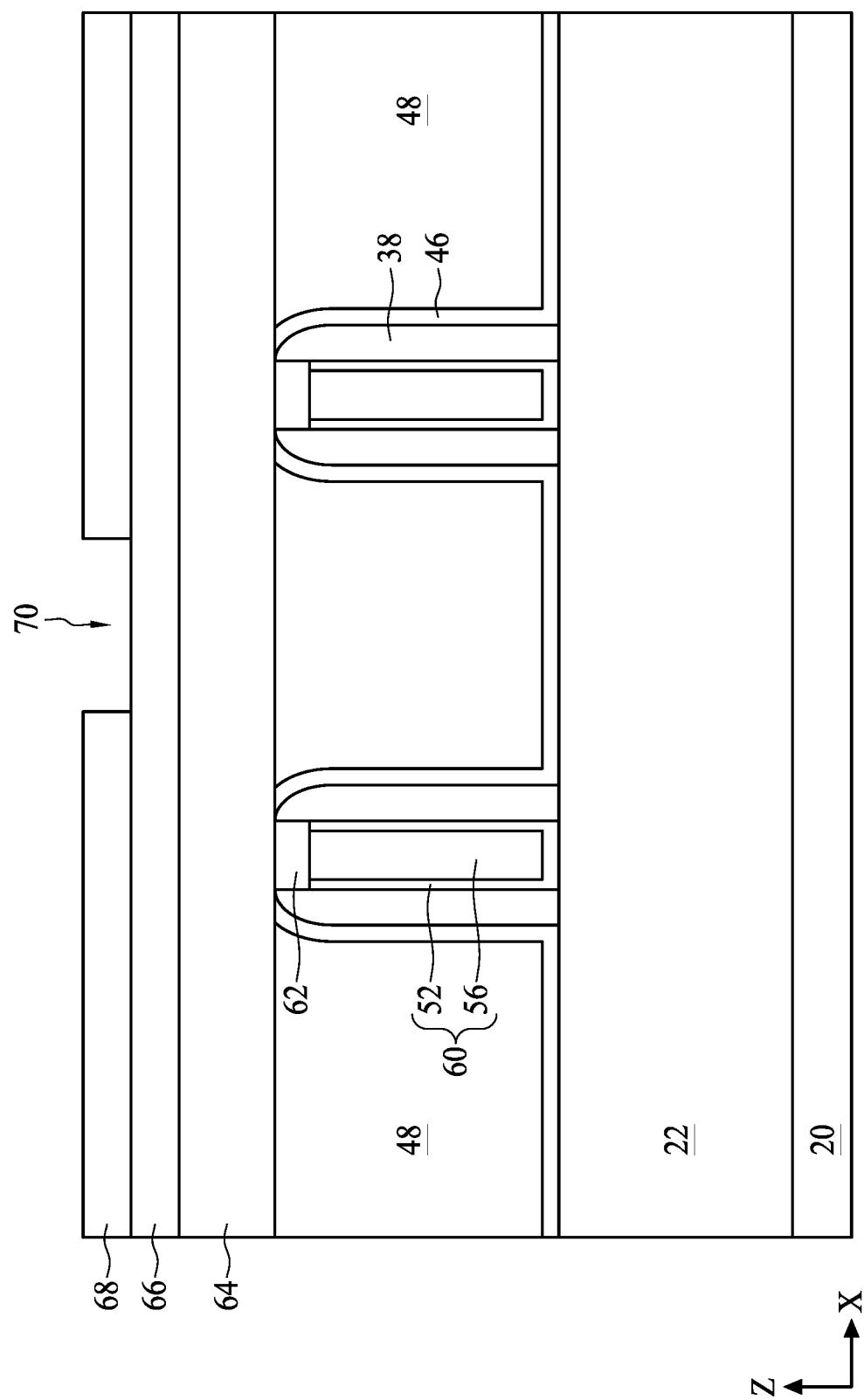
Figure 24B:
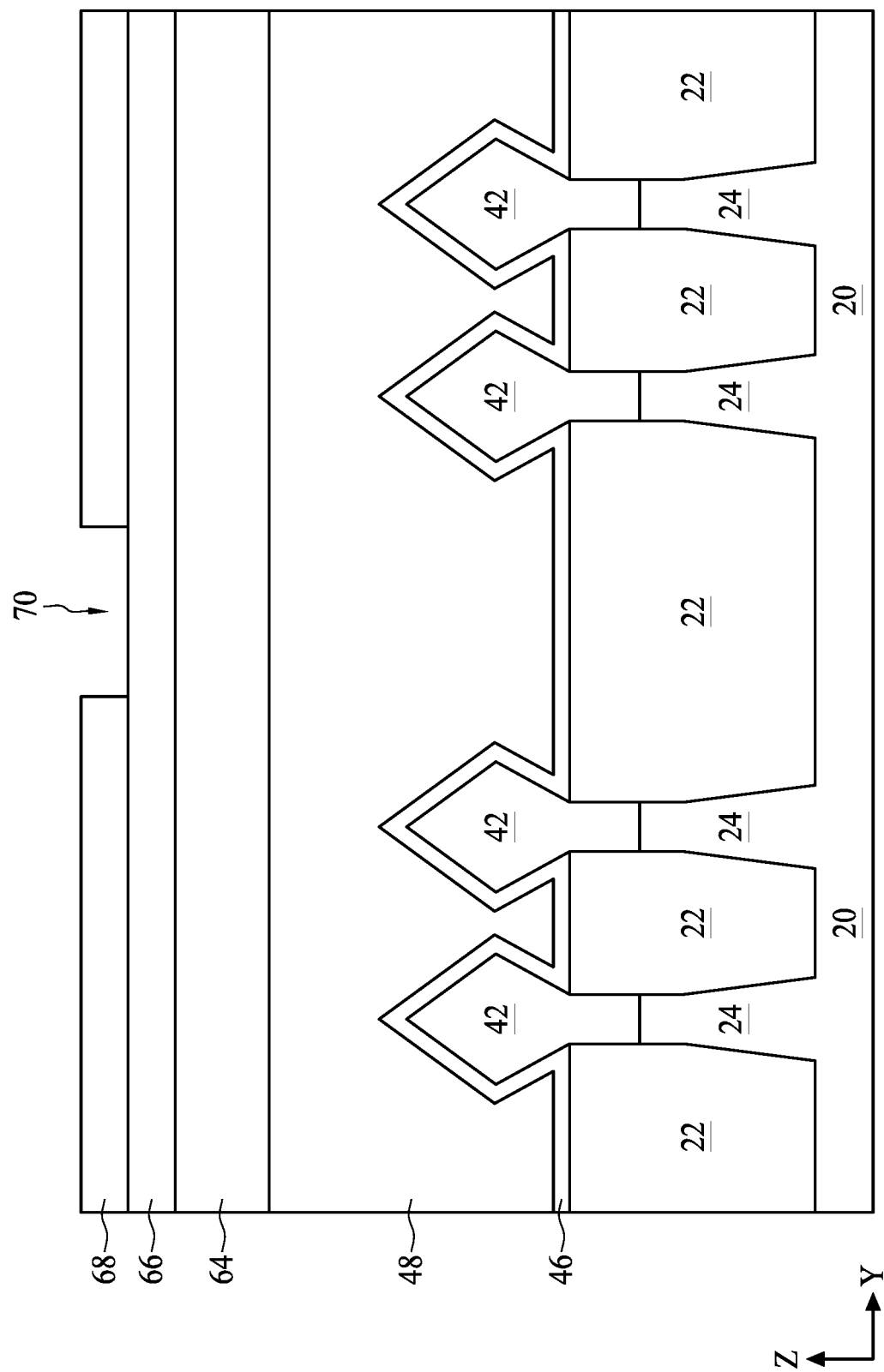

FIGS. 23, 24A, and 24B illustrate the formation of a bottom layer 64, a middle layer 66, and an upper layer 68. In some embodiments, the bottom layer 64 is a Bottom Anti-Reflective Coating (BARC), the middle layer 66 is an oxide or nitride, such as SiN, SiON, SiCN, SiOCN, or the like, and the upper layer 68 may be a patterned photo resist. The opening 70 is formed in the upper layer 68.

Figure 25A:
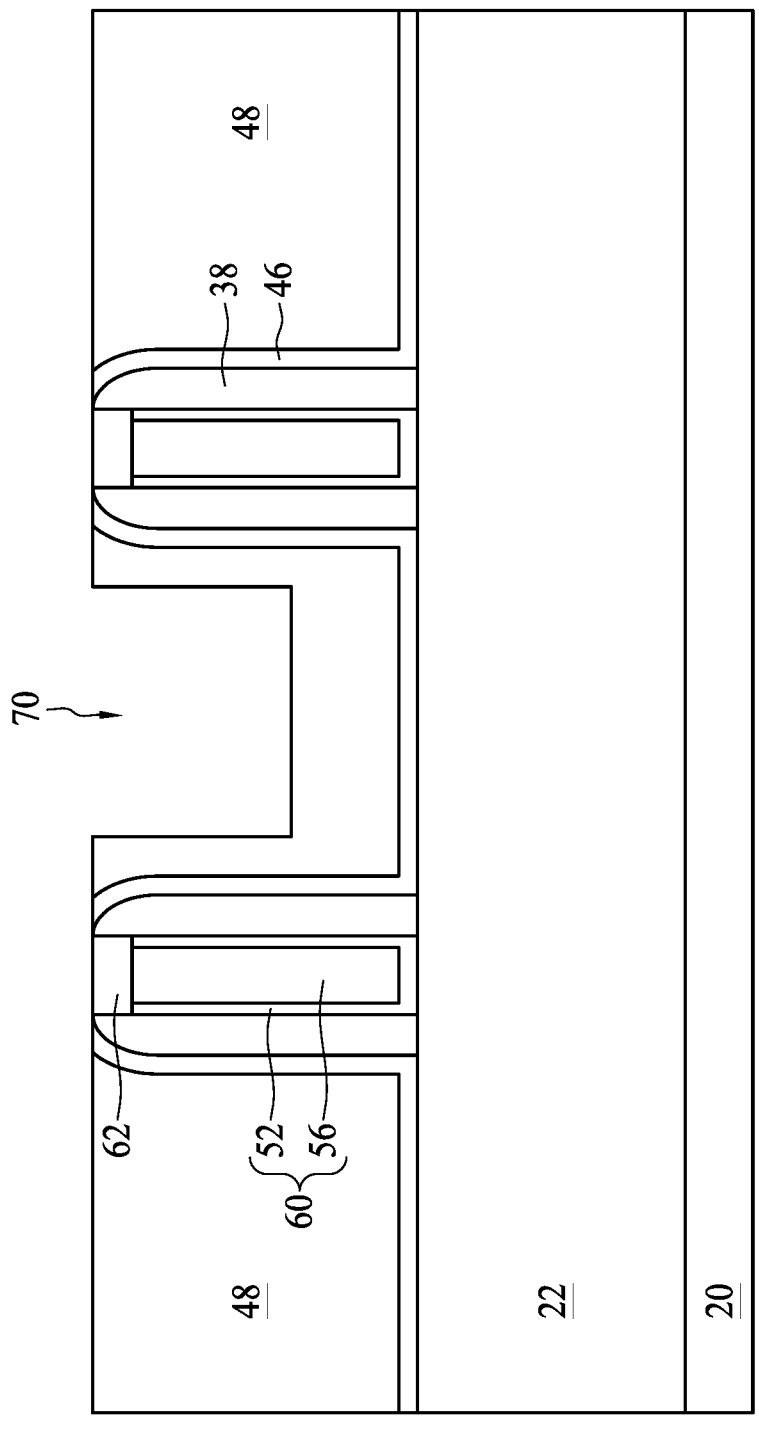
Figure 25B:
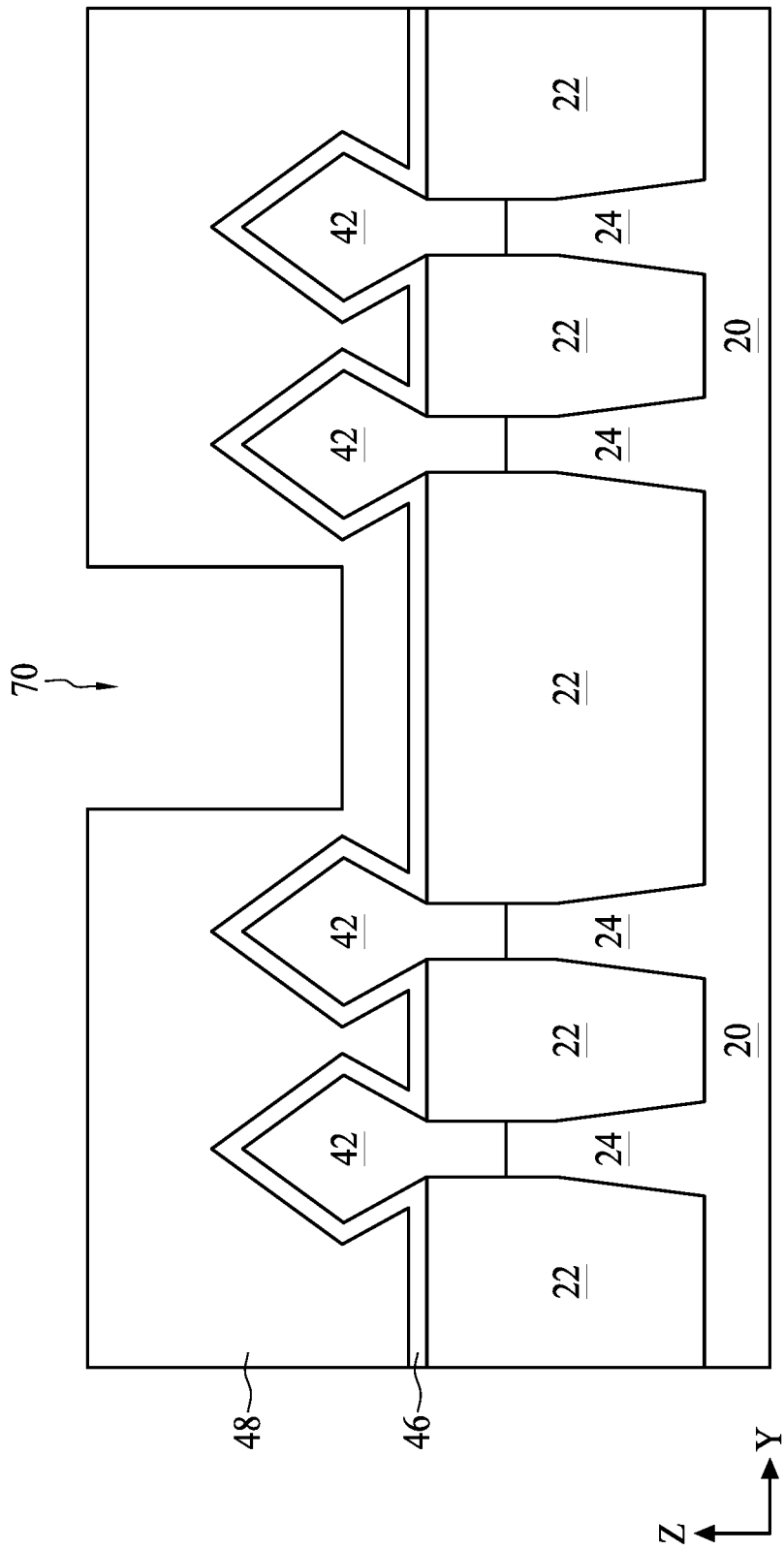
Figure 26A:
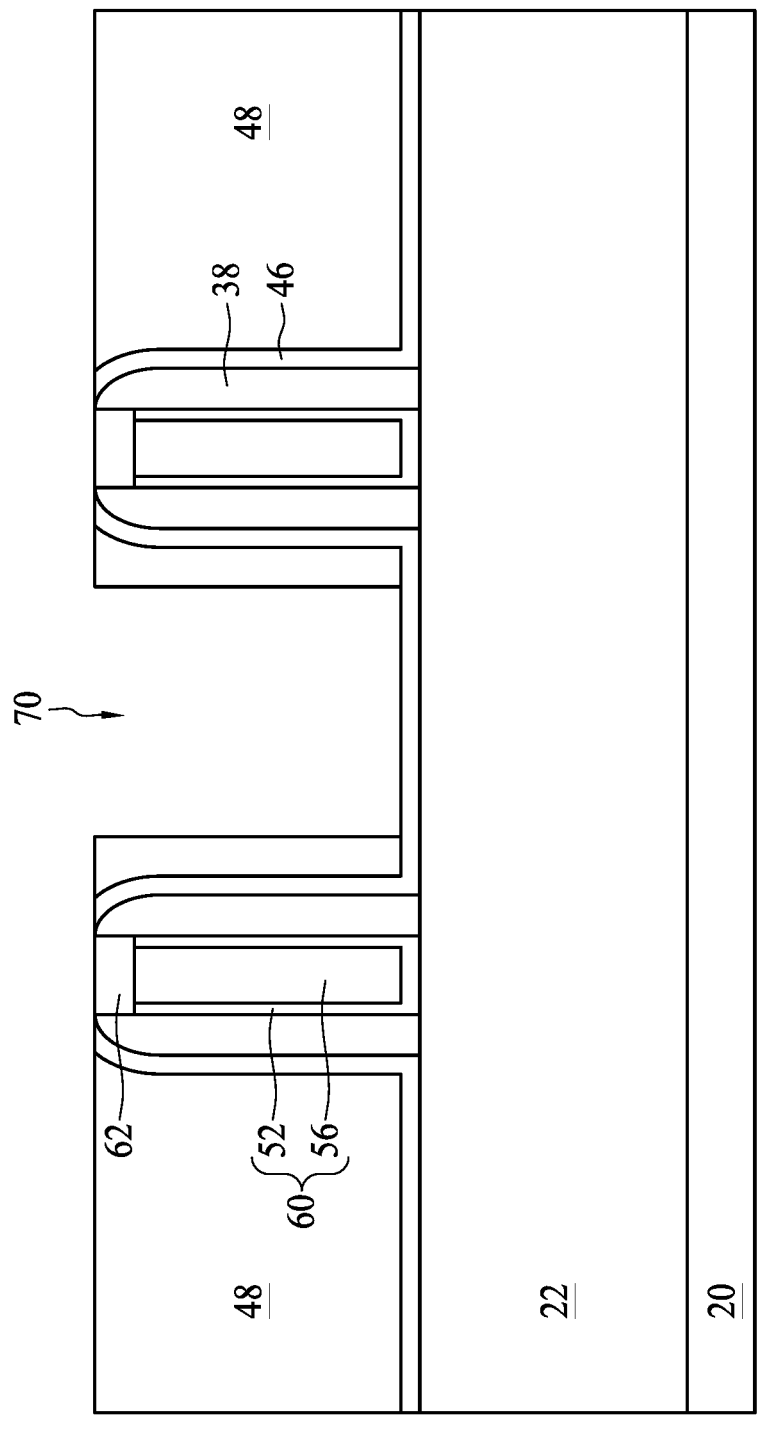
Figure 26B:
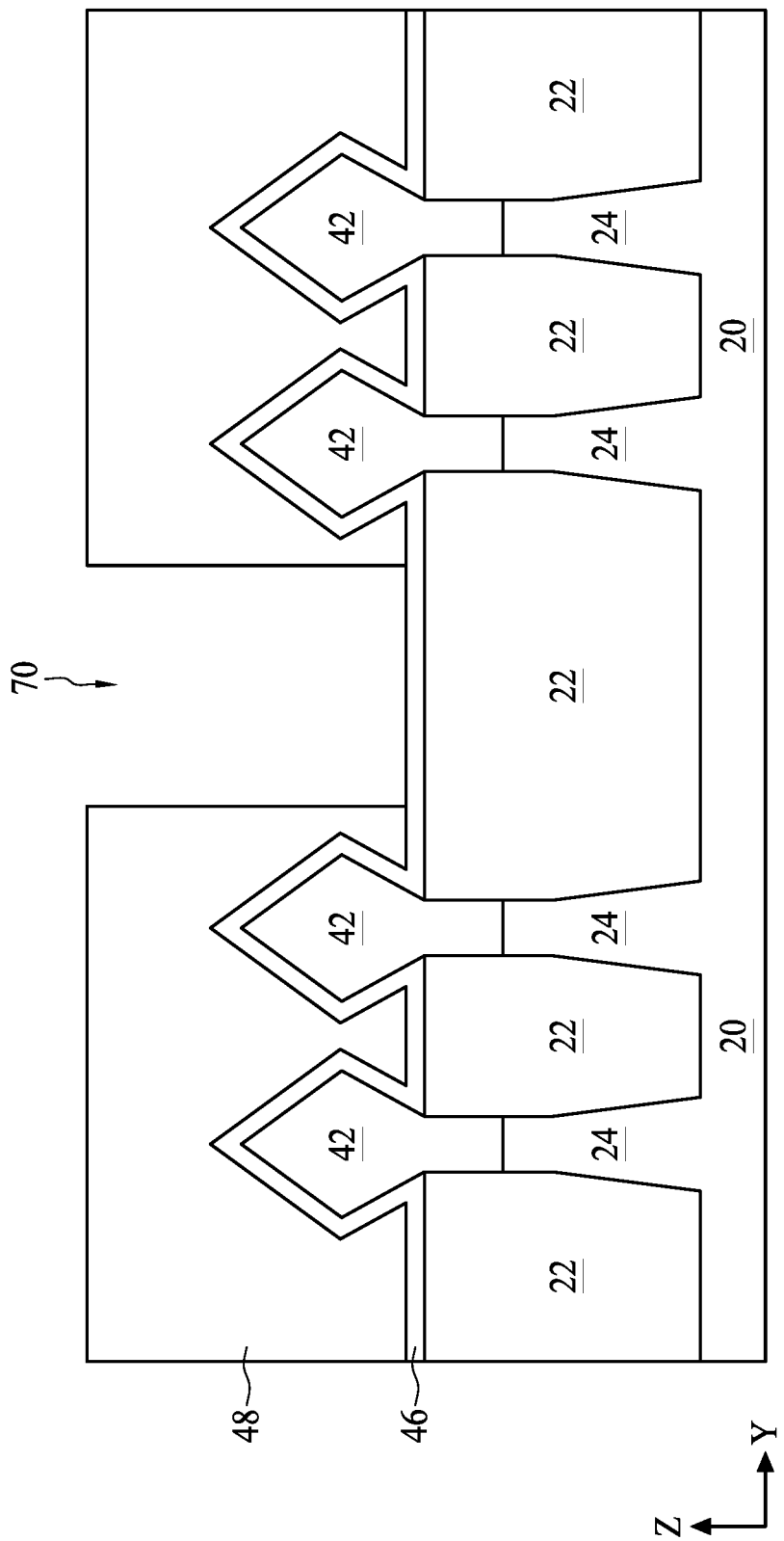

As shown in FIGS. 25A and 25B, the opening 70 is extended into the dielectric layer 48. For example, the opening 70 may be located between adjacent gate stacks 60 and between adjacent epitaxial source/drain regions 42. The bottom layer 64, the middle layer 66, and the upper layer 68 may be removed. In some embodiments, the opening 70 does not extend through the dielectric layer 48, and the bottom of the opening 70 is the dielectric layer 48. In some embodiments, as shown in FIGS. 26A and 26B, the opening 70 extends through the dielectric layer 48, and the bottom of the opening 70 is the CESL 46. In some embodiments, the opening 70 extends through the dielectric layer 48 and the CESL 46 and into the isolation regions 22.

Figure 27A:
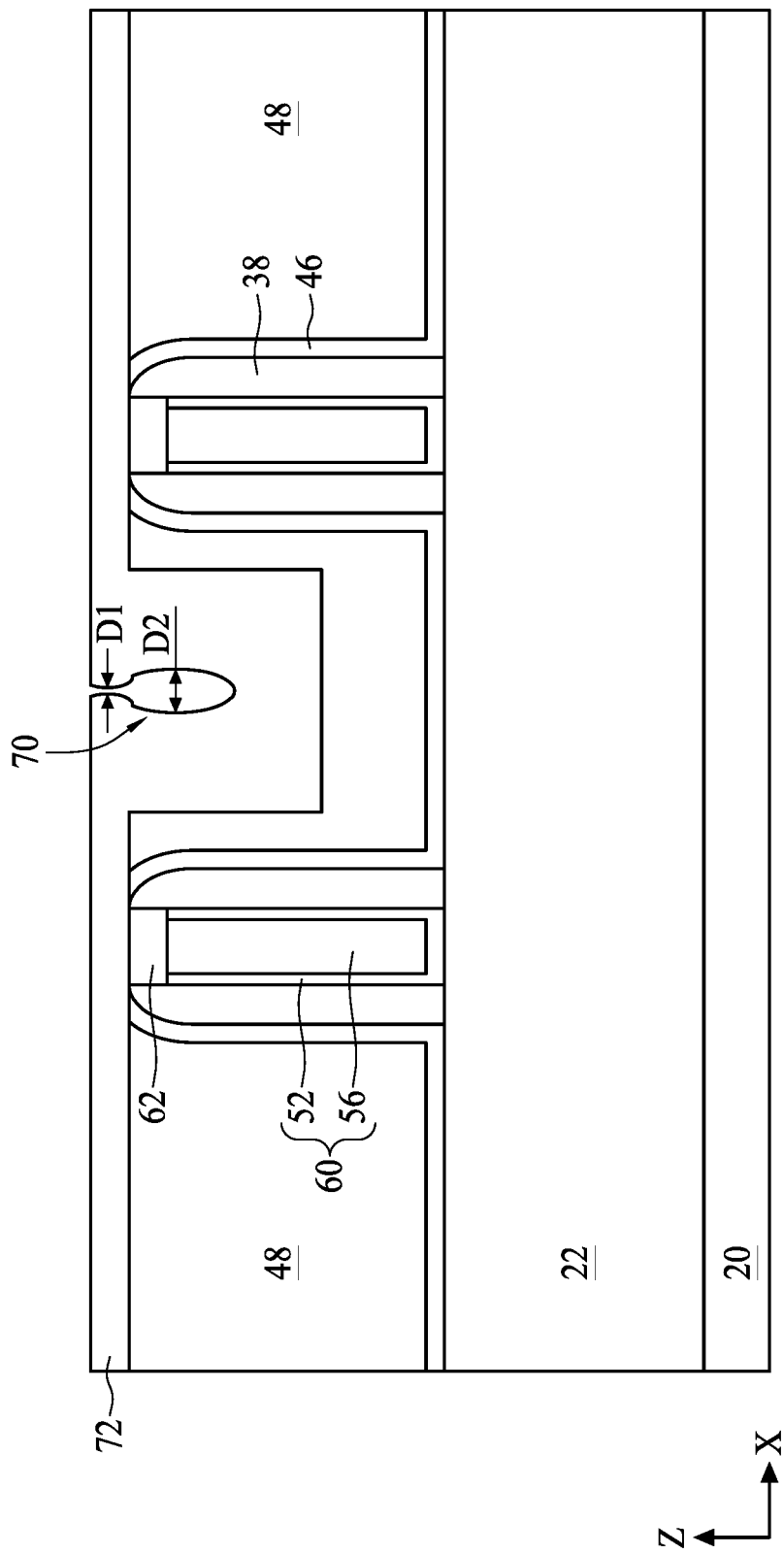
Figure 27B:
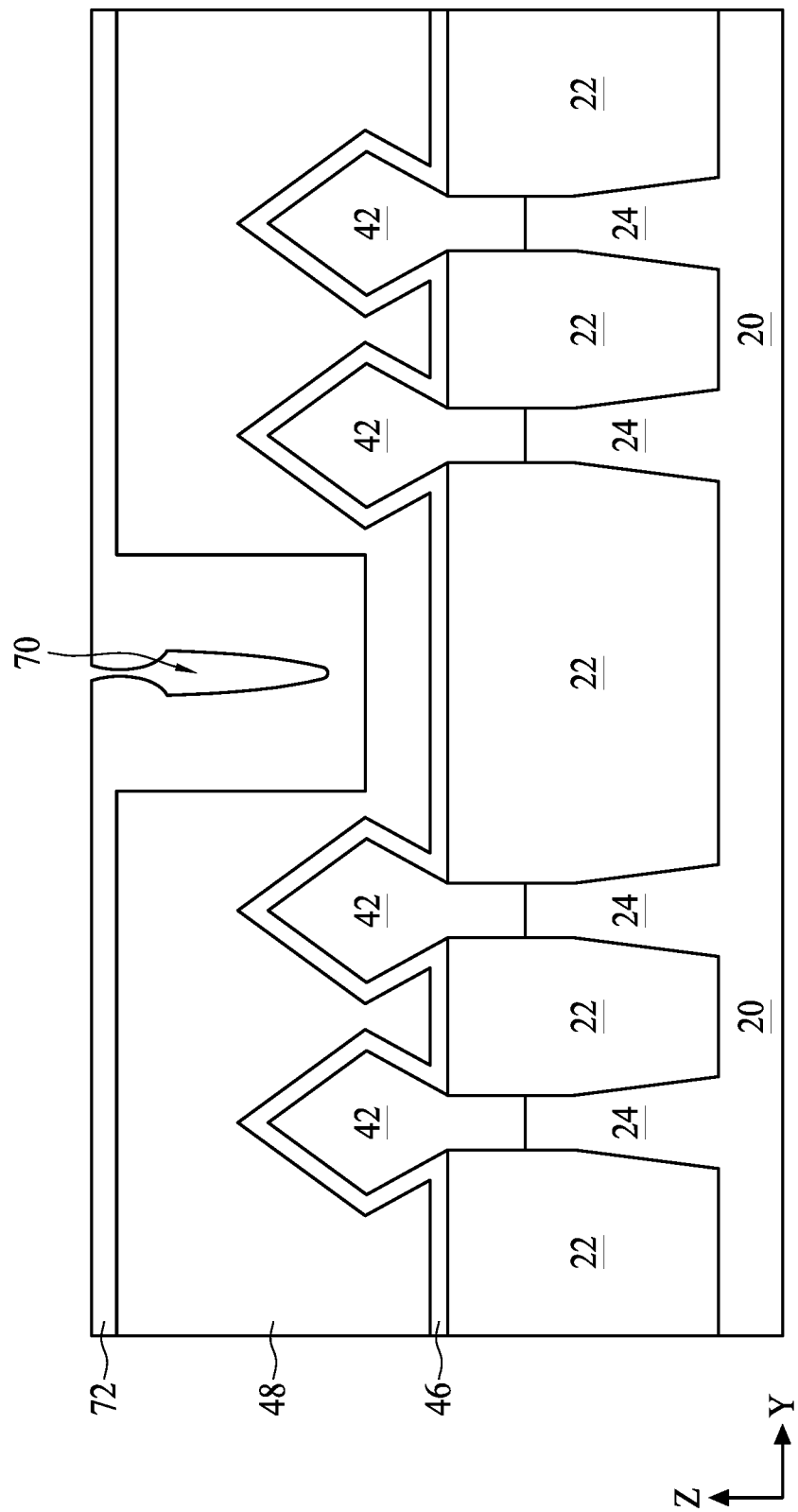
Figure 28A:
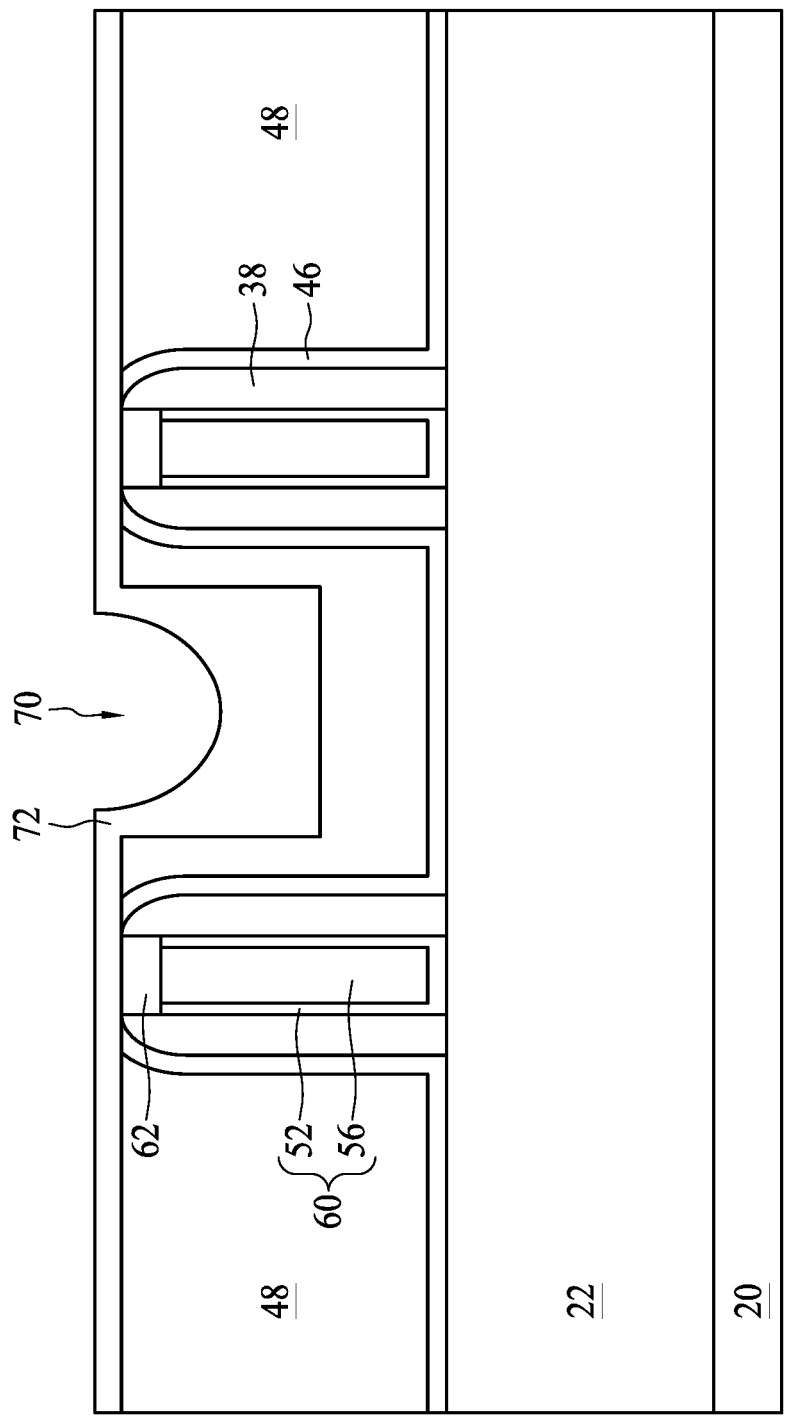
Figure 28B:
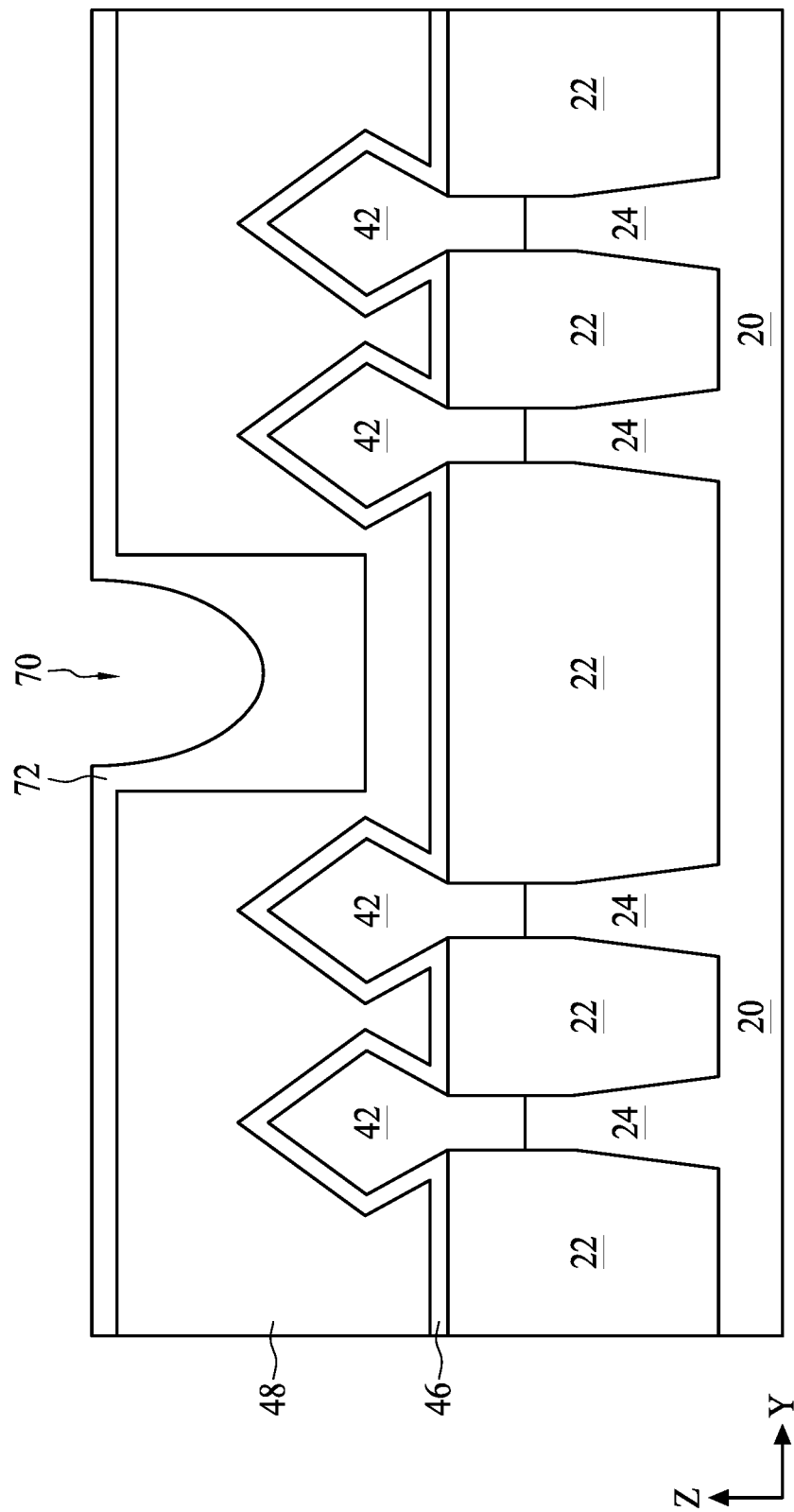

As shown in FIGS. 27A and 27B, a material 72 is deposited in the opening 70 and on the dielectric layer 48. The material 72 may have a different etch selectivity than the materials of the dielectric layer 48, the hard mask 62, and the CESL 46. In some embodiments, the material 72 includes Si, W, SiN, SiCN, SiCO or any suitable material. In some embodiments, the material 72 include the same material as the hard mask 62. The material 72 may be deposited by any suitable deposition process. In some embodiments, a CVD process, such as PECVD process, is performed to form the material 72. As shown in FIGS. 27A and 27B, the material 72 is formed on the sidewall of the opening 70 and on the dielectric layer 48, and a distance D1 between portions of the material 72 disposed on the dielectric layer 48 is substantially smaller than a distance D1 between portions of the material 72 disposed on the sidewall of the opening 70. Thus, if the process for forming the material 72 continues, the opening 70 may be filled with a void or seam formed therein. In order to fill the opening 70 seamlessly or void free, an etch process is performed to remove the portions of the material 72 formed on the dielectric layer 48 and to enlarge the top portion of the opening 70, as shown in FIGS. 28A and 28B.

Figure 29A:
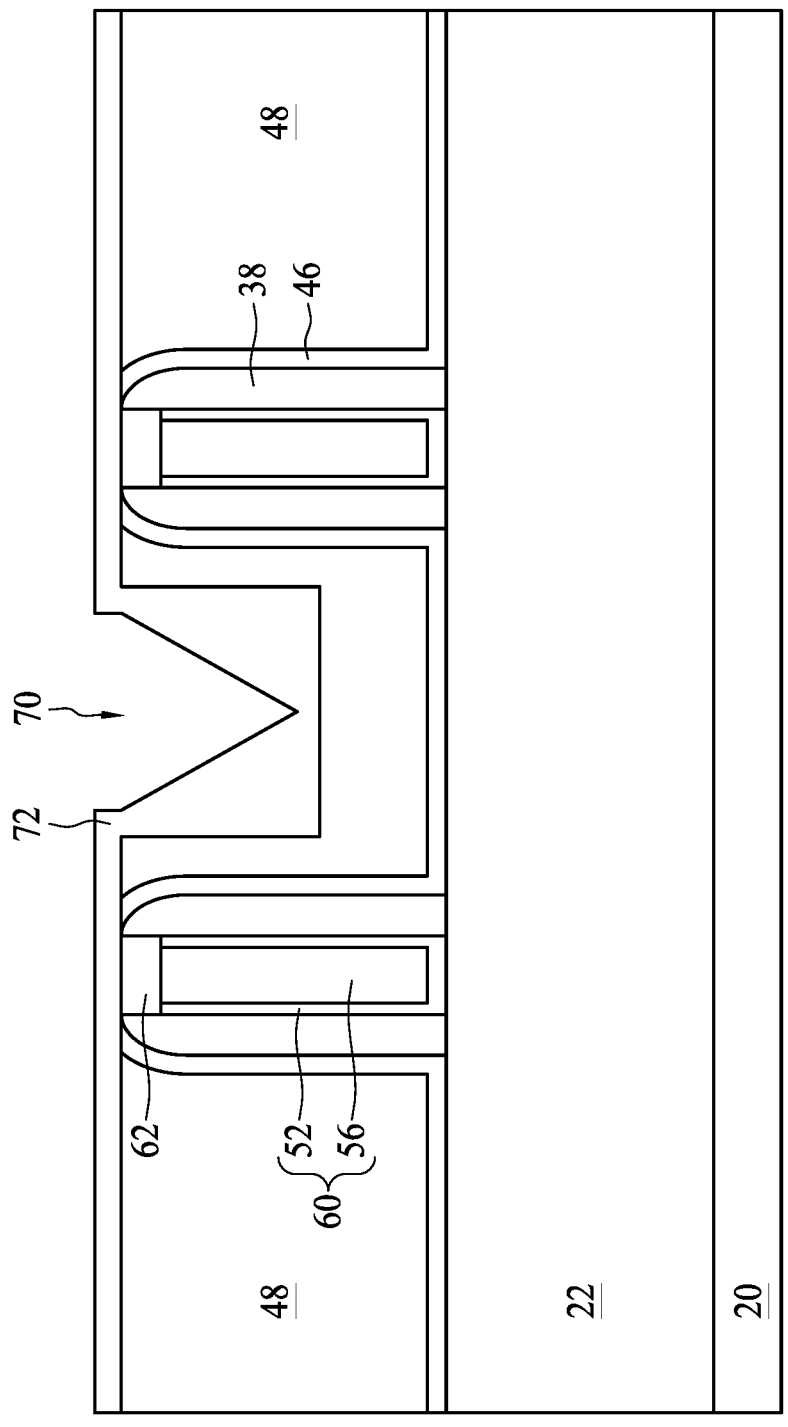
Figure 29B:
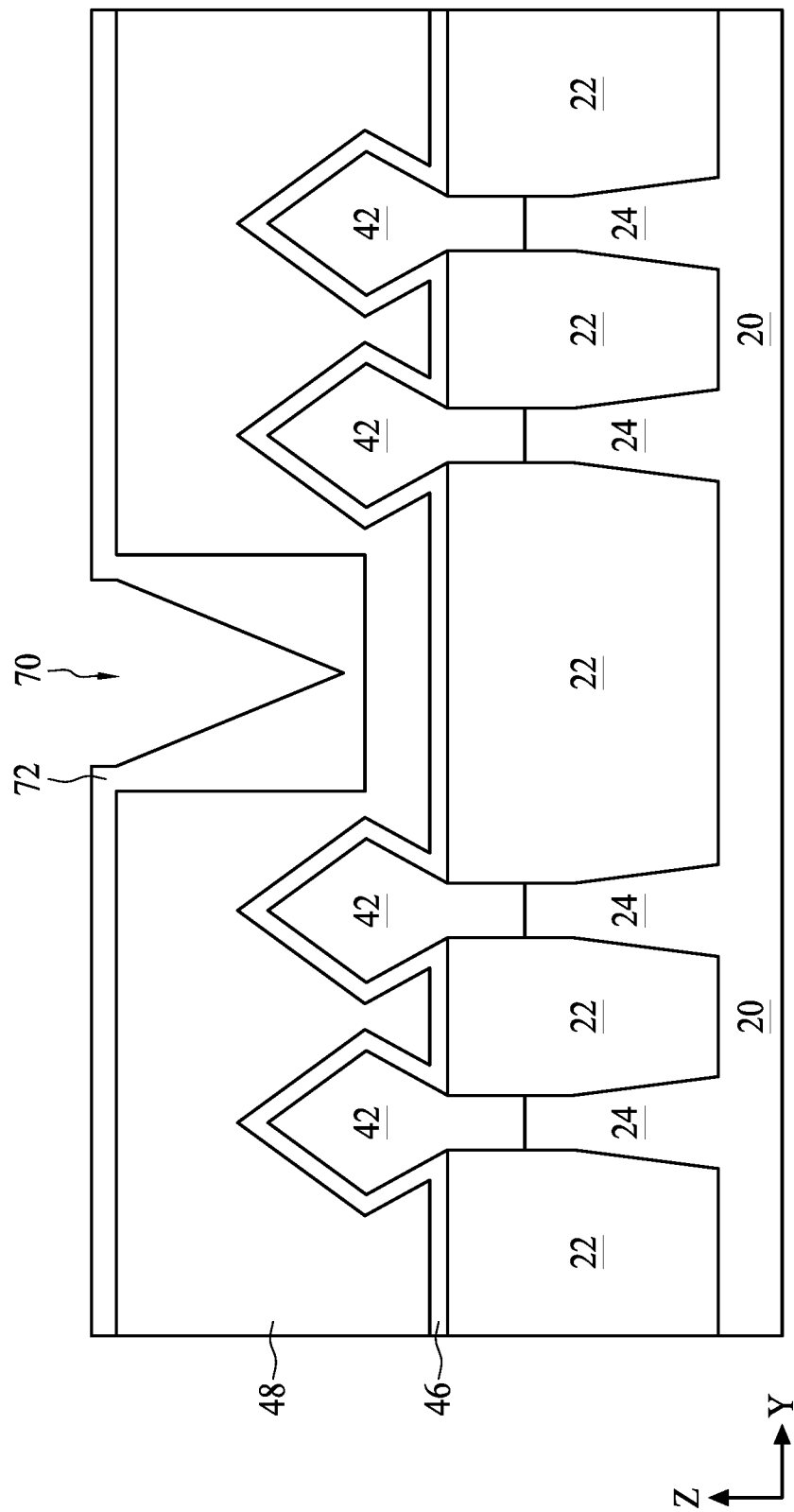
Figure 30A:
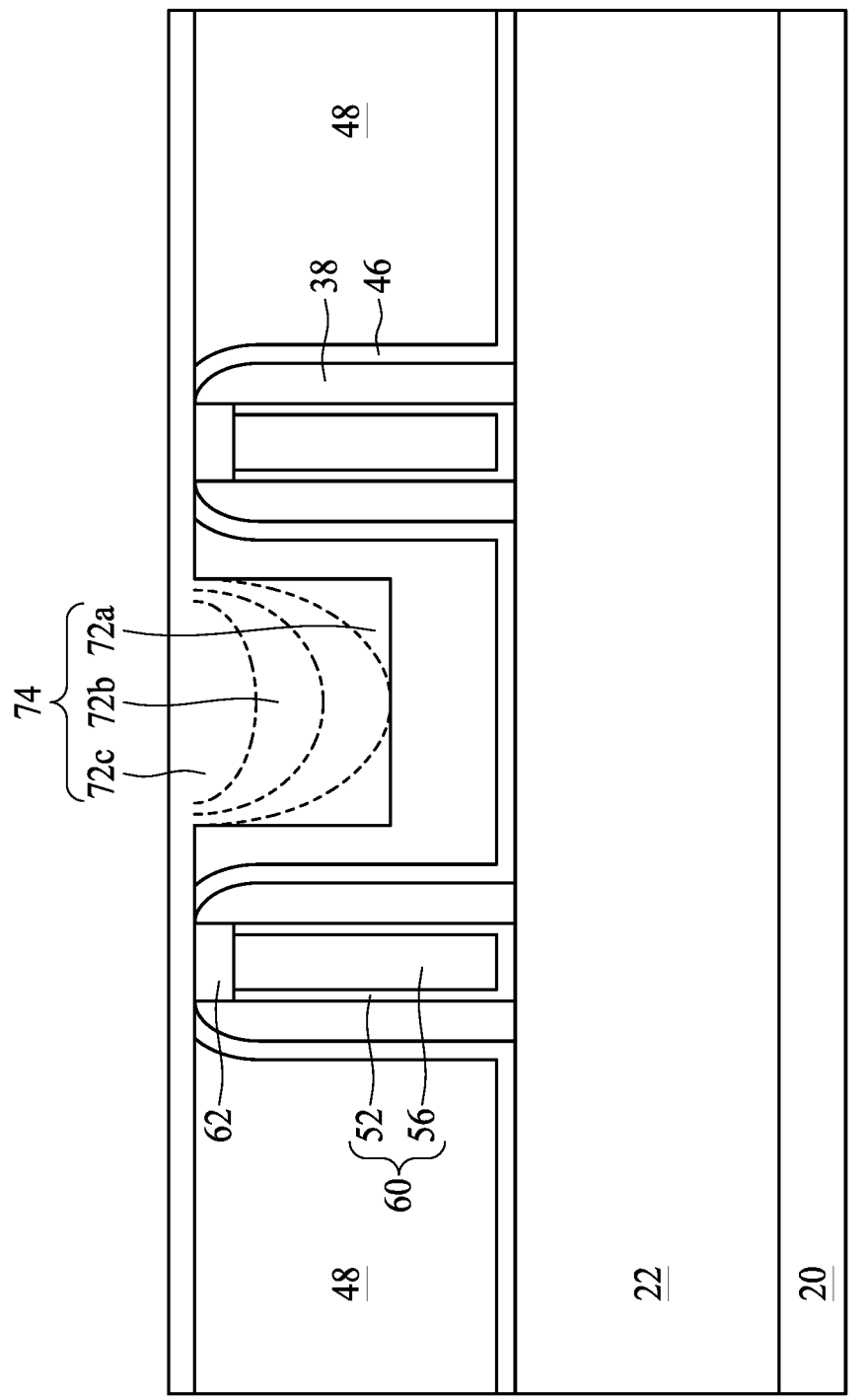
Figure 30B:
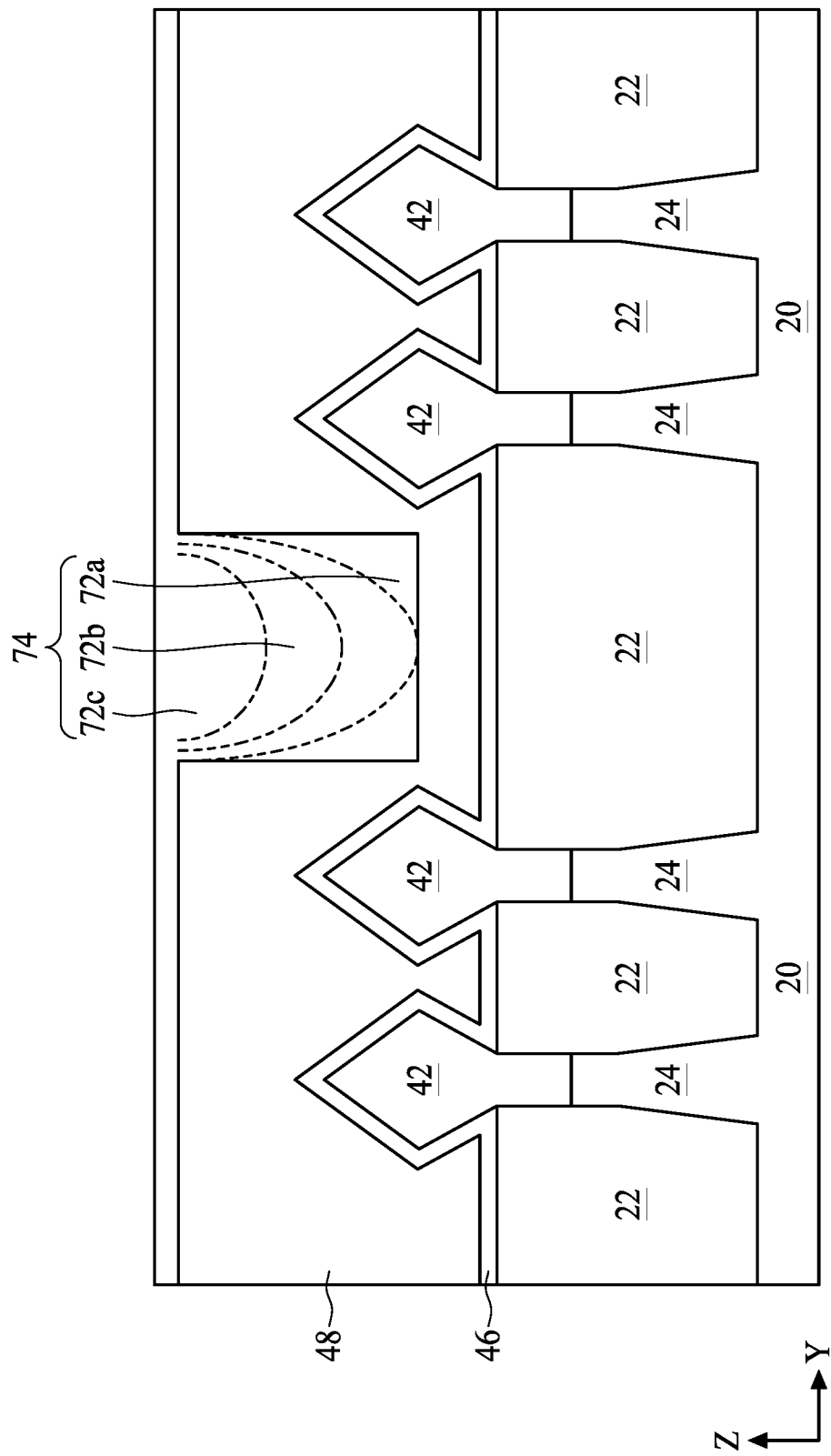
Figure 31A:
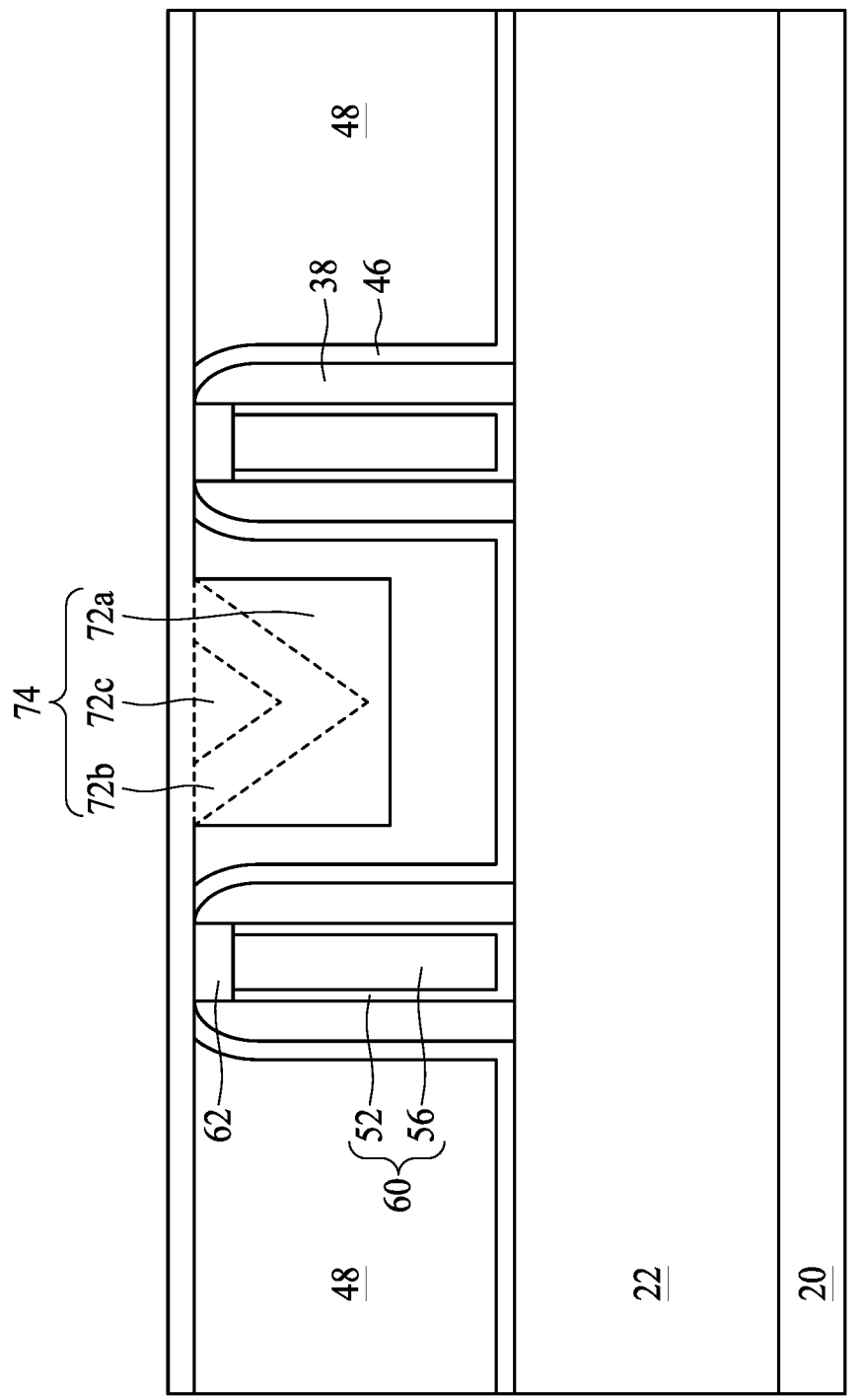
Figure 31B:
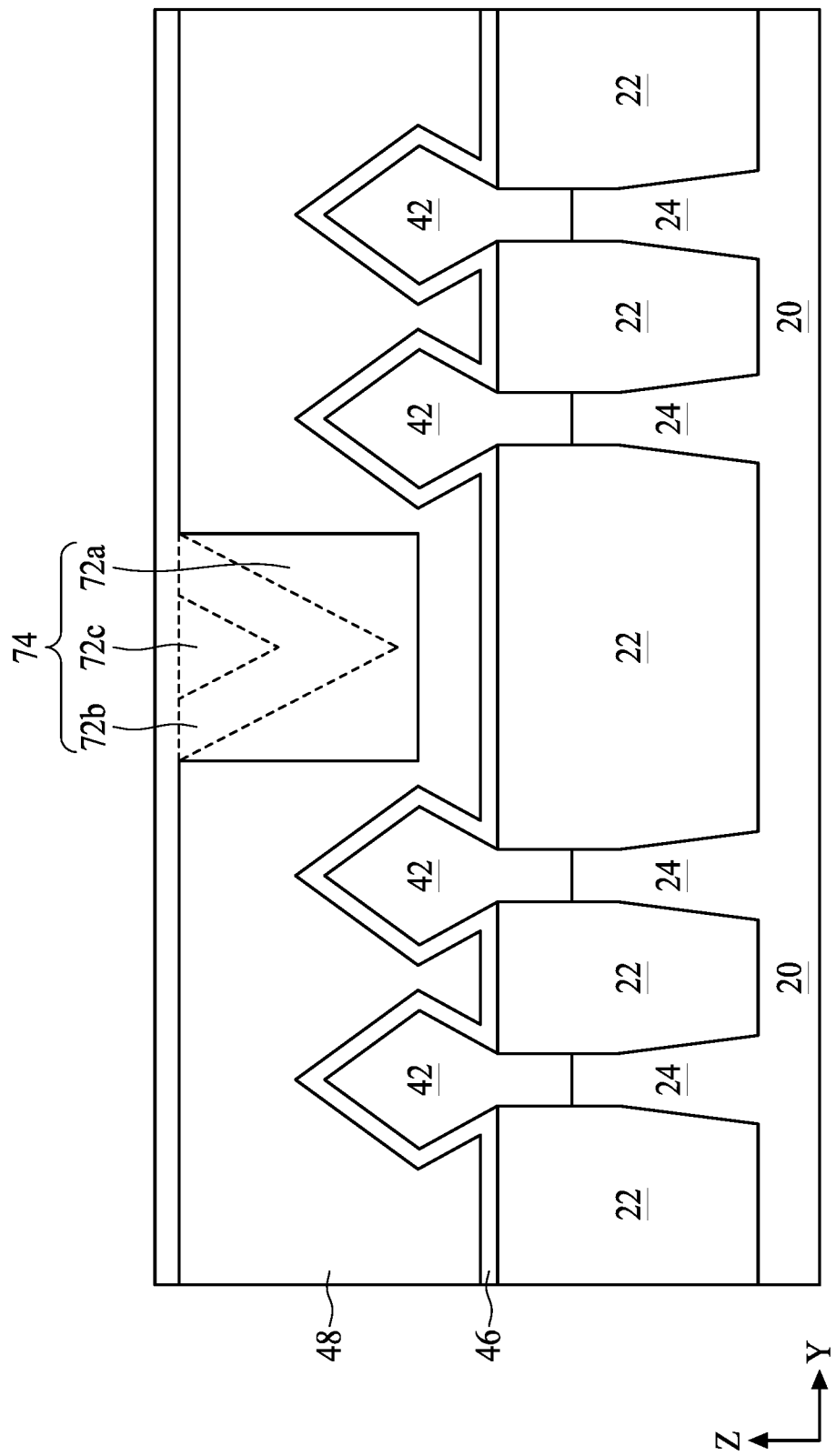

The etch process may be any suitable etch process, such as a dry etch. In some embodiments, an anisotropic plasma etch is performed to remove portions of the material 72. In some embodiments, the etch process is a physical sputter process. In some embodiments, the remaining material 72 in the opening 70 may have a "U" shaped cross-section, as shown in FIGS. 28A and 28B. In some embodiments, the remaining material 72 in the opening 70 may have a "V" shaped cross-section, as shown in FIGS. 29A and 29B. In some embodiments, as shown in FIGS. 28A, 28B, 29A, 29B, a portion of the remaining material 72 is dispose on the dielectric layer 48. In some embodiments, the remaining material 72 is only disposed in the opening 70. In other words, the portion of the material 72 disposed on the dielectric layer 48 is removed by the etch process.

The deposition process and the etch process may be repeated until the opening 70 is filled. The deposition and the etch processes may be a cycle, and multiple cycles may be performed to fill the opening 70. For example, as shown in FIGS. 30A, 30B, 31A, 31B, three cycles are performed to form layers 72a, 72b, 72c in the opening 70. The layer 72a may be the material 72 shown in FIGS. 28A, 28b, 29A, and 29B. The number of cycles is not limited to three. In some embodiments, the number of cycles ranges from about two to about 10. As a result of the process cycles, a gapfill 74 fills the opening 70 seamlessly and void free, which in turn improves yield. The gapfill 74 may include the multiple layers from the deposition and etch cycles, such as the layers 72a, 72b, 72c. A planarization process, instead of the etch process, may be performed after the deposition process of the last cycle. As a result, as shown in FIGS. 30A, 30B, 31A, 31B, the gapfill 74 may be substantially coplanar with the dielectric layer 48 and the hard mask 62. In some embodiments, the gapfill 74 is disposed in the dielectric layer 48. In some embodiments, the gapfill 74 is disposed through the dielectric layer 48 and on the CESL 46. In some embodiments, the gapfill 74 is disposed through the dielectric layer 48 and the CESL 46 and on the isolation region 22.

Figure 32A:
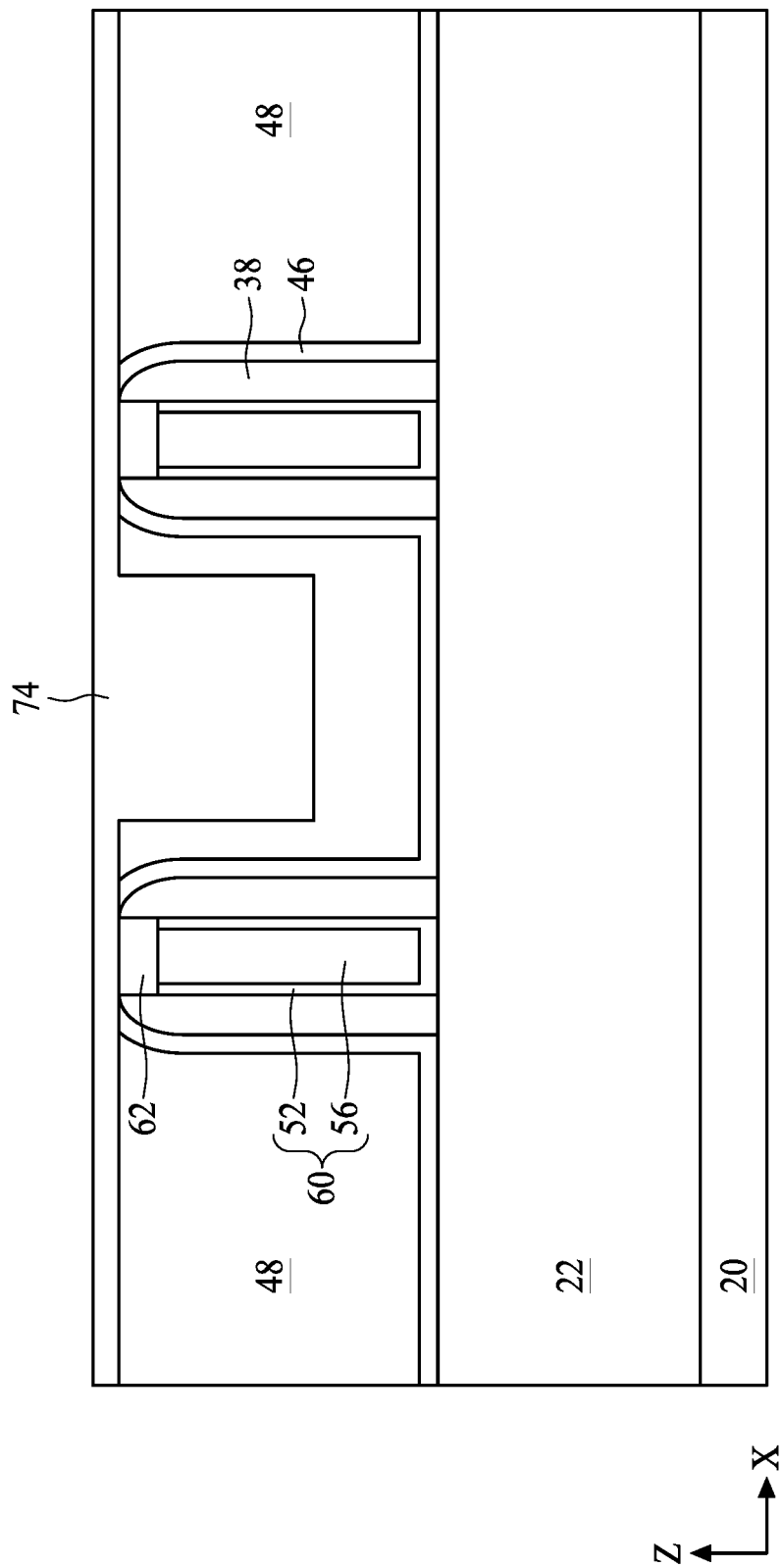
Figure 32B:
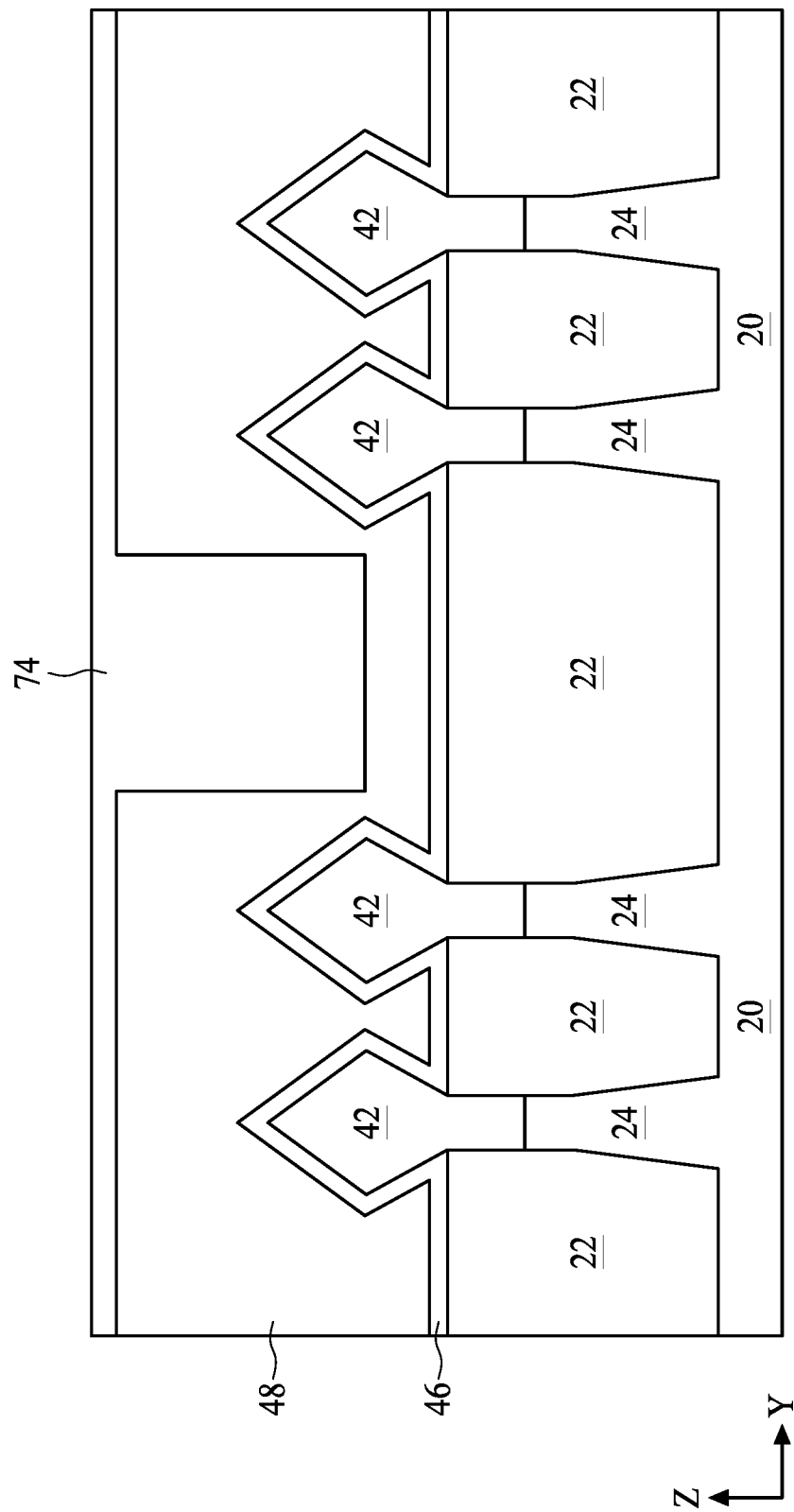

In some embodiments, the gapfill 74 may be formed in a bottom-up fashion, as shown in FIGS. 32A and 32B. In some embodiments, the gapfill 74 includes silicon or tungsten, and certain precursors used in forming the gapfill 74 have a very low sticking coefficient, which can easily reach the bottom of the opening 70 and fill the opening 70 in a bottom-up fashion. For example, the gapfill 74 includes silicon, and silane ($SiH_4$) is used as the precursor to form the silicon. A plasma enhanced process is performed, and the plasma-cracked silane at a process temperature ranging from about 250 degrees Celsius to about 650 degrees Celsius has a sticking coefficient of less than 0.01. With such low sticking coefficient, high step coverage is achieved, and the opening 70 is filled with the gapfill 74 (i.e., silicon) seamlessly and void free. In another example, the gapfill 74 includes tungsten, and tungsten hexafluoride ($WF_6$) and hydrogen gas ($H_2$) are used as the precursors to form the tungsten. A plasma enhanced CVD process is performed, and the plasma-cracked $WF_6$ and $H_2$ at a process temperature ranging from about 250 degrees Celsius to about 650 degrees Celsius has a sticking coefficient of less than 0.01. With such low sticking coefficient, high step coverage is achieved, and the opening 70 is filled with the gapfill 74 (i.e., tungsten) seamlessly and void free. A planarization process may be performed to remove any gapfill 74 formed on the dielectric layer 48.

In some embodiments, the bottom-up gapfill 74 is formed in a low-pressure processing chamber by a low-pressure process. For example, the processing pressure for forming the bottom-up gapfill 74 is less than about 100 mTorr, such as from about 3 mTorr to about 10 mTorr. In some embodiments, the processing pressure ranges from about 1 mTorr to about 100 mTorr. In some embodiments, the low-pressure process is a high-density plasma (HDP) process, and the plasma-cracked precursors have a very high mean free path ranging from about 0.45 cm to about 4.5 cm. With such high mean free path, the precursors can easily reach the bottom of the opening 70 and fill the bottom of the opening 70 in a bottom-up fashion. A planarization process may be performed to remove any gapfill 74 formed on the dielectric layer 48. In some embodiments, the low-pressure processing chamber is an inductively coupled plasma (ICP) HDP chamber.

Figure 33A:
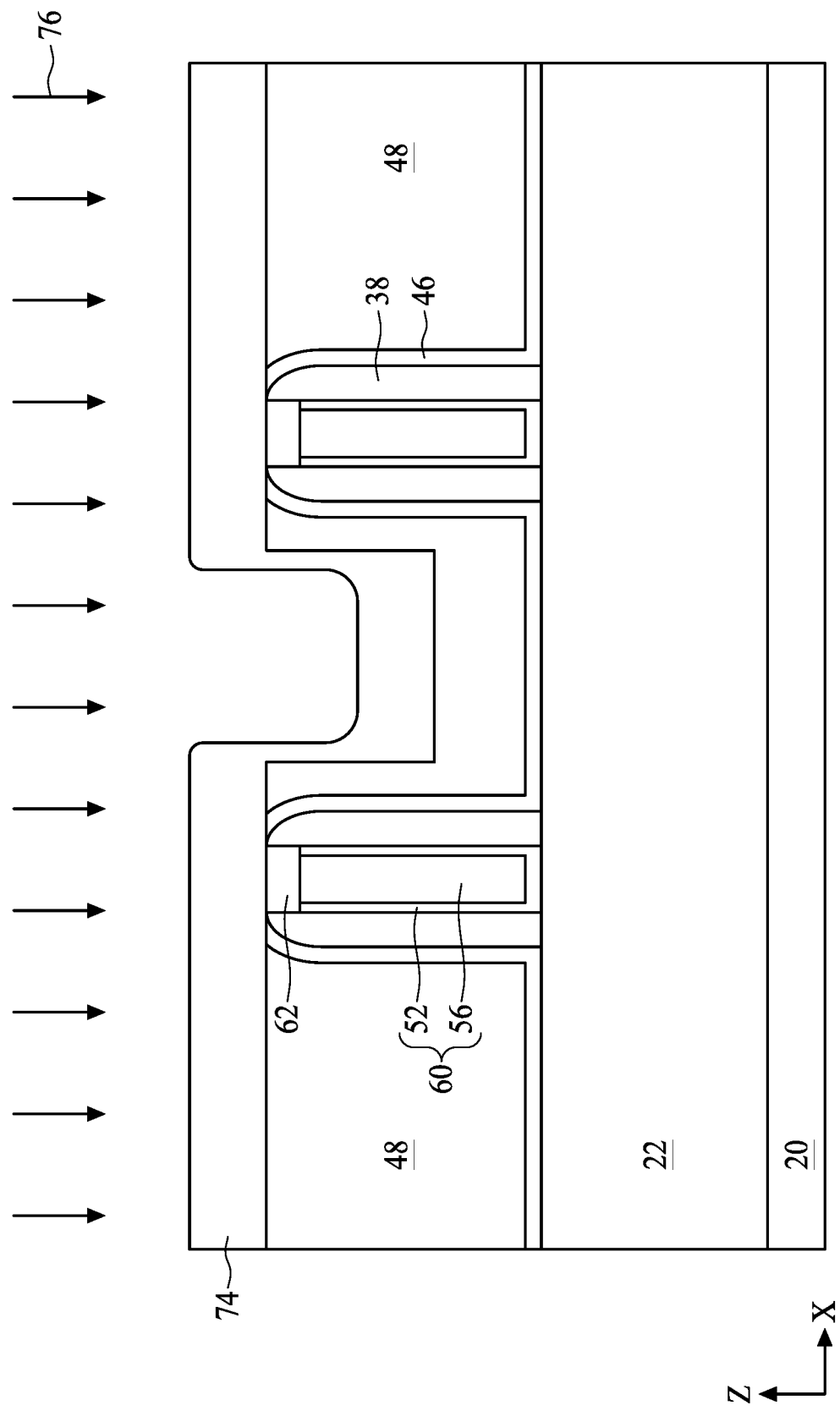
Figure 33B:
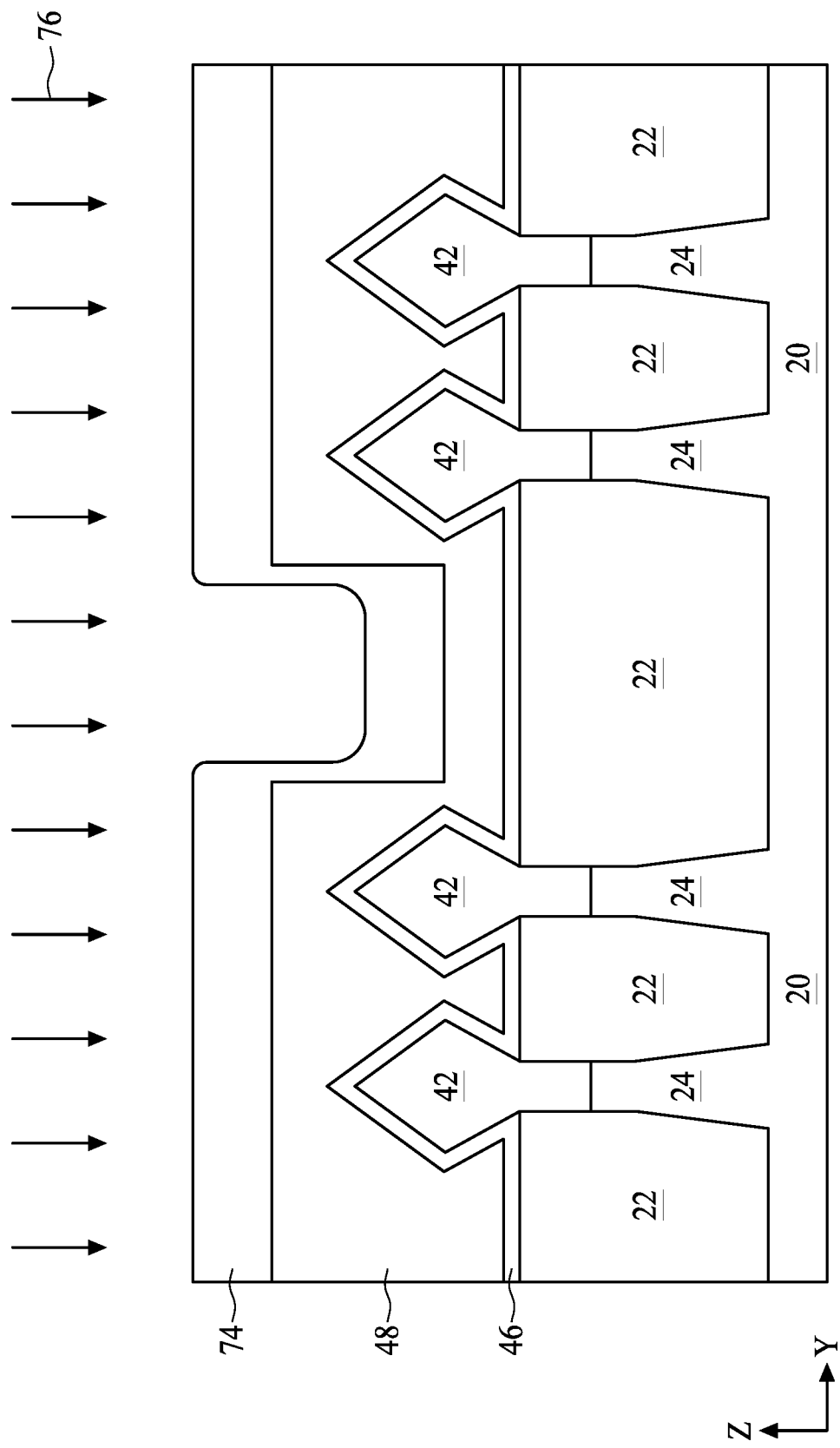

In some embodiments, as shown in FIGS. 33A and 33B, an ion assisted deposition process 76 is performed to form the gapfill 74. For example, in an ion assisted deposition process 76, the ions in the precursors are controlled so the path to the substrate 20 may be substantially perpendicular to the substrate 20. In other words, the deposition angle may be about 90 degrees. The deposition angle may be controlled by applying a bias voltage to the precursors in the processing chamber. As a result of the ion assisted deposition process, the opening 70 is filled with the gapfill 74 in a bottom-up fashion. The gapfill 74 shown in FIGS. 33A and 33B is during the ion-assisted deposition process and at the end of the ion-assisted deposition process. As shown in FIGS. 33A and 33B, majority of the gapfill 74 is formed on horizontal surfaces, such as the bottom of the opening 70 and the top of the dielectric layer 48. Thus, the opening 70 is filled with the gapfill 74 in a bottom-up fashion. After the ion-assisted deposition process, a planarization process is performed to remove the portion of the gapfill 74 formed on the dielectric layer 48.

The various processes for filling the opening 70 with the seamless and void free gapfill 74, such as the deposition and etch cycles, the ion assisted deposition, the low-pressure process, and the use of precursors with low sticking coefficient, may be combined in any fashion to further improve the gap filling properties of the gapfill 74.

Figure 34:
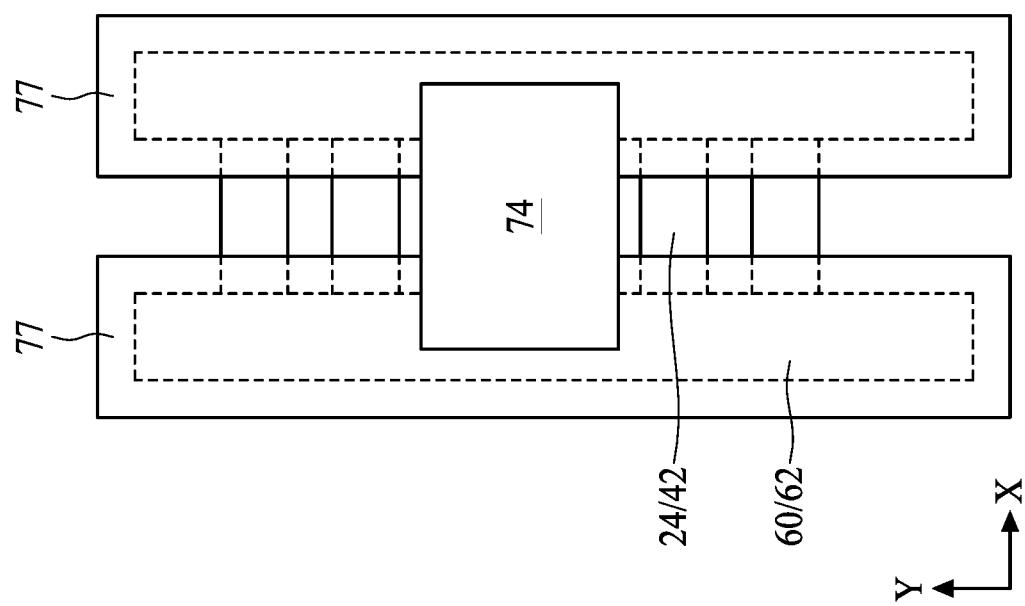
Figure 35:
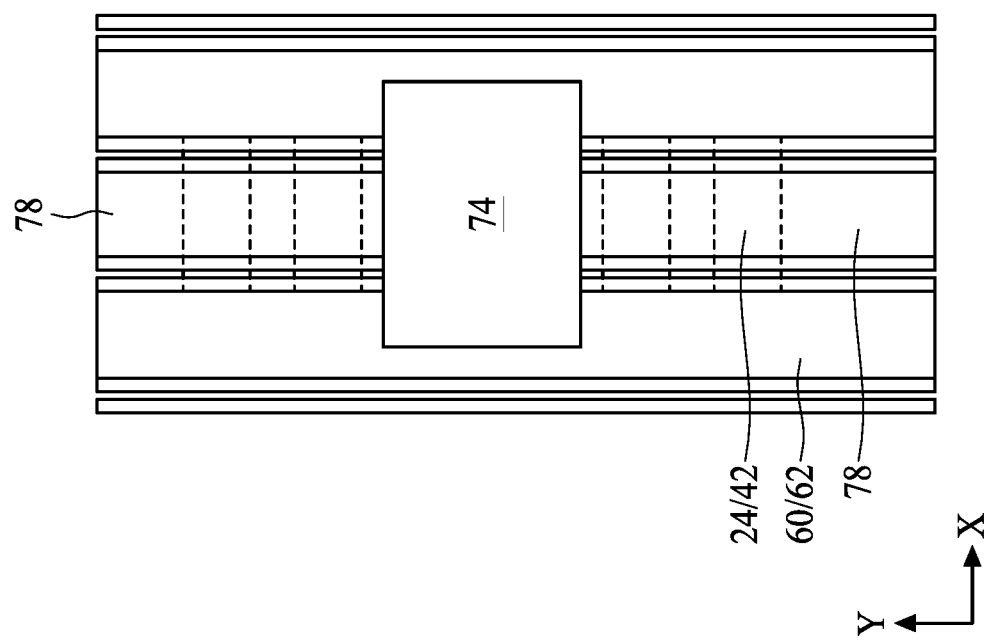
Figure 36:
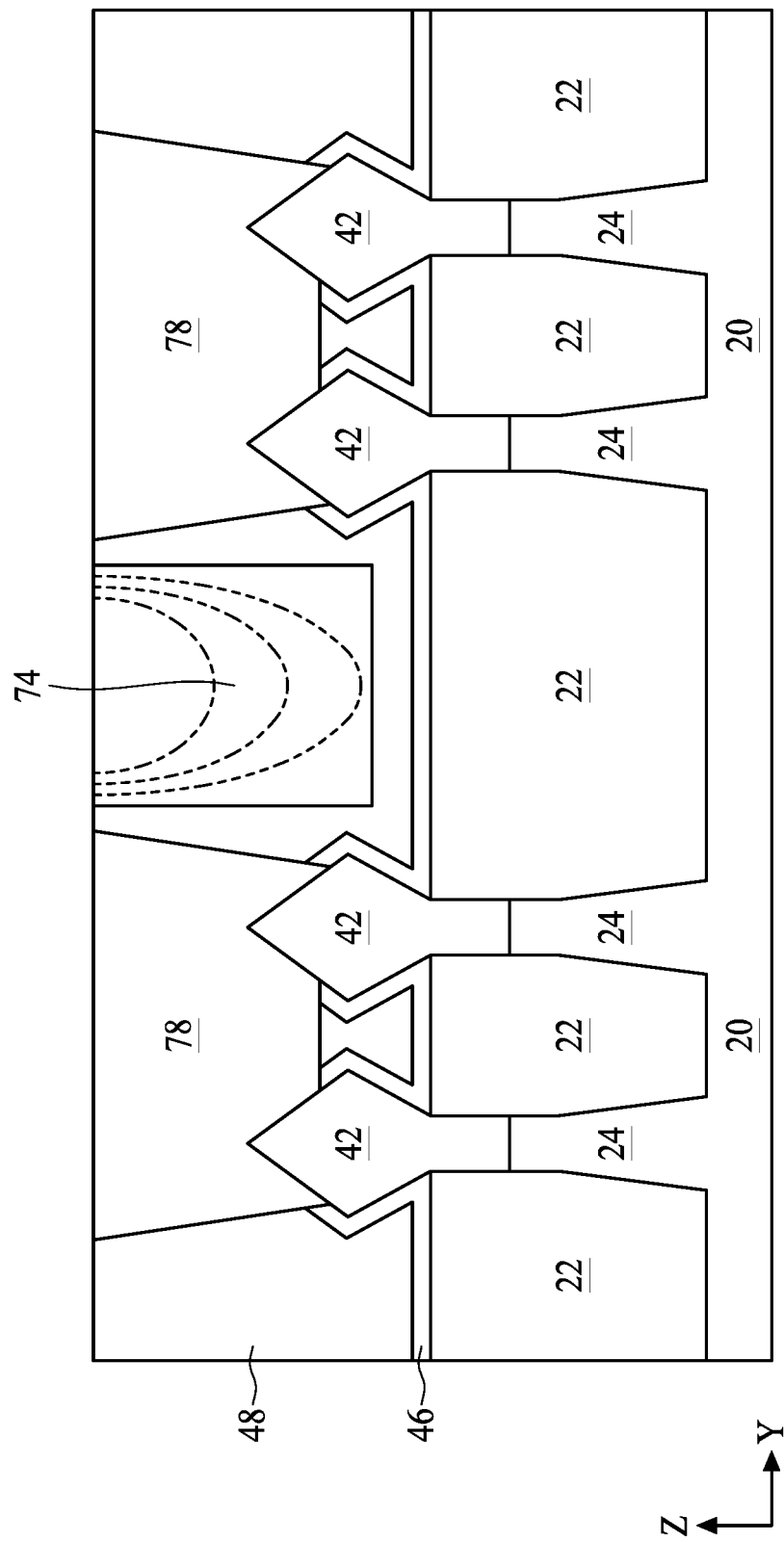

FIG. 34 is a top view of a portion of a layout of FinFETs, in accordance with some embodiments. Various components of the FinFETs, such as the dielectric layer 48, the CESL 46, and the hard mask 62, may be omitted for clarity. As shown in FIG. 34, in some embodiments, after the formation of the gapfill 74, masks 77 are formed over the gate stacks 60, and a portion of the dielectric layer 48 formed over the epitaxial source/drain regions 42 and the gapfill 74 are exposed. In some embodiments, the gapfill 74 may be located above the gate stacks 60 and may be partially overlap with the gate stacks 60 along the z-axis for wider process window, as shown in FIG. 34. Next, as shown in FIGS. 35 and 36, a selective etch process is performed to remove the exposed portion of the dielectric layer 48 to expose the epitaxial source/drain regions 42, and conductive features 78 are formed over the source/drain regions 42. The conductive features 78 may be conductive contacts for the epitaxial source/drain regions 42. The selective etch process does not substantially or minor affect the gapfill 74 and the masks 77. The masks 77 may be removed after the formation of the conductive features 78. The conductive features 78 include an electrically conductive material, such as copper, a copper alloy, silver, gold, tungsten, cobalt, aluminum, nickel, or the like. In some embodiments, a liner (not shown) and/or a barrier (not shown) layer may be formed first, and the electrically conductive material is formed on the liner and/or the barrier. A silicide layer (not shown) may be formed between each epitaxial source/drain region 42 and the conductive feature 78. In some embodiments, each epitaxial source/drain region 42 has a distinct conductive feature 78 formed thereover. In some embodiments, a conductive feature 78 is formed over two or more epitaxial source/drain regions 42. A planarization process, such as a CMP, may be performed to remove excess material from the top surface of the dielectric layer 48.

Figure 37:
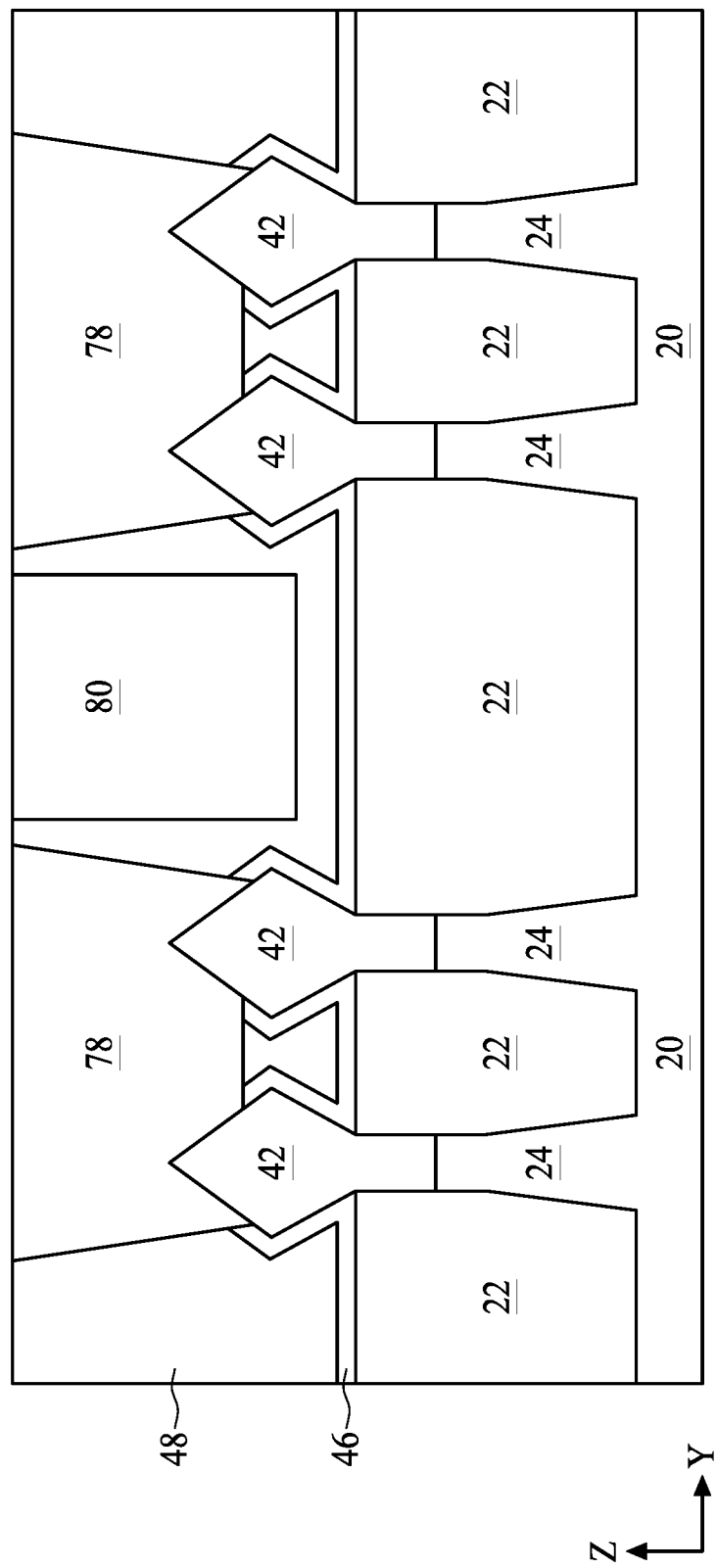

In some embodiments, the gapfill 74 includes a dielectric material, such as SiN, SiCN, SiCO, or other suitable dielectric material. Subsequent processes may be performed, such as forming a dielectric layer on the dielectric layer 48, the conductive features 78, and the gapfill 74, and forming conductive features in the dielectric layer to electrically connect to the conductive features 78 and the gate stacks 60. In some embodiments, the gapfill 74 includes Si or W, and the gapfill 74 is removed and replaced with a dielectric fill 80, as shown in FIG. 37.

In some embodiments, the gapfill 74 includes Si or W due to the low sticking coefficient of the precursors for forming Si or W and is ultimately replaced with a dielectric material. For example, after the formation of the conductive features 78, the gapfill 74 is removed by a selective etch process. In the embodiment where the hard masks 62 include the same material as the gapfill 74, the hard masks 62 are also removed by the selective etch process. The opening 70 reappears as the result of the removal of the gapfill 74, and the dielectric fill 80 is formed in the opening 70. The dielectric fill 80 may be also formed on the dielectric layer 48 and the conductive features 78, and a planarization process, such as a CMP process, may be performed to remove the portions of the dielectric fill 80 formed on the dielectric layer 48 and the conductive features 78. The dielectric fill 80 may also replace the hard masks 62 in some embodiments. The dielectric fill 80 includes a dielectric material, such as an oxide, for example silicon oxide or low-k material. In some embodiments, the dielectric fill 80 includes the same material as the dielectric layer 48. As described above, the gapfill 74 may be formed in the dielectric layer 48, through the dielectric layer 48, or through the dielectric layer 48 and the CESL 46. Thus, the dielectric fill 80 may be also formed in the dielectric layer 48, through the dielectric layer 48, or through the dielectric layer 48 and the CESL 46.

Figure 38A:
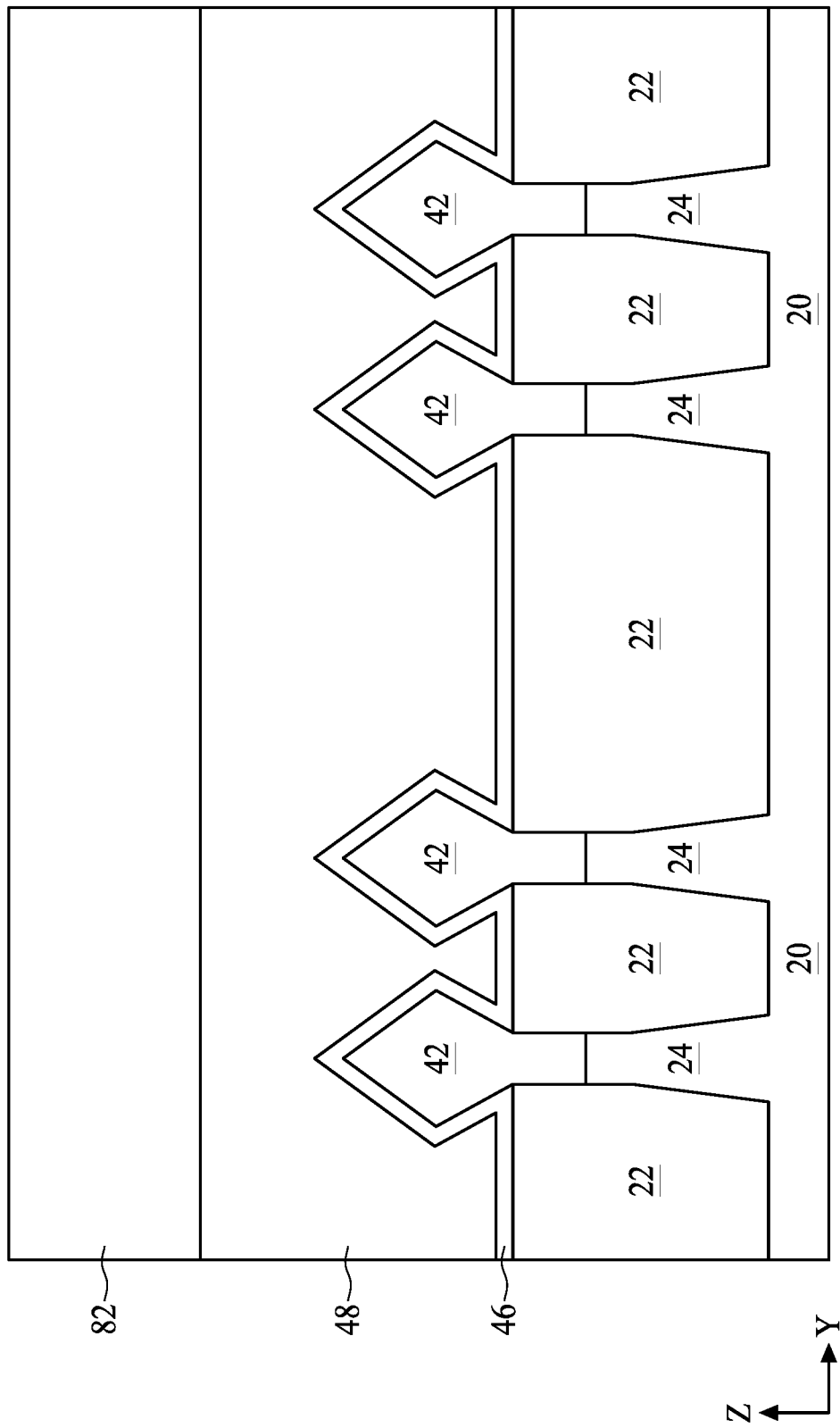
FIGS. 38A through 38G illustrate various views of intermediate stages in the manufacturing of the semiconductor device structure, in accordance with alternative embodiments.

FIGS. 38A through 38G illustrate various views of intermediate stages in the manufacturing of the semiconductor device structure 10, in accordance with alternative embodiments. With reference to FIG. 1 for the cross-sections defined by the lines A-A, B-B, C-C, and D-D, FIGS. 38A through 38G illustrate a cross-section along the line C-C. As shown in FIG. 38A, after the formation of the gate stacks 60, a dielectric layer 82 is formed on the dielectric layer 48. The dielectric layer 82 may be a second ILD. The dielectric layer 82 may include the same material as the dielectric layer 48.

Figure 38B:
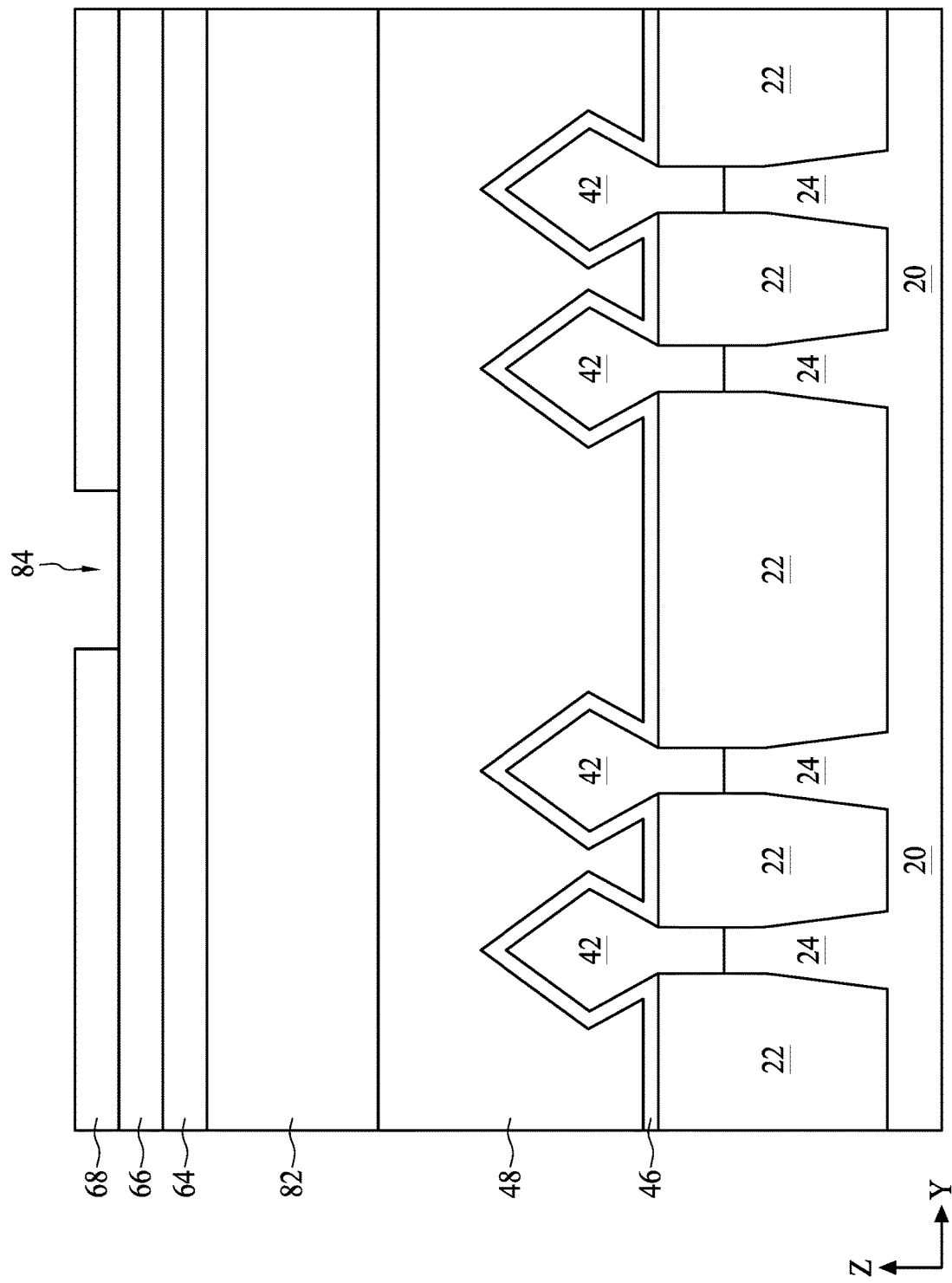
Figure 38C:
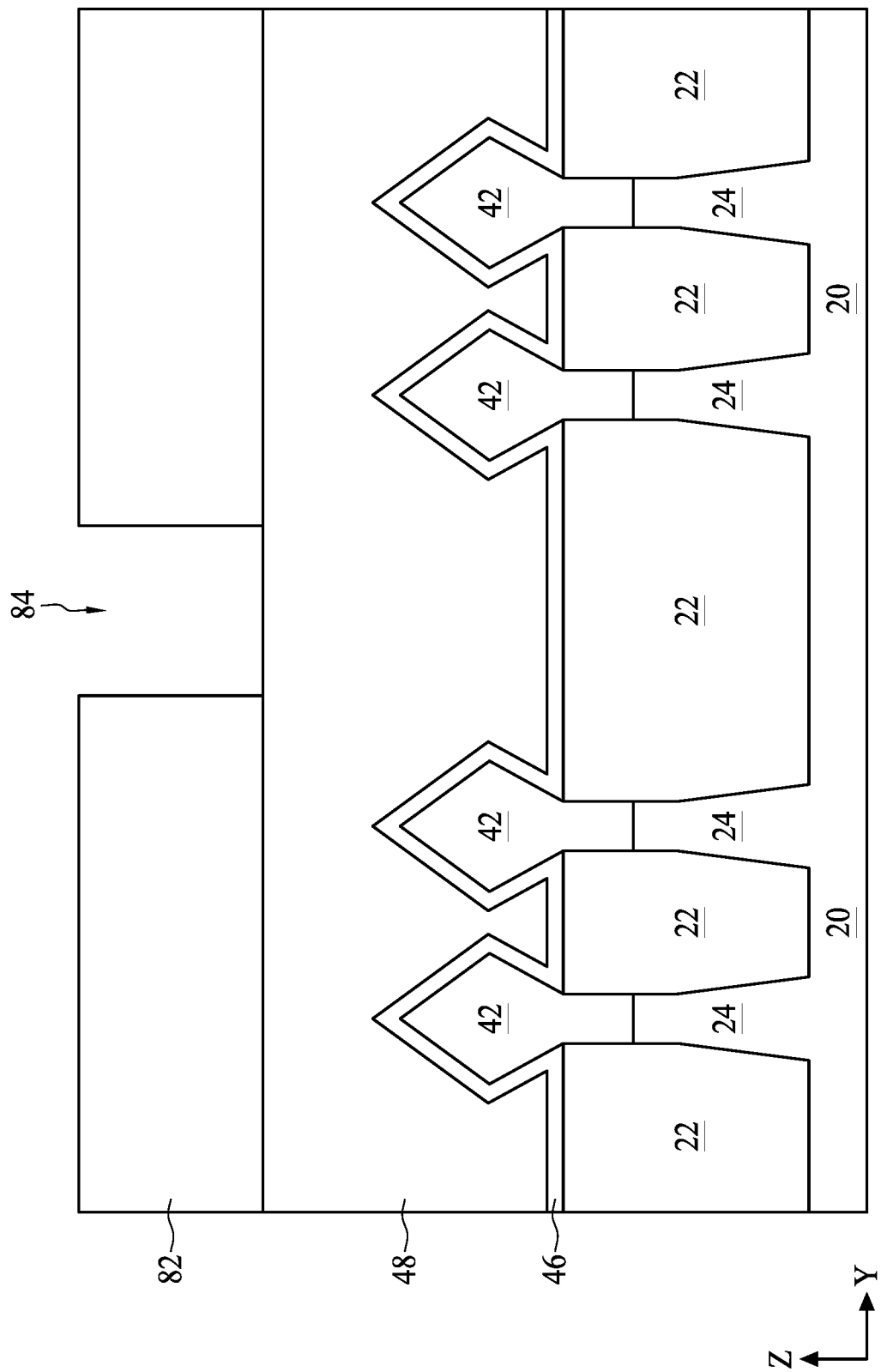

FIG. 38B illustrates the formation of the bottom layer 64, the middle layer 66, and the upper layer 68 on the dielectric layer 82. An opening 84 is formed in the upper layer 68. As shown in FIG. 38C, the opening 84 is extended into the dielectric layer 82. In some embodiments, as shown in FIG. 38C, the opening 84 extends through the dielectric layer 82 and exposes the dielectric layer 48.

Figure 38D:
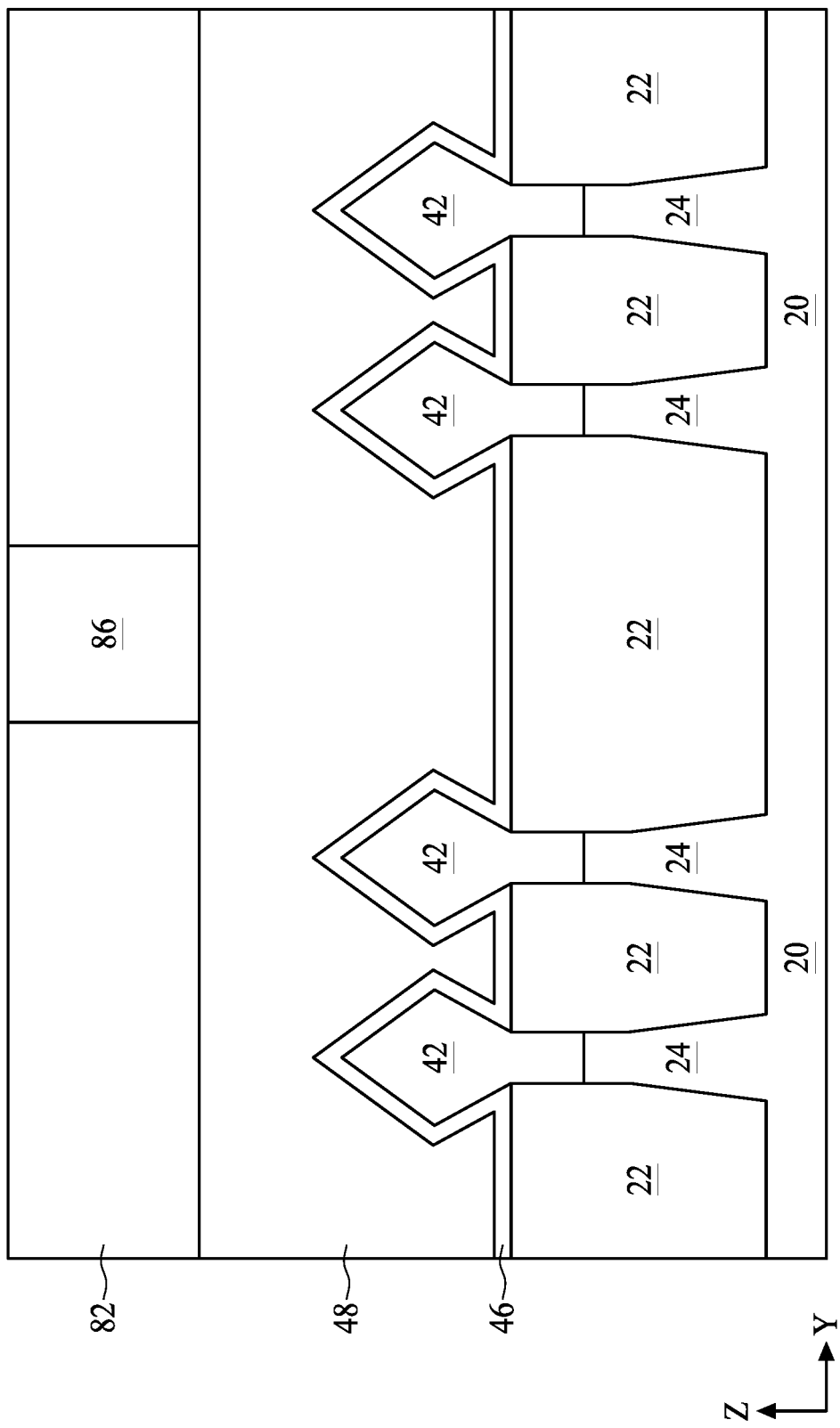

A gapfill 86 is formed in the opening 84, as shown in FIG. 38D. The gapfill 86 may include the same material as the gapfill 74 and may be formed by the same process as the gapfill 74. The gapfill 86 includes a material having different etch selectivity than the material of the dielectric layers 48, 82. In some embodiments, the gapfill 86 includes Si, W, SiN, SiCN, SiCO or any suitable material. In some embodiments, the gapfill 86 includes Si or W.

Figure 38E:
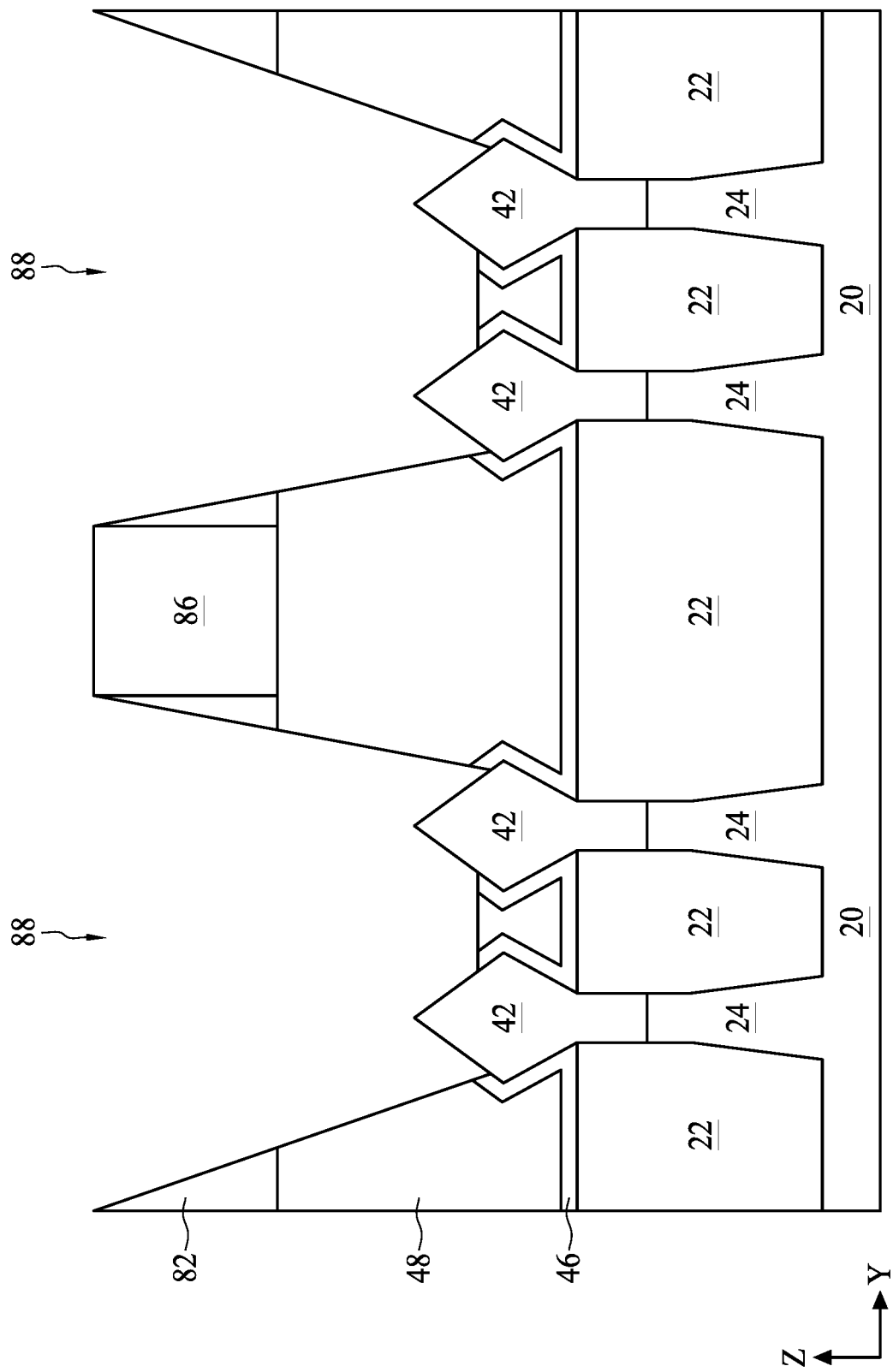

Next, masks, such as the masks 77 shown in FIG. 34, may be formed on the dielectric layer 82 over the gate stacks 60, and the gapfill 86 and portions of the dielectric layer 82 are exposed. As shown in FIG. 38E, the exposed portions of the dielectric layer 82 and the portions of the dielectric layer 48 disposed thereunder are removed to form openings 88. The epitaxial source/drain regions 42 are exposed in the openings 88. The removal of the portions of the dielectric layers 82, 48 may be performed by a selective etch process that does not substantially affect the gapfill 86 and the masks. The masks may be removed after forming the openings 88. With the gapfill 86 having different etch selectivity than the dielectric layers 82, 48, the patterning of the masks to form the openings 88 becomes easier.

Figure 38F:
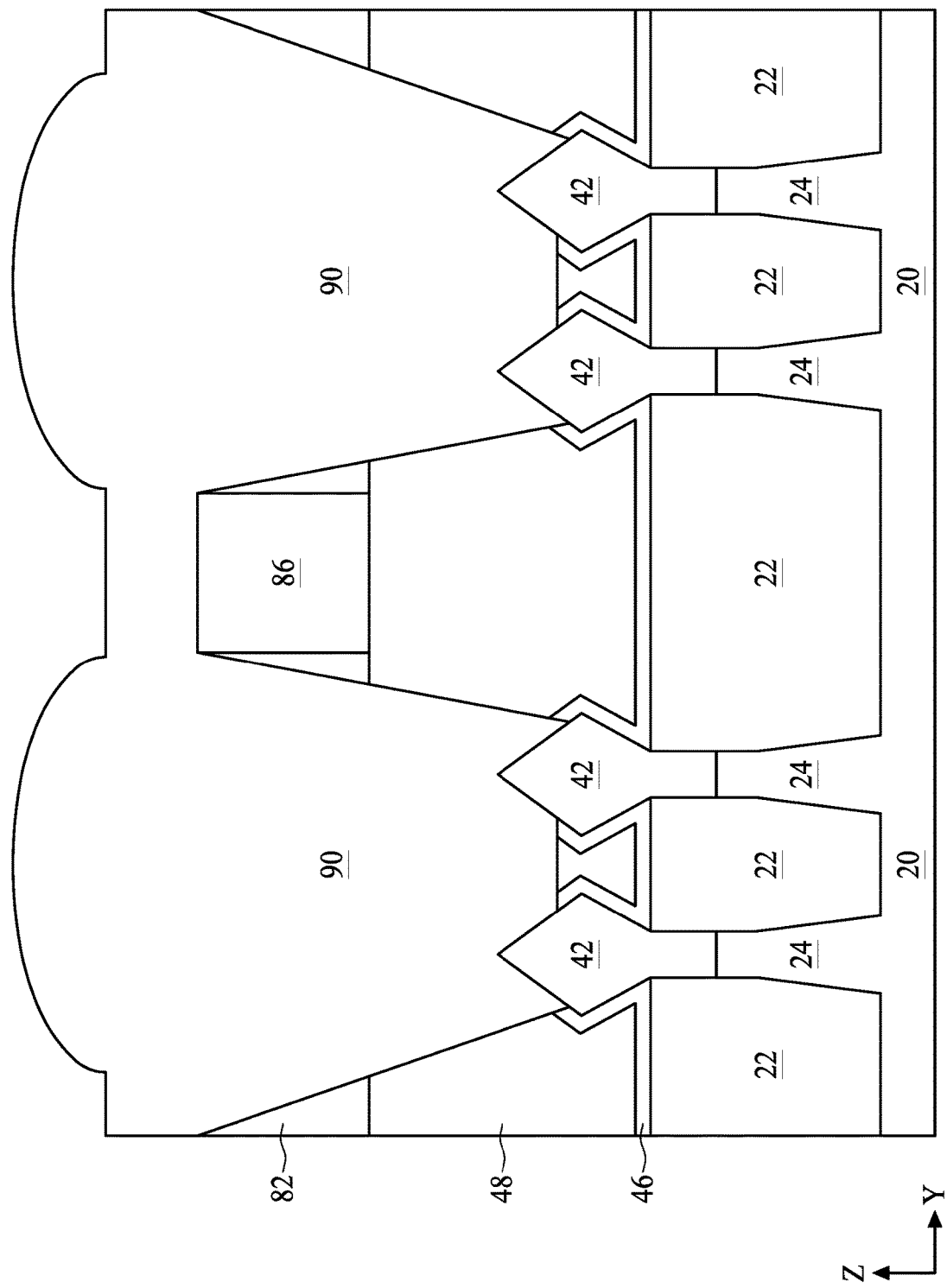
Figure 38G:
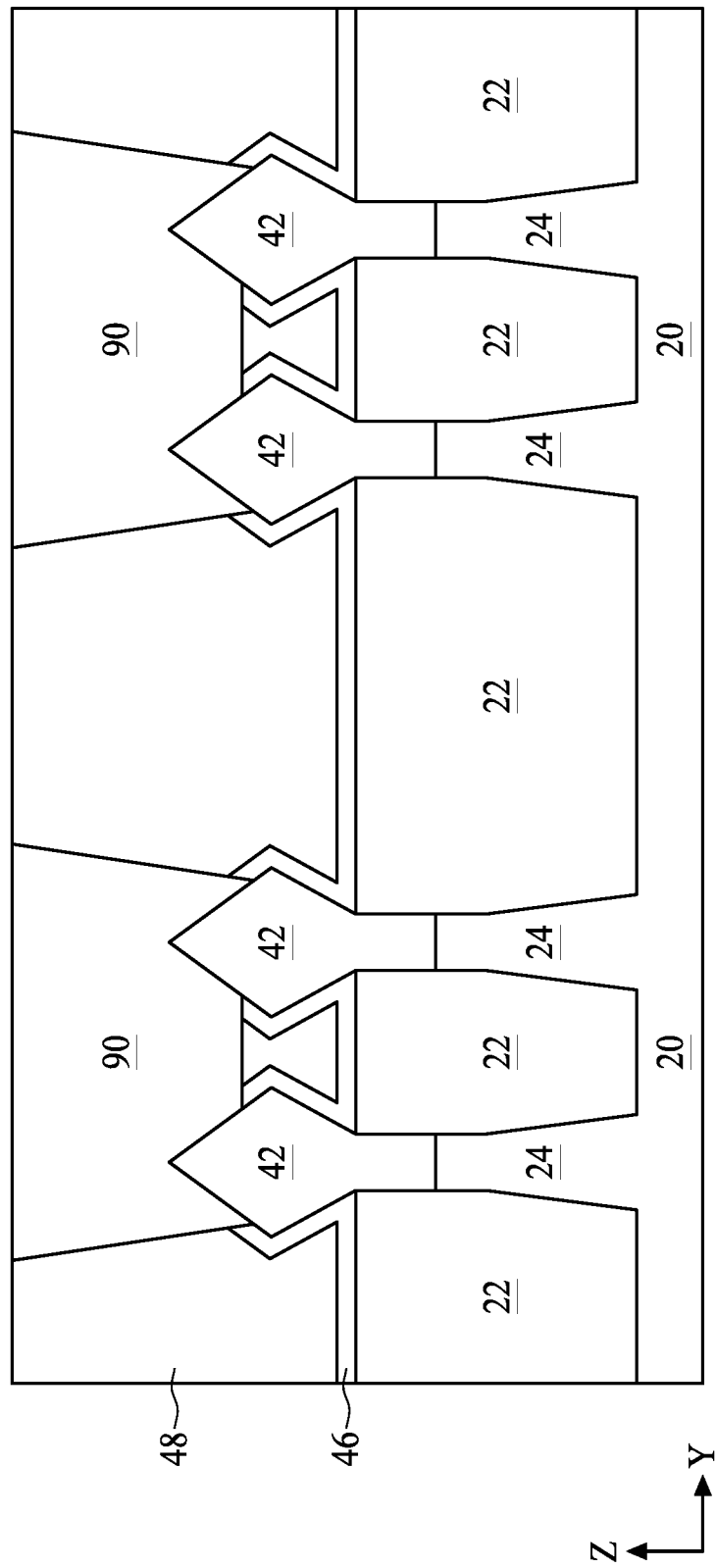

As shown in FIG. 38F, conductive features 90 are formed in the openings 88 and on the gapfill 86. The conductive features 90 may be conductive contacts for the epitaxial source/drain regions 42. The conductive features 90 may include the same material as the conductive features 78 shown in FIG. 37. In some embodiments, a liner (not shown) and/or a barrier (not shown) layer may be formed first, and the electrically conductive material of the conductive features 90 is formed on the liner and/or the barrier. A silicide layer (not shown) may be formed between each epitaxial source/drain region 42 and the conductive feature 90. Next, as shown in FIG. 38G, a planarization process, such as a CMP process, is performed to remove the dielectric layer 82, the gapfill 86, and portions of the conductive features 90 formed on the gapfill 86 and in the dielectric layer 82. As a result, the top surfaces of the conductive features 90 are substantially coplanar with the top surface of the dielectric layer 48.

Figure 39A:
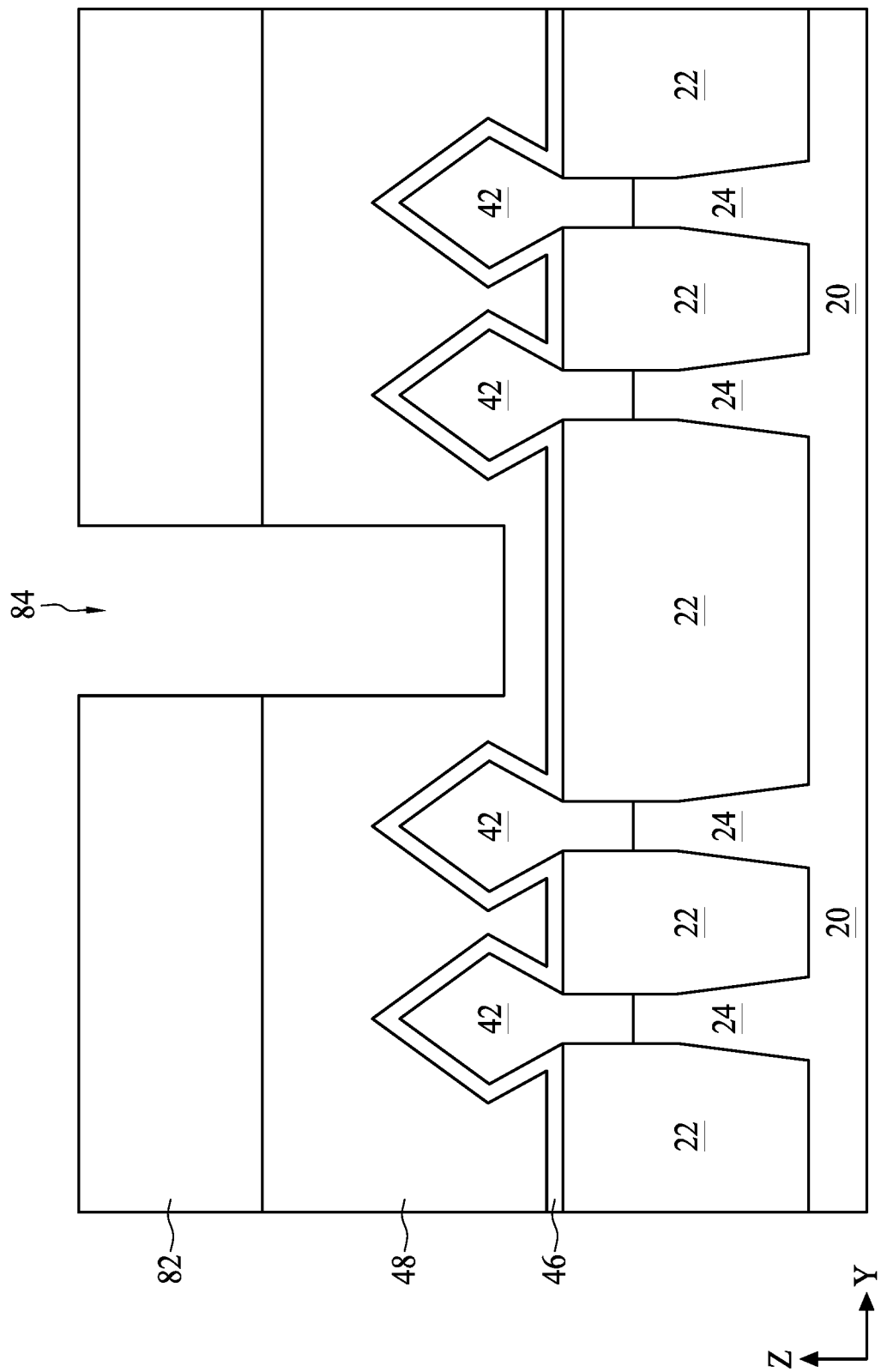
FIGS. 39A through 44B illustrate various views of intermediate stages in the manufacturing of the semiconductor device structure, in accordance with alternative embodiments.
Figure 39B:
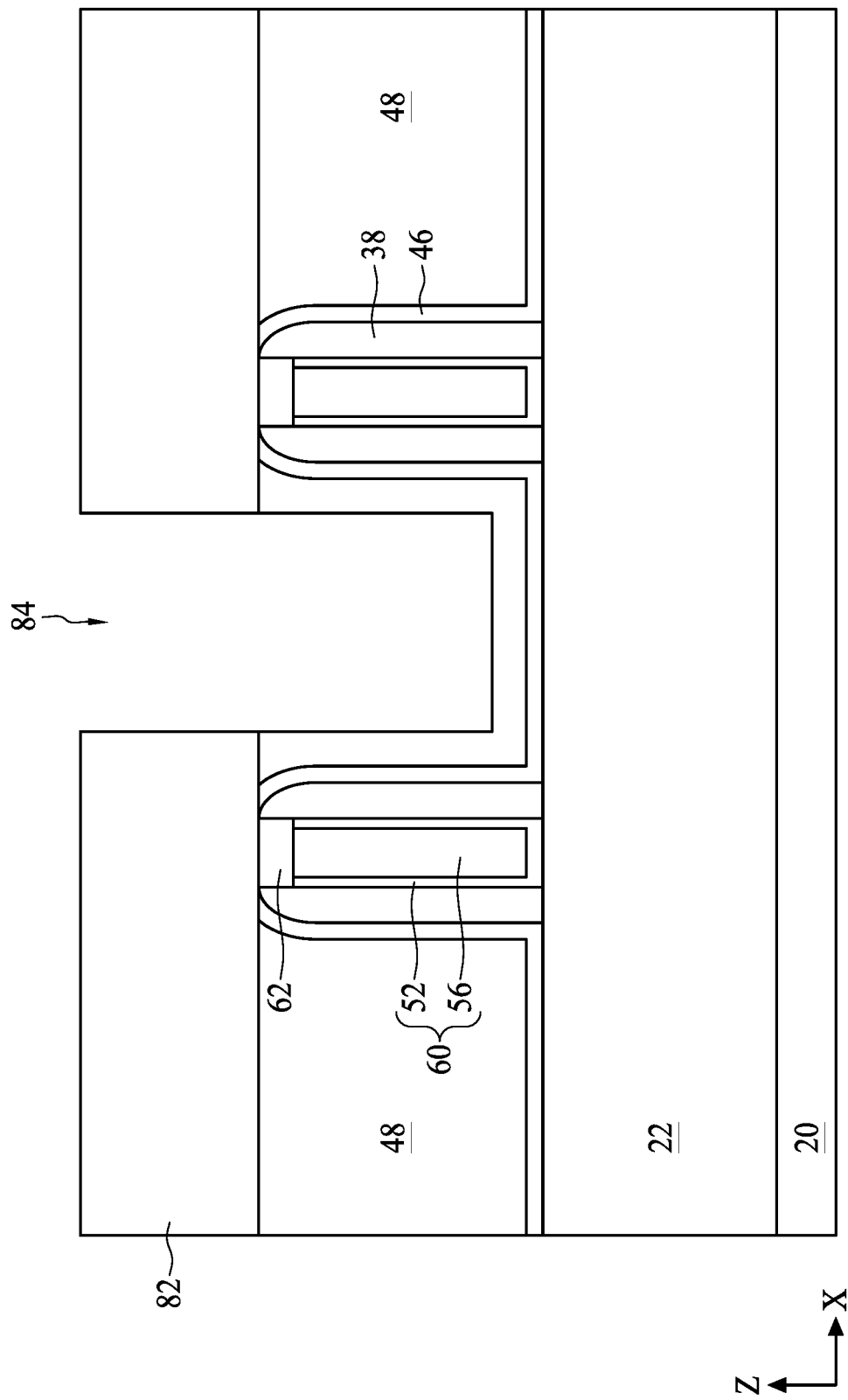
Figure 40A:
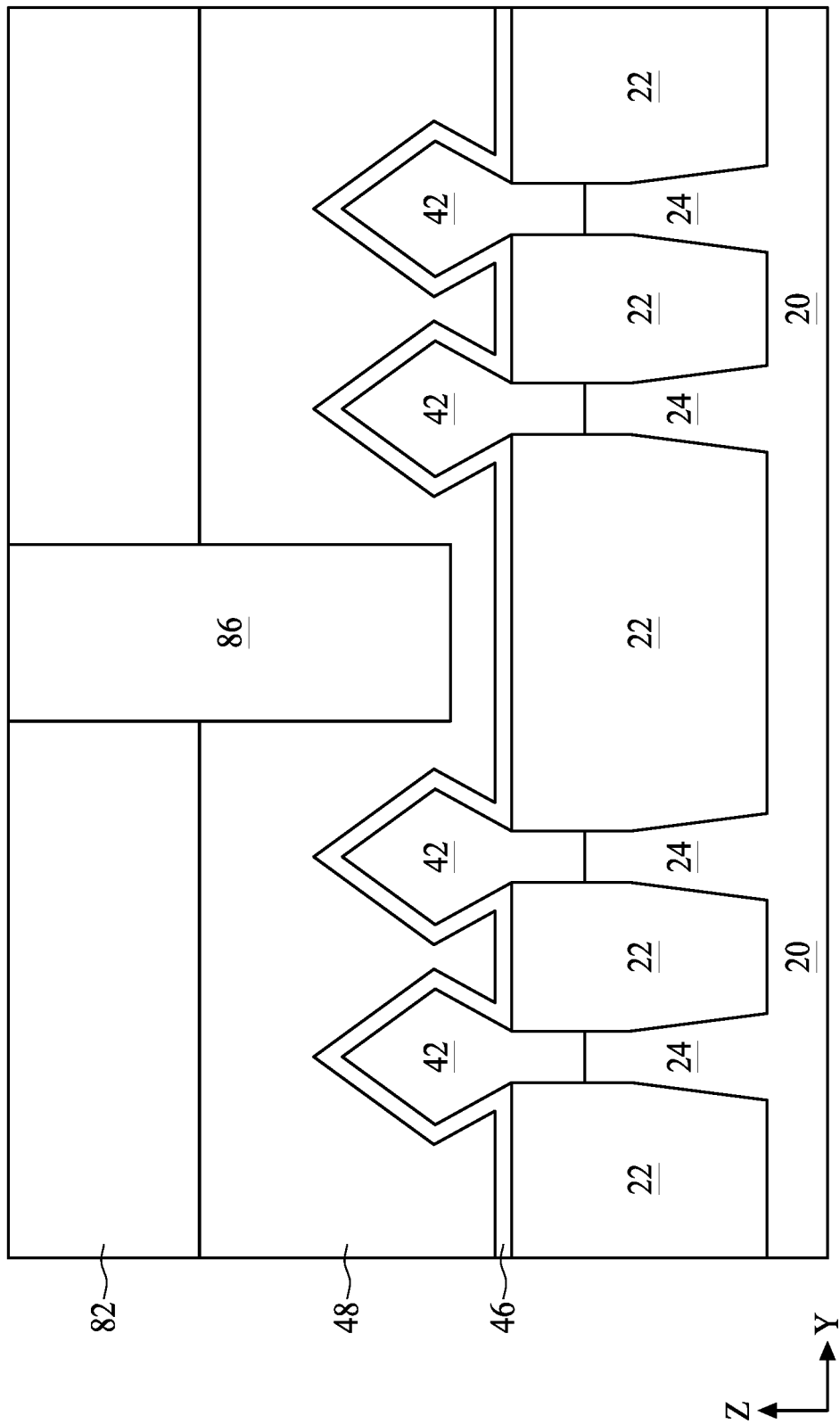
Figure 40B:
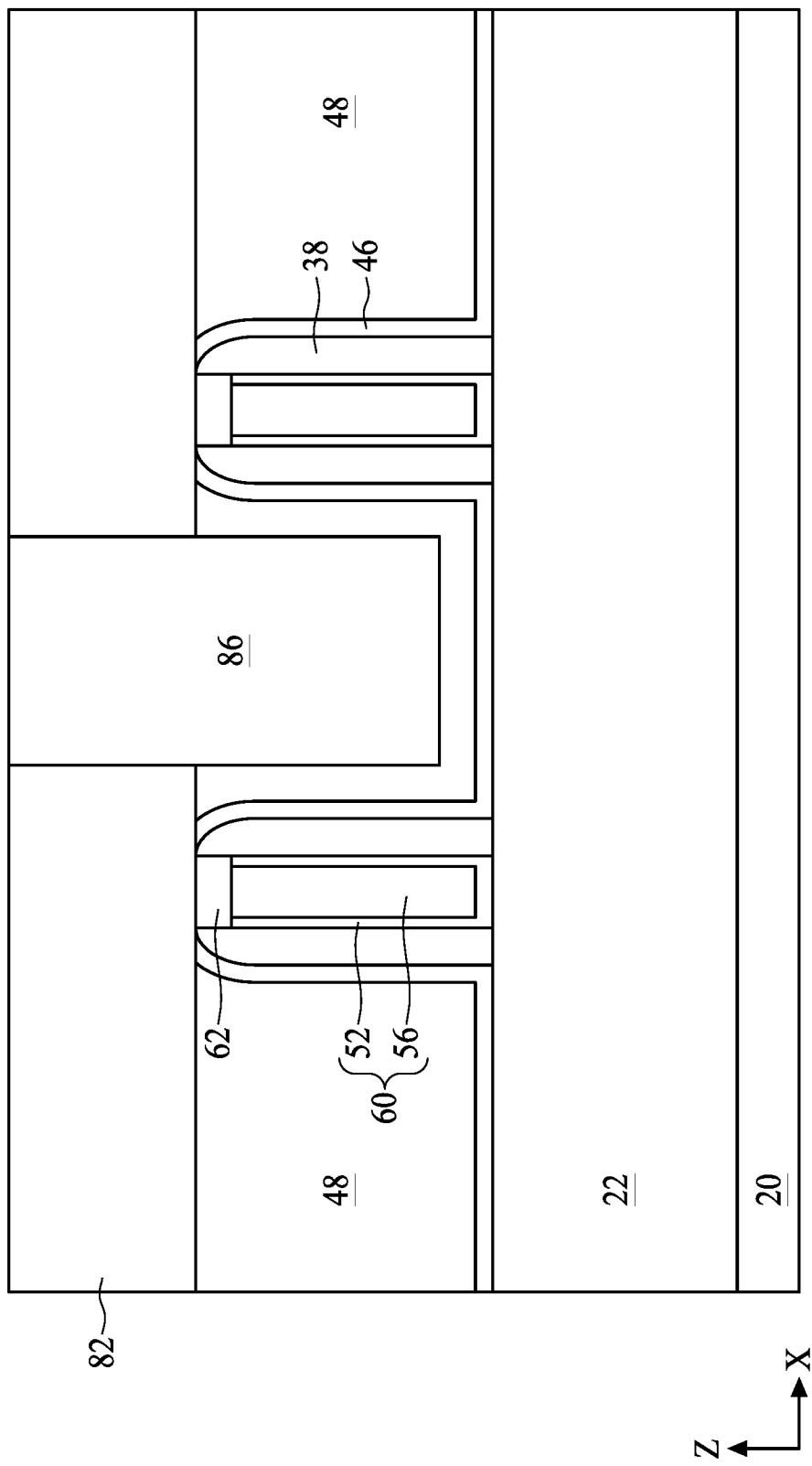
Figure 41A:
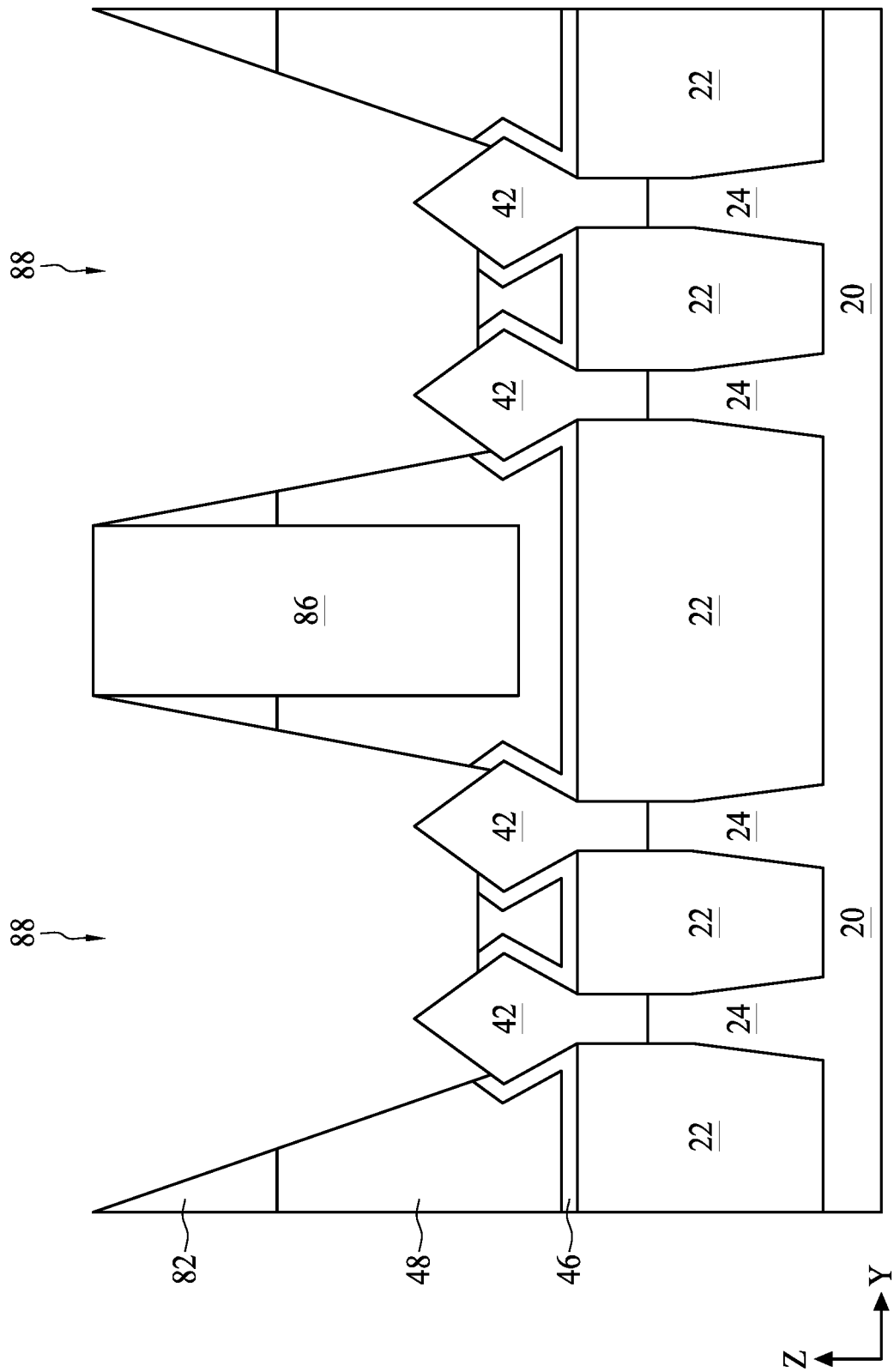
Figure 41B:
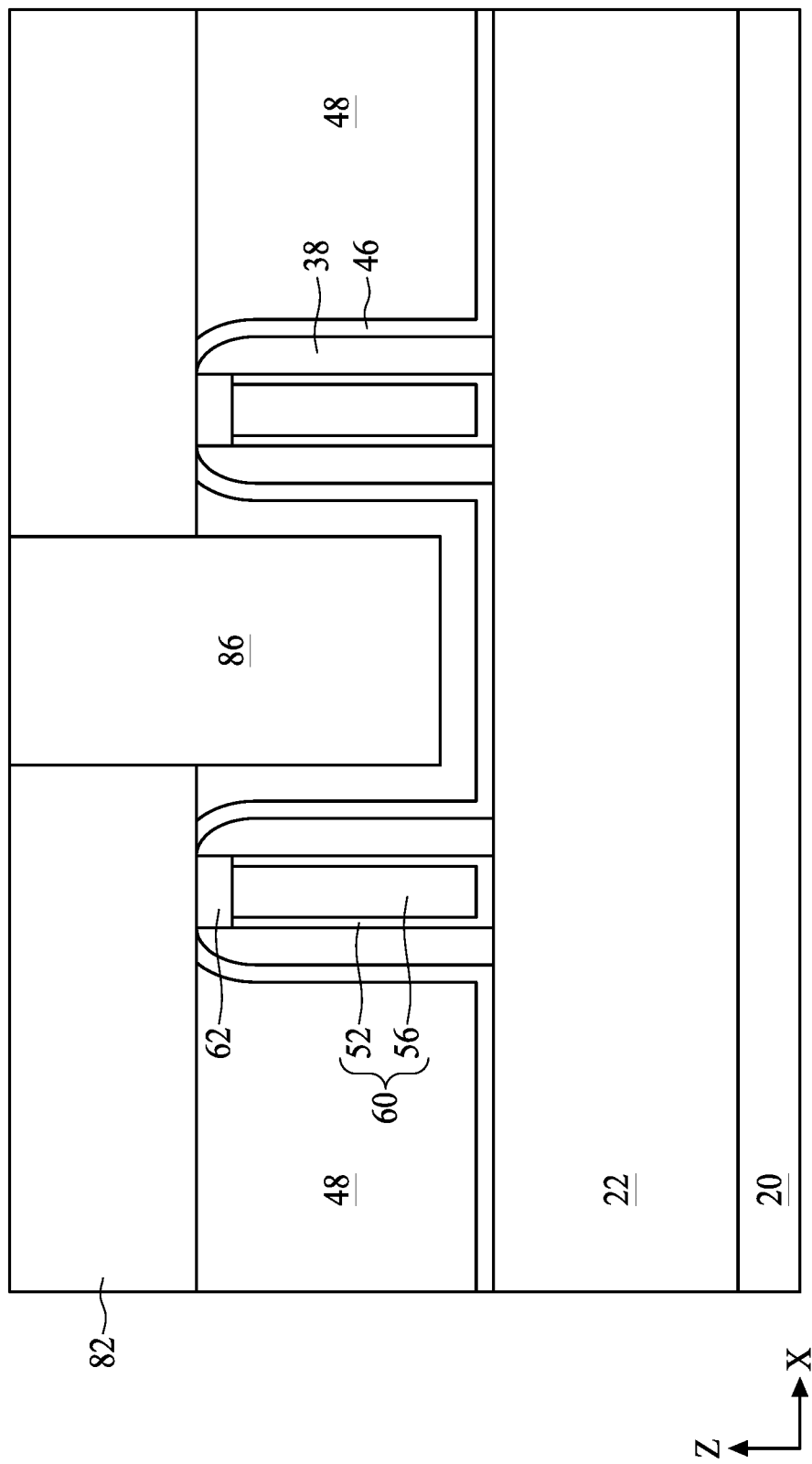

FIGS. 39A through 44B illustrate various views of intermediate stages in the manufacturing of the semiconductor device structure, in accordance with alternative embodiments. With reference to FIG. 1 for the cross-sections defined by the lines A-A, B-B, C-C, and D-D, FIGS. 39A through 44A illustrate a cross-section along the line C-C, and FIG. 39B through 44B illustrate a cross-section along the line B-B. As shown in FIGS. 39A and 39B, the opening 84 is formed in the dielectric layer 82. In some embodiments, the opening 84 is also formed in the dielectric layer 48, such as between adjacent gate stacks 60 and between adjacent epitaxial source/drain regions 42. As shown in FIGS. 40A and 40B, the gapfill 86 is formed in the opening 84. Next, masks, such as the masks 77 shown in FIG. 34, may be formed on the dielectric layer 82 over the gate stacks 60, and the gapfill 86 and portions of the dielectric layer 82 are exposed. As shown in FIGS. 41A and 41B, the exposed portions of the dielectric layer 82 and the portions of the dielectric layer 48 disposed thereunder are removed to form openings 88. The epitaxial source/drain regions 42 are exposed in the openings 88. The removal of the portions of the dielectric layers 82, 48 may be performed by a selective etch process that does not substantially affect the gapfill 86 and the masks. The masks may be removed after forming the openings 88. With the gapfill 86 having different etch selectivity than the dielectric layers 82, 48, the patterning of the masks to form the openings 88 becomes easier.

Figure 42A:
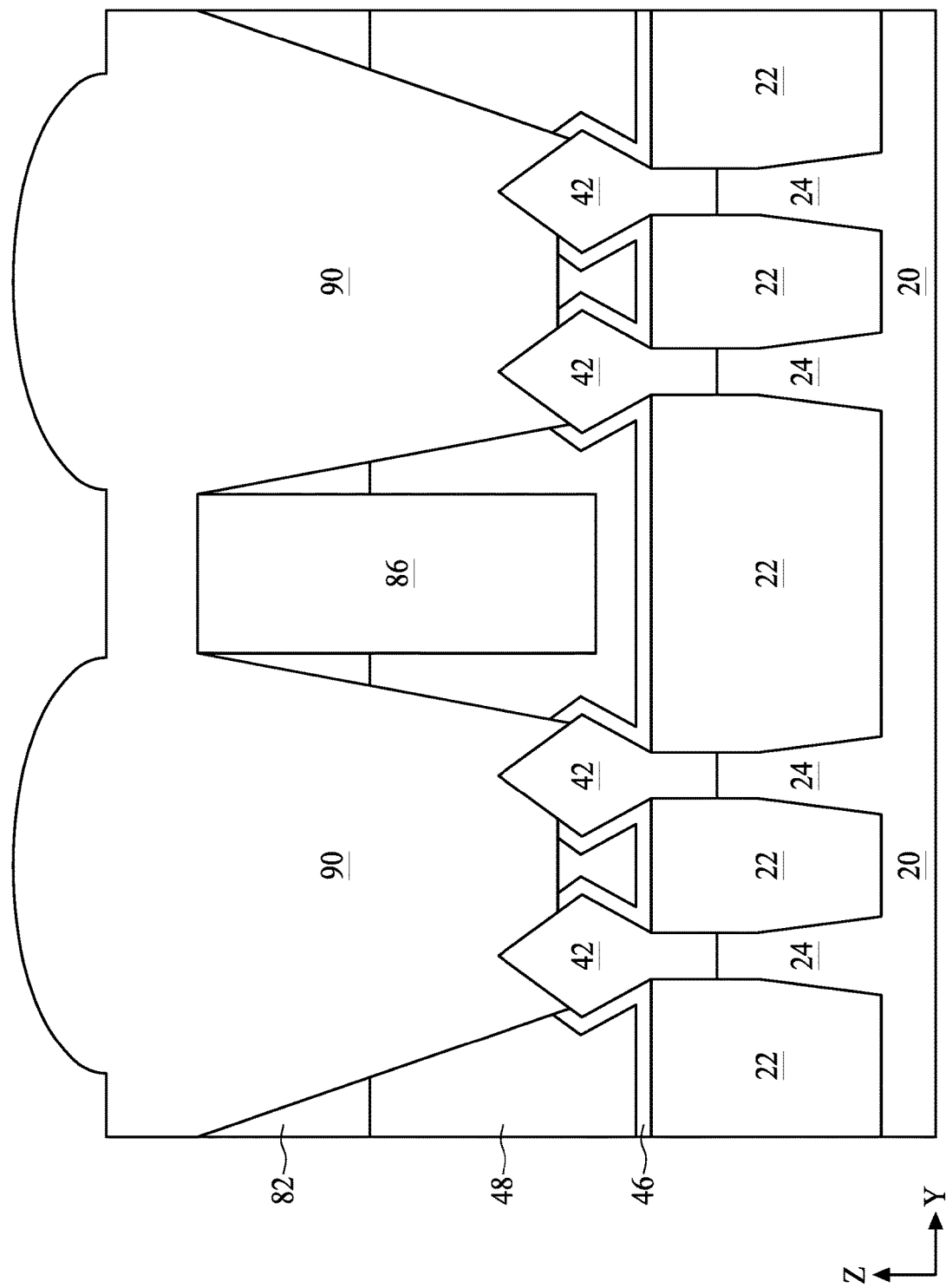
Figure 42B:
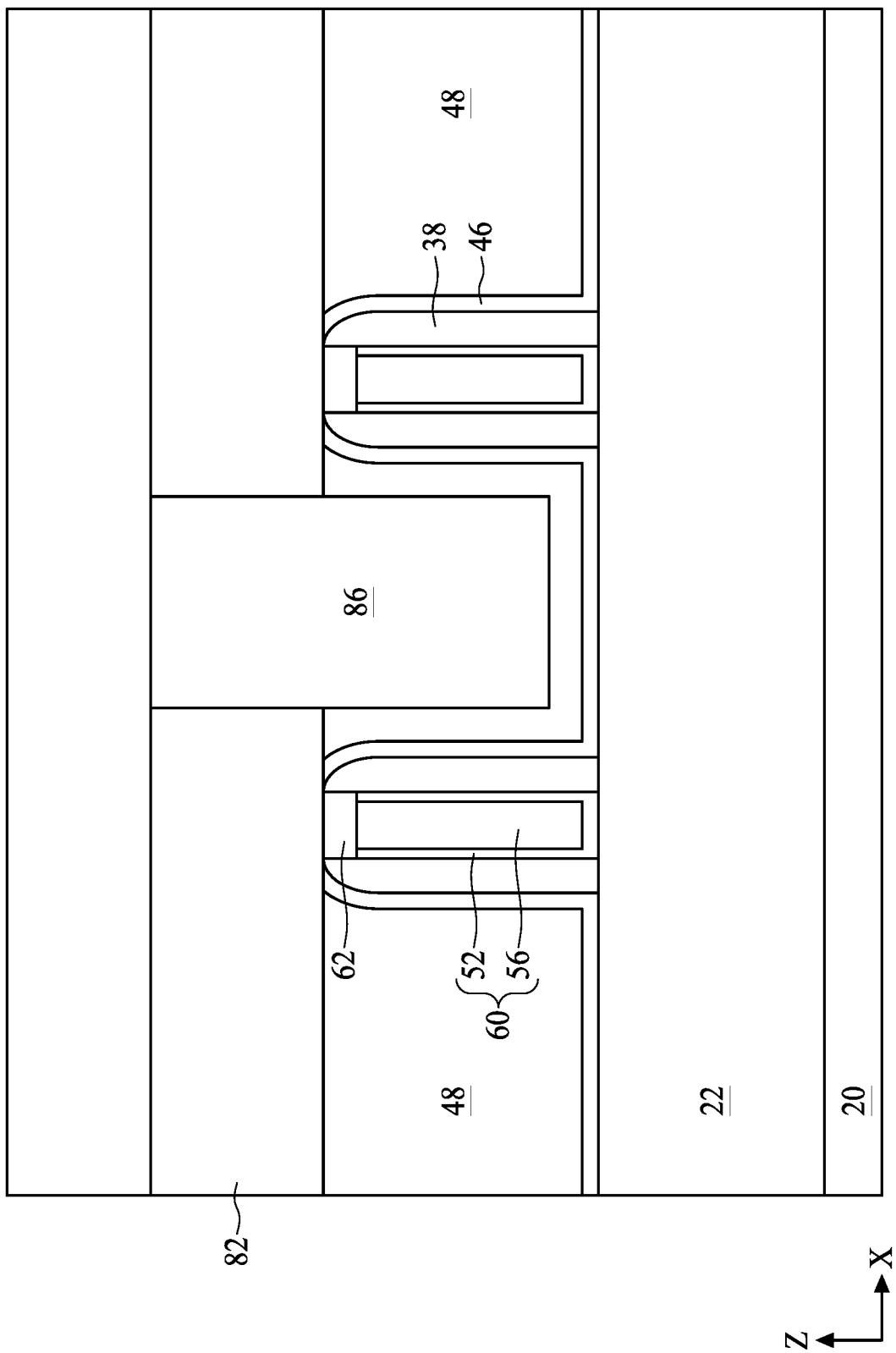
Figure 43A:
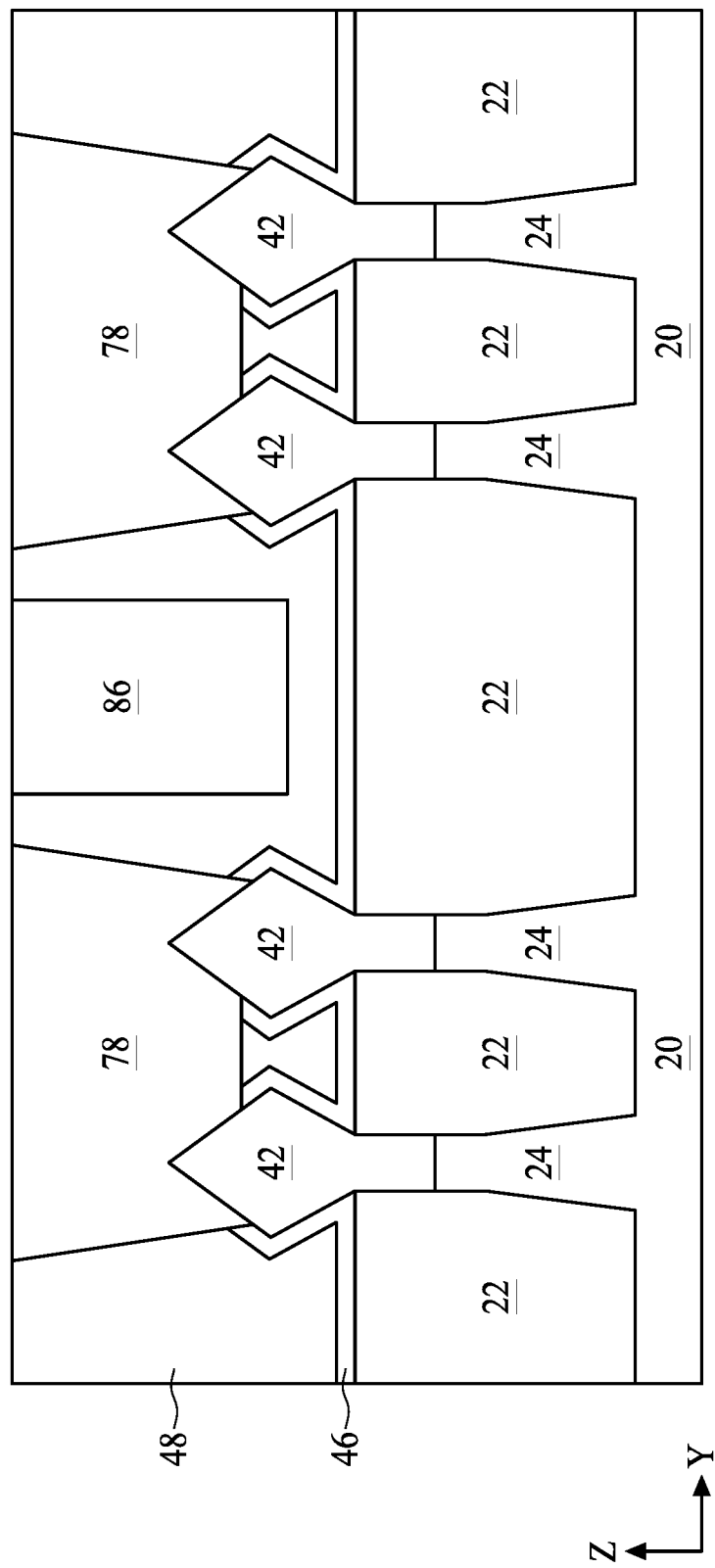
Figure 43B:
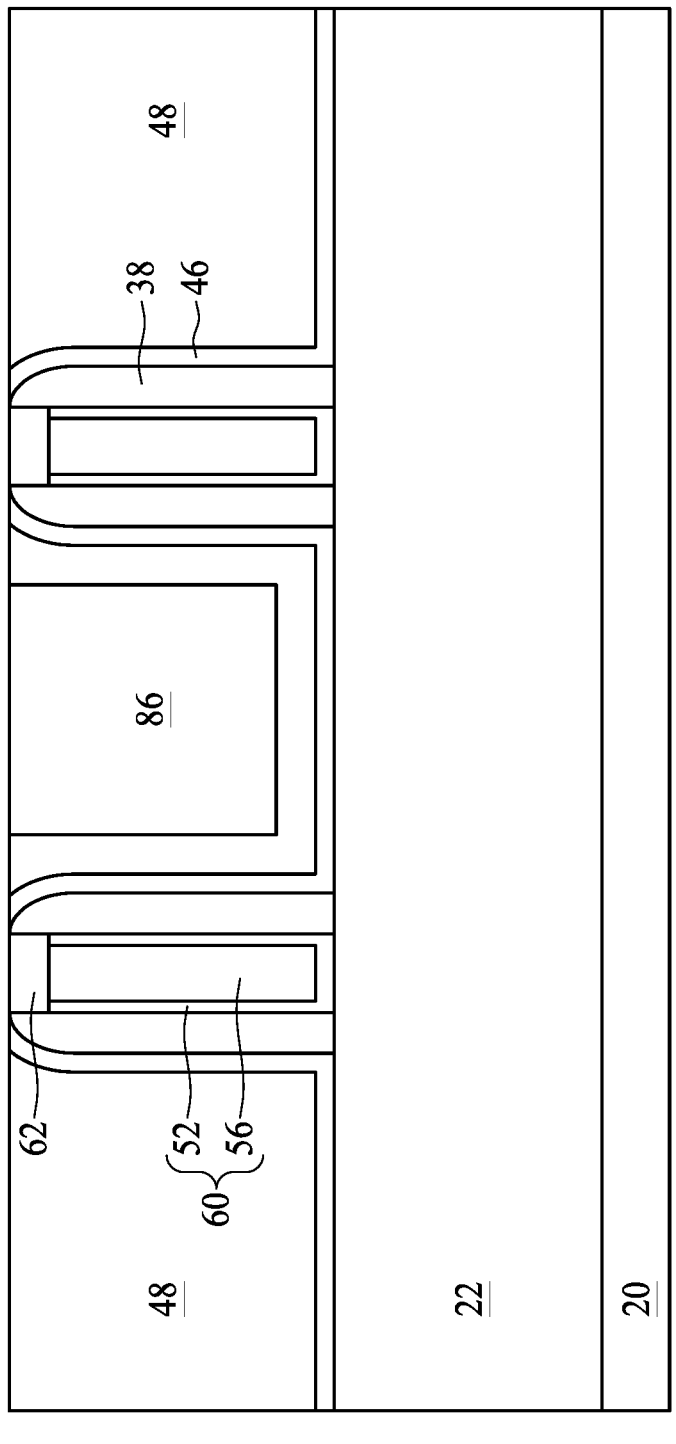

As shown in FIGS. 42A and 42B, the conductive features 90 are formed in the openings 88, on the gapfill 86, and on the dielectric layer 82. In some embodiments, a liner (not shown) and/or a barrier (not shown) layer may be formed first, and the electrically conductive material of the conductive features 90 is formed on the liner and/or the barrier. A silicide layer (not shown) may be formed between each epitaxial source/drain region 42 and the conductive feature 90. Next, as shown in FIGS. 43A and 43B, a planarization process, such as a CMP process, is performed to remove the dielectric layer 82 and portions of the conductive features 90 and the gapfill 86 formed in the dielectric layer 82. As a result, the top surfaces of the conductive features 90 are substantially coplanar with the top surface of the gapfill 86 and the top surface of the dielectric layer 48.

Figure 44A:
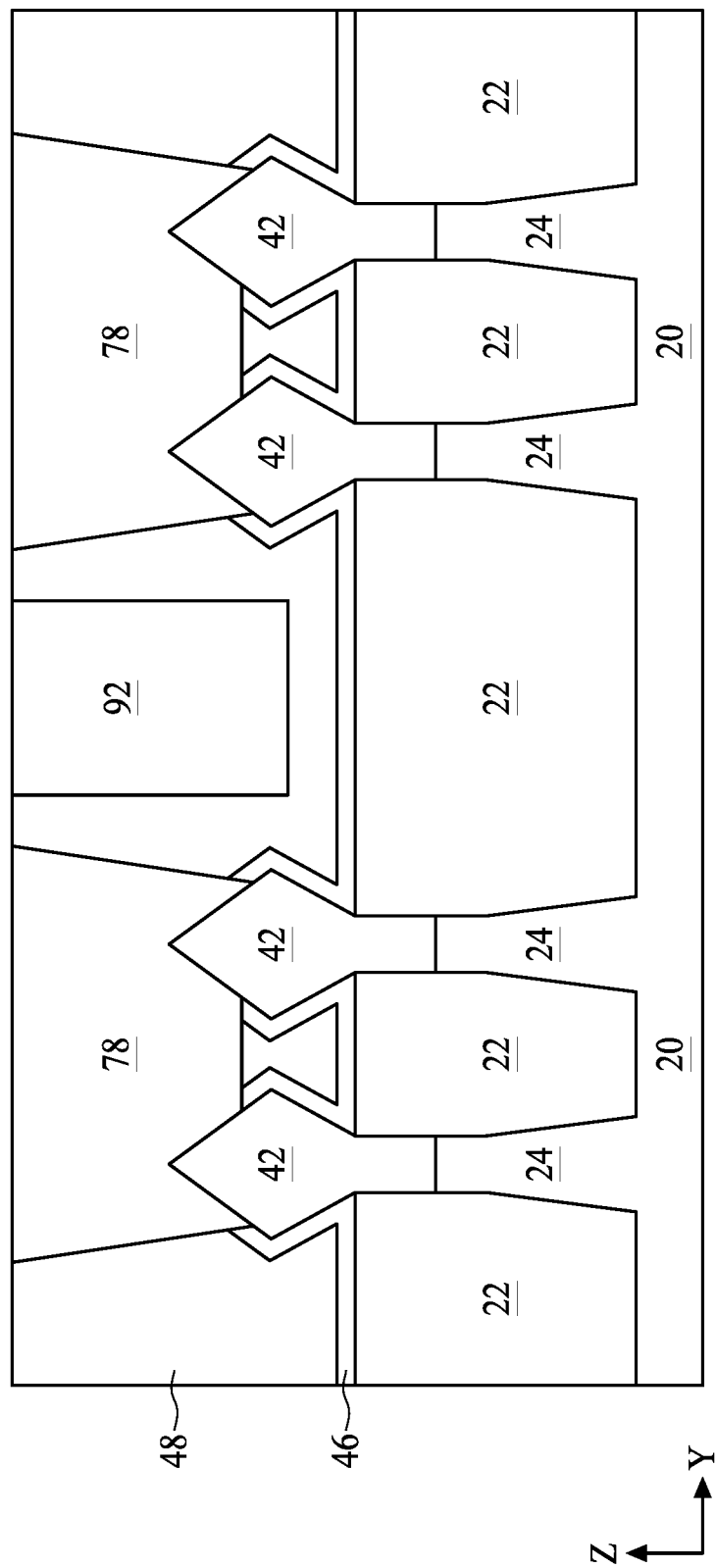
Figure 44B:
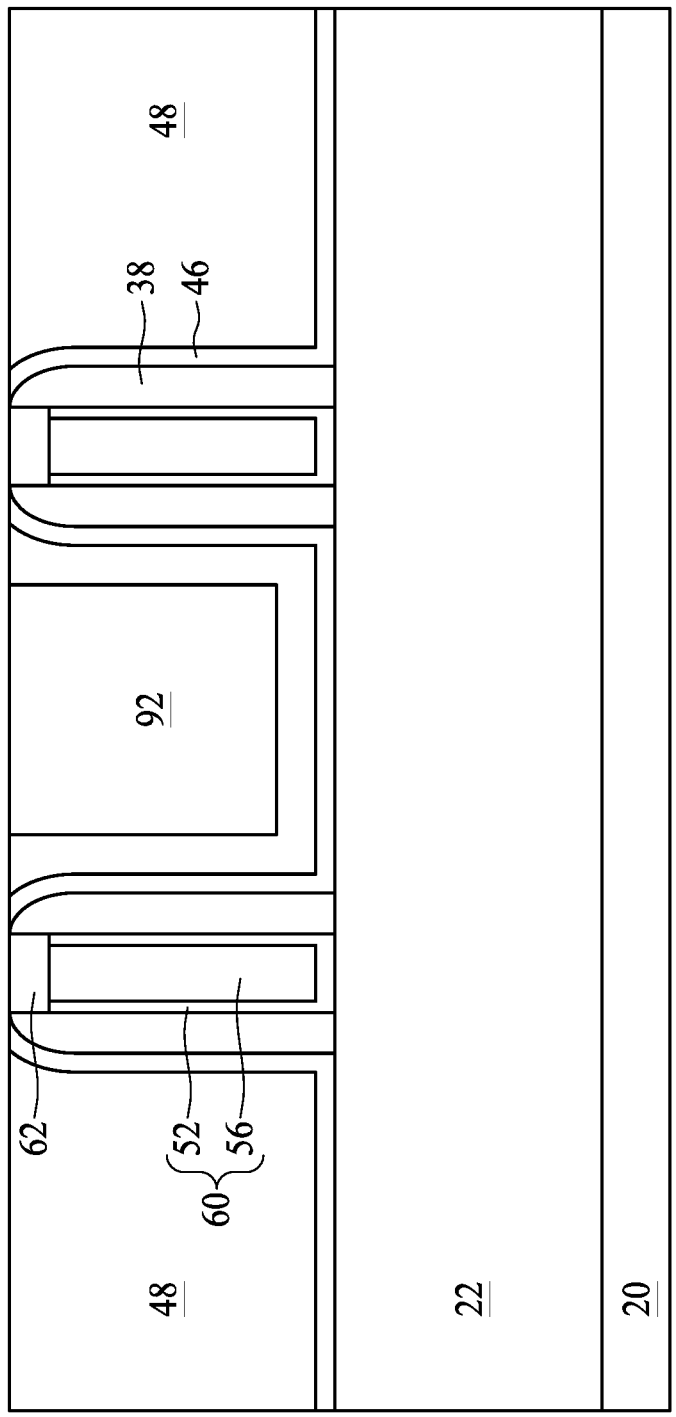

In some embodiments, the gapfill 86 includes a dielectric material, such as SiN, SiCN, SiCO, or other suitable dielectric material. Subsequent processes may be performed, such as forming a dielectric layer on the dielectric layer 48, the conductive features 90, and the gapfill 86, and forming conductive features in the dielectric layer to electrically connect to the conductive features 90 and the gate stacks 60. In some embodiments, the gapfill 86 includes Si or W, and the gapfill 86 is removed and replaced with a dielectric fill 92, as shown in FIGS. 44A and 44B. The dielectric fill 92 may include the same material as the dielectric fill 80 and may be formed by the same process as the dielectric fill 80. In some embodiments, the hard mask 62 is also replaced with the dielectric fill 80, which is similar to the process described in FIG. 37.

The processes described in FIGS. 22 to 44B illustrate various embodiments to form conductive contacts for the epitaxial source/drain regions 42. In some embodiments, a process for forming a seamless and void free gapfill is utilized. The process to form the gapfill may be utilized in other stages of manufacturing the semiconductor device structure 10. For example, the process may be utilized in cut metal gate process, cut dummy gate process, cut fin process, cut metal process, or other process that including filling an opening. The various processes describe above includes forming an opening in a feature, such as a metal gate, a dummy gate, a fin, or a metal, and then fill the opening with a gapfill, such as a dielectric material. In some embodiments, the gapfill is first formed in first openings formed in a dielectric material, followed by removing the portions of the dielectric material to form second openings by a selective etch process that does not substantially affect the gapfill, and then forming the features in the openings.

Embodiment processes advantageously form a seamless and void free gapfill between two conductive features (e.g., contacts for the source/drain regions), resulting from a reverse cut contact process. Yield is improved and the complexity of the processes is reduced.

An embodiment is method. The method includes forming fins from a substrate, forming a gate stack over portions of the fins, forming an epitaxial source/drain region adjacent the gate stack, depositing a dielectric layer over the epitaxial source/drain region, forming an opening in the dielectric layer, and forming a gapfill in the opening in a bottom-up fashion. The gapfill includes Si or W. The method further includes forming a conductive feature over the epitaxial source/drain region and replacing the gapfill with a dielectric material.

Another embodiment is a method. The method includes forming fins from a substrate, forming a first gate stack over portions of the fins, forming an epitaxial source/drain region adjacent the first gate stack, depositing a dielectric layer over the epitaxial source/drain region, forming a first opening in the dielectric layer, and forming a gapfill in the first opening. The forming the gapfill includes depositing a material in the opening, etching a portion of the material, and repeating the depositing and the etching to fill the opening. The method further includes selectively removing a portion of the dielectric layer to form a second opening and forming a conductive feature in the second opening.

A further embodiment is a method. The method includes forming fins from a substrate, forming a gate stack over portions of the fins, forming an epitaxial source/drain region adjacent the gate stack, depositing a first dielectric layer over the epitaxial source/drain region, depositing a second dielectric layer on the first dielectric layer, forming an opening in the second dielectric layer, forming a gapfill in the opening, selectively removing portions of the first and second dielectric layers to expose the epitaxial source/drain region, forming a conductive feature over the epitaxial source/drain region, and removing the second dielectric layer and at least a portion of the gapfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming fins from a substrate;
   forming a gate stack over portions of the fins;
   forming an epitaxial source/drain region adjacent the gate stack;
   depositing a dielectric layer over the epitaxial source/drain region;
   forming an opening in the dielectric layer;
   forming a gapfill in the opening in a bottom-up fashion, wherein the gapfill comprises Si or W;
   forming a conductive feature over the epitaxial source/drain region; and
   replacing the gapfill with a dielectric material.

2. The method of claim 1, wherein the gapfill comprises Si, and the forming the gapfill comprises using silane as a precursor at a processing temperature ranging from about 620 degrees Celsius to about 900 degrees Celsius.

3. The method of claim 1, wherein the gapfill comprises W, and the forming the gapfill comprises using tungsten hexafluoride and hydrogen gas as precursors at a processing temperature ranging from about 250 degrees Celsius to about 650 degrees Celsius.

4. The method of claim 1, wherein the gapfill is formed by a low-pressure process having a processing pressure ranging from about 1 mTorr to about 100 mTorr.

5. The method of claim 4, wherein the gapfill is formed by an ion-assisted process.

6. The method of claim 1, wherein the dielectric material and the dielectric layer comprise a same material.

7. The method of claim 6, further comprising forming a contact etch stop layer over the epitaxial source/drain region, wherein the dielectric layer is formed on the contact etch stop layer.

8. The method of claim 7, wherein the opening is also formed in the contact etch stop layer.

9. A method, comprising:
   forming fins from a substrate;
   forming a first gate stack over portions of the fins;
   forming an epitaxial source/drain region adjacent the first gate stack;
   depositing a dielectric layer over the epitaxial source/drain region;
   forming a first opening in the dielectric layer;
   forming a gapfill in the first opening, comprising:
      depositing a material in the opening;
      etching a portion of the material; and
      repeating the depositing and the etching to fill the opening;
   selectively removing a portion of the dielectric layer to form a second opening; and
   forming a conductive feature in the second opening, wherein the conductive feature is a conductive contact for the epitaxial source/drain region.

10. The method of claim 9, wherein the gapfill comprises Si, W, SiN, SiCN, SiCO.

11. The method of claim 9, further comprising replacing the first gate stack with a second gate stack.

12. The method of claim 11, further comprising recessing the second gate stack and forming a hard mask on the recessed second gate stack.

13. The method of claim 12, wherein the hard mask and the gapfill comprise Si or W.

14. The method of claim 13, further comprising selectively removing the hard mask and the gapfill.

15. A method, comprising:
   forming fins from a substrate;
   forming a gate stack over portions of the fins;
   forming an epitaxial source/drain region adjacent the gate stack;
   depositing a first dielectric layer over the epitaxial source/drain region;
   depositing a second dielectric layer on the first dielectric layer;
   forming an opening in the first and second dielectric layer;
   forming a gapfill in the opening;
   selectively removing portions of the first and second dielectric layers to expose the epitaxial source/drain region;
   forming a conductive feature over the epitaxial source/drain region; and
   removing the second dielectric layer and at least a portion of the gapfill.

16. The method of claim 15, wherein a planarization process is performed to remove the second dielectric layer and at least a portion of the gapfill.

17. The method of claim 16, wherein top surfaces of the first dielectric layer, the gapfill, and the conductive feature are substantially coplanar.

18. The method of claim 15, further comprising replacing the gapfill with a dielectric material.

19. The method of claim 15, wherein the conductive feature is disposed adjacent the gapfill.

20. The method of claim 18, wherein the dielectric material and the first dielectric layer comprise a same material.

* * * * *